United States Patent
Kim et al.

(10) Patent No.: US 10,950,806 B2
(45) Date of Patent: Mar. 16, 2021

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hyun Kim, Gyeonggi-do (KR); Hong-Yeop Na, Gyeonggi-do (KR); Yeon-Gun Lee, Gyeonggi-do (KR); Jeong-Hwan Jeon, Gyeonggi-do (KR); Seung-Ae Kim, Gyeonggi-do (KR)

(73) Assignee: Rohm and Haas Electronic Materials Korea Ltd., Seoul (KR)

(*) Notice: Subject to any disclaimer, the term of this patent is extended or adjusted under 35 U.S.C. 154(b) by 0 days.

(21) Appl. No.: 16/652,713

(22) PCT Filed: Nov. 7, 2018

(86) PCT No.: PCT/KR2018/013425
§ 371 (c)(1),
(2) Date: Apr. 1, 2020

(87) PCT Pub. No.: WO2019/093746
PCT Pub. Date: May 16, 2019

(65) Prior Publication Data
US 2020/0266365 A1    Aug. 20, 2020

(30) Foreign Application Priority Data
Nov. 8, 2017   (KR) .................. 10-2017-0148228

(51) Int. Cl.
*C07F 15/00*  (2006.01)
*H01L 51/50*  (2006.01)
*H01L 51/00*  (2006.01)
*C09K 11/06*  (2006.01)
*H01L 51/56*  (2006.01)

(52) U.S. Cl.
CPC ...... *H01L 51/0085* (2013.01); *C07F 15/0033* (2013.01); *C09K 11/06* (2013.01); *C09K 2211/1466* (2013.01); *C09K 2211/185* (2013.01); *H01L 51/001* (2013.01); *H01L 51/5016* (2013.01); *H01L 51/56* (2013.01); *H01L 2251/558* (2013.01)

(58) Field of Classification Search
CPC ..................... C07F 15/0033; H01L 51/5012
USPC ..................... 546/10; 313/504, 498
See application file for complete search history.

(56) References Cited

U.S. PATENT DOCUMENTS

| | | |
|---|---|---|
| 7,723,520 B2 | 5/2010 | Kim et al. |
| 9,359,549 B2 | 6/2016 | Rayabarapu et al. |
| 9,978,960 B2 | 5/2018 | Inoue et al. |
| 2015/0137051 A1 | 5/2015 | Jung et al. |

OTHER PUBLICATIONS

Marquise, N. et al., 'Deproto-metallation using mixed lithium-zinc and lithium-copper bases and computed CH acidity of 2-substituted quinolines', RCS Adv., 2014, vol. 4, pp. 19602-19612.
Strashnova, S. B. et al., 'Synthesis and Physicochemical Properties of thed Metal Complexes with 2-Phenyl-4-(piperidyl-1)-pyrido[2,3-a]anthraquinone', Russian Journal of Coordination Chemistry, 2007, vol. 33, No. 11, pp. 850-856.

*Primary Examiner* — Charanjit Aulakh
(74) *Attorney, Agent, or Firm* — S. Matthew Cairns

(57) ABSTRACT

The present disclosure relates to an organic electroluminescent compound for near-IR light emission, an organic electroluminescent material and an organic electroluminescent device comprising the same. By comprising the organic electroluminescent compound of the present disclosure, it is possible to provide an organic electroluminescent device with near-IR light emission.

10 Claims, 1 Drawing Sheet

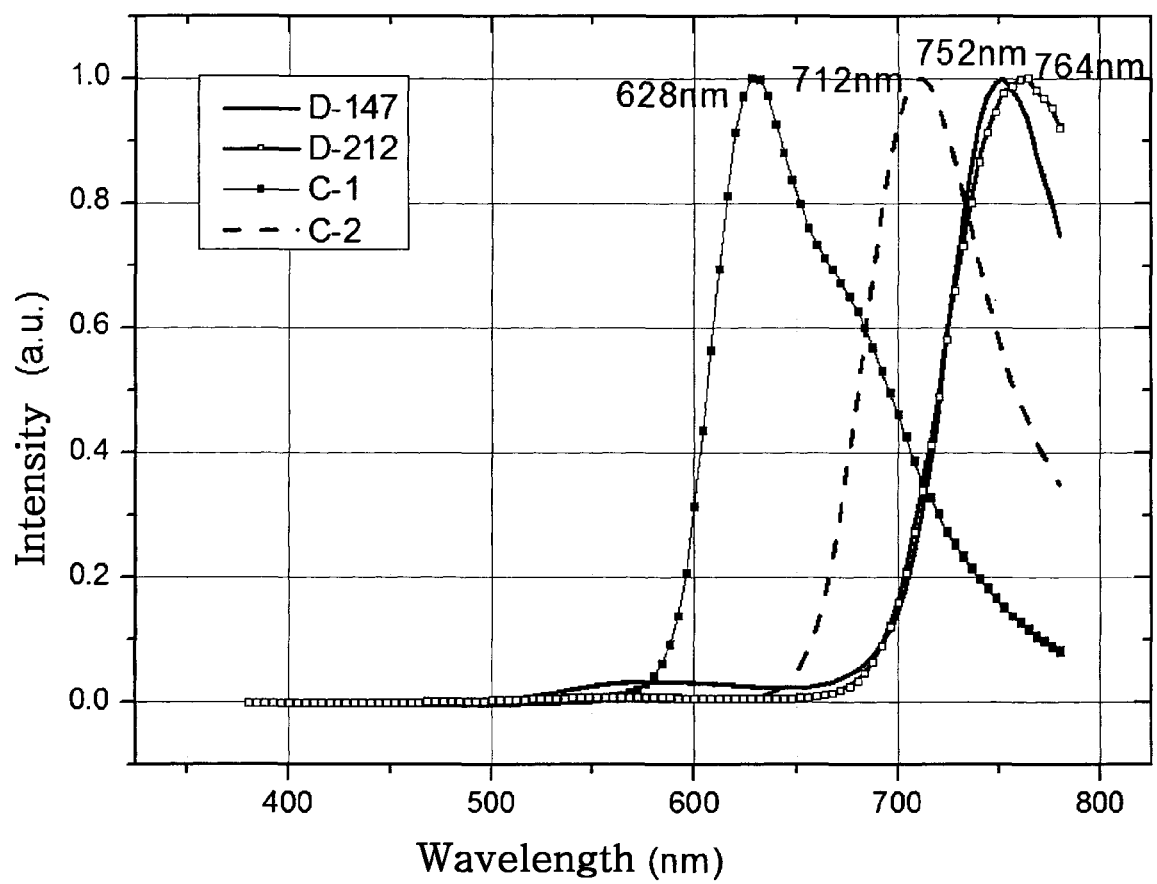

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound for near-IR light emission, an organic electroluminescent material and an organic electroluminescent device comprising the same.

BACKGROUND ART

In 1987, Tang et al. of Eastman Kodak first developed a small molecule green organic electroluminescent device (OLED) of TPD/Alq3 bilayer consisting of a light-emitting layer and a charge transport layer. Since then, the research on an OLED has been rapidly carried out, and it has been commercialized. An OLED changes electric energy into light by applying electricity to an organic light-emitting material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer (containing host and dopant materials), an electron buffer layer, a hole blocking layer, an electron transport layer, an electron injection layer, etc. The materials used in the organic layer can be classified into a hole injection material, a hole transport material, a hole auxiliary material, a light-emitting auxiliary material, an electron blocking material, a light-emitting material, an electron buffer material, a hole blocking material, an electron transport material, an electron injection material, etc., depending on functions.

A fluorescent luminescent material uses only 25% of singlet excitons, while a phosphorescent luminescent material uses up to 75% of triplet excitons through spin-orbit coupling (SOC) by using metal complexes such as iridium, which can maximize the near-IR light emission efficiency. That is, when a phosphorescent luminescent material is used for the near-IR organic electroluminescent device, singlet excitons and triplet excitons can be formed at a ratio of 25%:75% by the spin rule based on quantum mechanics in theory. Thus, it is believed that it is possible to maximize the luminous efficiency since the internal quantum efficiency of 100% can be obtained.

The most important factor determining luminous efficiency in an OLED is light-emitting materials. The light-emitting materials are required to have the high quantum efficiency, high movement degree of an electron and a hole, and uniformality and stability of the formed light-emitting material layer. The light-emitting material is classified into blue, green, and red light-emitting materials according to the light-emitting color, and further includes yellow or orange light-emitting materials. Furthermore, the light-emitting material may be classified into a host material and a dopant material in a functional aspect. Generally, a device having excellent EL characteristics has a structure comprising a light-emitting layer made by doping a dopant to a host.

Iridium(III) complexes have been widely known as a dopant of phosphorescent light-emitting materials, including bis(2-(2'-benzothienyl)-pyridinato-N,C-3')iridium(acetylacetonate) [(acac)Ir(btp)$_2$], tris(2-phenylpyridine)iridium [Ir(ppy)$_3$] and bis(4,6-difluorophenylpyridinato-N,C2)picolinato iridium (Firpic) as red, green, and blue light-emitting materials, respectively.

Also, 4,4'-N,N'-dicarbazol-biphenyl (CBP) has been the most widely known phosphorescent host material. Recently, Pioneer (Japan) et al., developed a high performance organic electroluminescent device using bathocuproine (BCP) and aluminum(III) bis(2-methyl-8-quinolinate)(4-phenylphenolate) (BAlq), etc., which were known as hole blocking materials, as host materials.

Meanwhile, Korean Patent Application Laid-Open No. 2016-0019926 discloses an organic electroluminescent device using an iridium complex containing a dimethylphenyl group and a quinoxaline backbone as a dopant. However, the development for a material suitable for near-IR light emission is still required.

DISCLOSURE OF INVENTION

Technical Problem

The objective of the present disclosure is firstly, to provide an organic electroluminescent compound capable of producing a near-IR light-emitting organic electroluminescent device, secondly, to provide an organic electroluminescent material for near-IR light emission comprising the organic electroluminescent compound, and thirdly, to provide a near-IR light-emitting organic electroluminescent device comprising the organic electroluminescent compound.

Solution to Problem

In connection with the development of near-IR materials, since conventional quinoline-based iridium complexes are compounds of red emission (580 to 630 nm), a suitable dopant capable of achieving long wavelengths of 700 nm to 1 mm is required for near-IR light emission. Thus, the present inventors have found that a compound having a quinoline or dibenzoquinolinone backbone fused with acetophenone can realize a longer wavelength as compared with a conventional quinoline compound. Specifically, the above objective can be achieved by a compound comprising a ligand having the structure represented by the following formula 1, wherein the ligand is coordinated to a metal having an atomic number greater than 40.

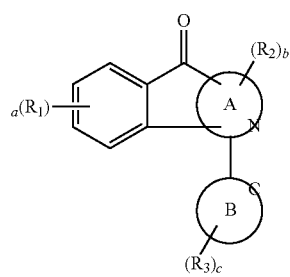

(1)

In formula 1,
ring A represents an N-containing 10-membered heteroaryl ring which may be substituted with $R_2$;
ring B represents a (C3-C20)aryl ring which may be substituted with $R_3$;

R₁ to R₃, each independently, represent deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl, or each of R₁ to R₃ may be linked to each other to form a ring; and a to c, each independently, represent an integer of 0 to 4, where if a to c, each independently, are an integer of 2 or more, each of R₁ to R₃ may be the same or different.

Advantageous Effects of Invention

By comprising the compound according to the present disclosure, an organic electroluminescent device with near-IR light emission may be provided.

BRIEF DESCRIPTION OF DRAWINGS

FIG. 1 illustrates the emission intensity for wavelength of an organic electroluminescent device comprising a compound according to one embodiment of the present disclosure and an organic electroluminescent device comprising a compound not according to the present disclosure.

MODE FOR THE INVENTION

Hereinafter, the present disclosure will be described in detail. However, the following description is intended to explain the invention, and is not meant in any way to restrict the scope of the invention.

The term "organic electroluminescent compound" in the present disclosure means a compound that may be used in an organic electroluminescent device, and may be comprised in any layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material, an electron buffer material, a hole blocking material, an electron transport material, an electron injection material, etc.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, iso-propyl, n-butyl, iso-butyl, tert-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C3-C30)aryl" is meant to be a monocyclic or fused ring radical derived from an aromatic hydrocarbon having 3 to 30 ring backbone carbon atoms, in which the number of the ring backbone carbon atoms is preferably 6 to 25, more preferably 6 to 18. The above aryl may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. The term "(3- to 30-membered)heteroaryl" is an aryl having 3 to 30 ring backbone atoms, and including at least one, preferably 1 to 4 heteroatoms selected from the group consisting of B, N, O, S, Si, and P. The above heteroaryl may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, and dihydroacridinyl. Furthermore, "halogen" includes F, Cl, Br, and I.

Herein, "substituted" in the expression "substituted or unsubstituted" means that a hydrogen atom in a certain functional group is replaced with another atom or another functional group, i.e. a substituent. The substituents of the substituted alkyl, the substituted cycloalkyl, the substituted aryl, the substituted heteroaryl, the substituted alkoxy, the substituted alkenyl, the substituted alkynyl, or the substituted arylalkyl in R₁ to R₁₁ of formulas 1 to 10 and 2-a to 2-c, each independently, are at least one selected from the group consisting of deuterium, a halogen, a cyano, a carboxyl, a nitro, a hydroxyl, a (C1-C30)alkyl, a halo(C1-C30)alkyl, a (C2-C30)alkenyl, a (C2-C30)alkynyl, a (C1-C30)alkoxy, a (C1-C30)alkylthio, a (C3-C30)cycloalkyl, a (C3-C30)cycloalkenyl, a (3- to 7-membered)heterocycloalkyl, a (C6-

C30)aryloxy, a (C6-C30)arylthio, a (5- to 30-membered) heteroaryl, a (C6-C30)aryl, a tri(C1-C30)alkylsilyl, a tri(C6-C30)arylsilyl, a di(C1-C30)alkyl(C6-C30)arylsilyl, a (C1-C30)alkyldi(C6-C30)arylsilyl, an amino, a mono- or di-(C1-C30)alkylamino, a mono- or di-(C6-C30)arylamino, a (C1-C30)alkyl(C6-C30)arylamino, a (C1-C30)alkylcarbonyl, a (C1-C30)alkoxycarbonyl, a (C6-C30)arylcarbonyl, a di(C6-C30)arylboronyl, a di(C1-C30)alkylboronyl, a (C1-C30)alkyl(C6-C30)arylboronyl, a (C6-C30)aryl(C1-C30)alkyl, and a (C1-C30)alkyl(C6-C30)aryl. According to one embodiment of the present disclosure, the substituents, each independently, are at least one of deuterium and a (C1-C20)alkyl. According to another embodiment of the present disclosure, the substituents, each independently, are at least one of deuterium and a (C1-C10)alkyl. For example, the substituents, each independently, are at least one of deuterium and a methyl.

According to one embodiment of the present disclosure, the ligand having the structure represented by formula 1 is coordinated to a metal having an atomic number greater than 40. According to one embodiment of the present disclosure, the metal is any one selected from iridium, rhenium, osmium, and platinum. According to another embodiment of the present disclosure, the metal is iridium.

In formula 1, ring A represents an N-containing 10-membered heteroaryl ring which may be substituted with $R_2$. According to one embodiment of the present disclosure, ring A represents a polycyclic heteroaryl ring containing one or more N which may be substituted with $R_2$. For example, ring A may be a quinoline ring or an isoquinoline ring.

In formula 1, ring B represents a (C3-C20)aryl ring which may be substituted with $R_3$. According to one embodiment of the present disclosure, ring B represents a (C6-C18)aryl ring which may be substituted with $R_3$. According to another embodiment of the present disclosure, ring B represents a (C6-C12)aryl ring which may be substituted with $R_3$. For example, ring B may be a benzene ring.

In formula 1, $R_1$ to $R_3$, each independently, represent deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl, or each of $R_1$ to $R_3$ may be linked to each other to form a ring. According to one embodiment of the present disclosure, $R_1$ to $R_3$, each independently, represent deuterium, or a substituted or unsubstituted (C1-C20)alkyl. According to another embodiment of the present disclosure, $R_1$ to $R_3$, each independently, represent deuterium, or a (C1-C10)alkyl unsubstituted or substituted with deuterium. For example, $R_1$ to $R_3$, each independently, may represent deuterium, or a methyl unsubstituted or substituted with deuterium.

In formula 1, a represents an integer of 0 to 4, b represents an integer of 0 to 5, and c represents an integer of 0 to 19. According to one embodiment of the present disclosure, a to c, each independently, represent an integer of 0 to 4, where if a to c, each independently, are an integer of 2 or more, each of $R_1$ to $R_3$ may be the same or different. For example, a represents 0 or 1; b represents 0; and c represents 0, 2 or 4.

The compound comprising the ligand having the structure of formula 1 may be represented by the following formula 2.

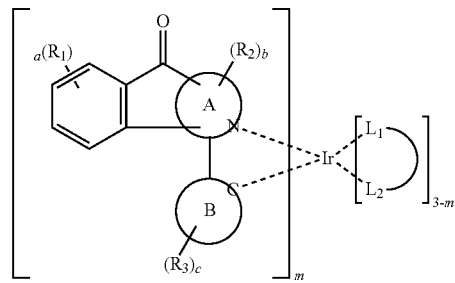

(2)

In formula 2, m represents 1 or 2; ring A, ring B, $R_1$ to $R_3$, and a to c are as defined in formula 1;

In formula 2,

represents any one of the following formulas 2-a to 2-c.

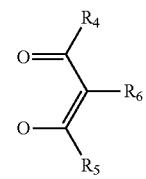

(2-a)

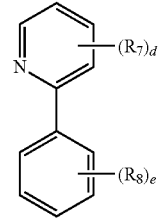

(2-b)

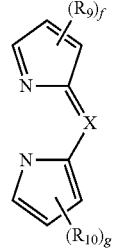

(2-c)

In formula 2-a, $R_4$ to $R_6$, each independently, represent hydrogen, deuterium, a substituted or unsubstituted (C1-C30)alkyl, a substituted or unsubstituted (C1-C30)alkoxy, an amino, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, or a substituted or unsubstituted (3- to 30-membered)heteroaryl. $R_4$ and $R_5$ may be the same. According to one embodiment of the present disclosure, $R_4$ to $R_6$, each independently, represent hydrogen, or a substituted or unsubstituted (C1-C20)alkyl. According to another embodiment of the present disclosure, $R_4$ to $R_6$, each independently, represent hydrogen, or an unsubstituted (C1-C10)alkyl. For example, $R_4$ and $R_5$, each independently, may represent methyl, isopropyl, isobutyl, sec-butyl, or sec-pentyl, and may be the same; and $R_6$ may represent hydrogen.

In formula 2-b, $R_7$ and $R_8$, each independently, represent deuterium, a substituted or unsubstituted (C1-C30)alkyl, a substituted or unsubstituted (C1-C30)alkoxy, an amino, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, or a substituted or unsubstituted (3- to 30-membered)heteroaryl. According to one embodiment of the present disclosure, $R_7$ and $R_8$, each independently, represent a substituted or unsubstituted (C1-C20)alkyl. According to another embodiment of the present disclosure, $R_7$ and $R_8$, each independently, represent an unsubstituted (C1-C10) alkyl. For example, $R_7$ and $R_8$ may represent a methyl.

In formula 2-c, $R_9$ and $R_{10}$, each independently, represent deuterium, a substituted or unsubstituted (C1-C30)alkyl, a substituted or unsubstituted (C2-C30)alkenyl, or a substituted or unsubstituted (C6-C30)aryl, or each $R_9$ and each $R_{10}$ may be linked to each other to form a ring. $R_9$ and $R_{10}$ may be the same. According to one embodiment of the present disclosure, each $R_9$ and each $R_{10}$ may be linked to each other to form a substituted or unsubstituted mono- or polycyclic (3- to 30-membered) alicyclic or aromatic ring, or the combination thereof, in which the formed ring may contain at least one heteroatom selected from nitrogen, oxygen, and sulfur. According to another embodiment of the present disclosure, each $R_9$ and each $R_{10}$ may be linked to each other to form an unsubstituted mono- or polycyclic (C3-C20) alicyclic or aromatic ring, or the combination thereof. For example, each $R_9$ and each $R_{10}$ may be linked to each other to form an unsubstituted benzene ring or an unsubstituted naphthalene ring, and $R_9$ and $R_{10}$ may be the same.

In formula 2-c, X represents N or $CR_{11}$. According to one embodiment of the present disclosure, X represents $CR_{11}$.

In formula 2-c, $R_{11}$ represents hydrogen, deuterium, a substituted or unsubstituted (C6-C30)aryl, or a substituted or unsubstituted (C1-C30)alkyl. According to one embodiment of the present disclosure, $R_{11}$ represents a substituted or unsubstituted (C6-C25)aryl. According to another embodiment of the present disclosure, $R_{11}$ represents a (C6-C18) aryl unsubstituted or substituted with at least one (C1-C10) alkyl. For example, $R_{11}$ may represent a phenyl or a trimethylphenyl.

In formulas 2-a to 2-c, d and e, each independently, represent an integer of 0 to 4, and f and g, each independently, represent an integer of 0 to 3, where if d to g, each independently, are an integer of 2 or more, each of $R_7$ to $R_{10}$ may be the same or different. According to one embodiment of the present disclosure, d to g, each independently, represent an integer of 0 to 2. According to another embodiment of the present disclosure, d and e, each independently, represent 0 or 1, and f and g, each independently, represent an integer of 0 to 2.

The formula 2 may be represented by any one of the following formulas 3 to 10, but is not limited thereto.

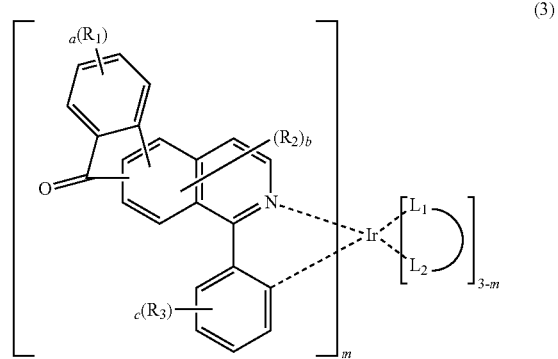

(3)

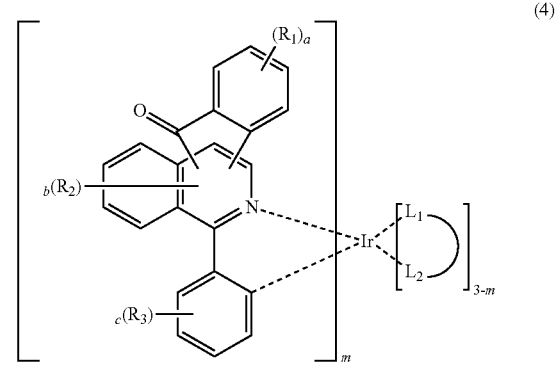

(4)

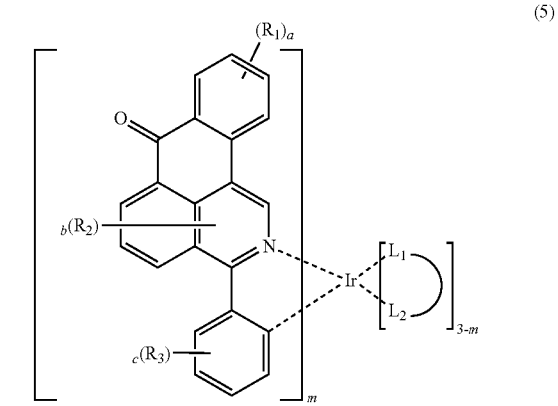

(5)

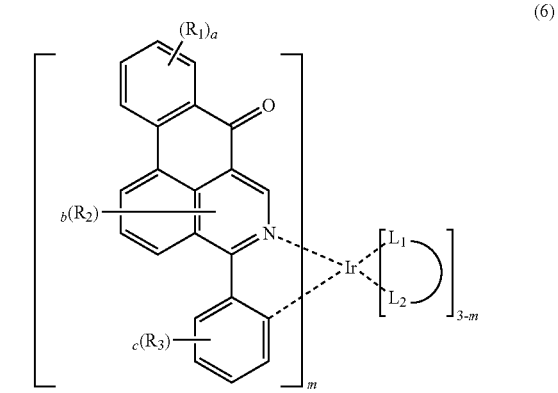

(6)

(7)

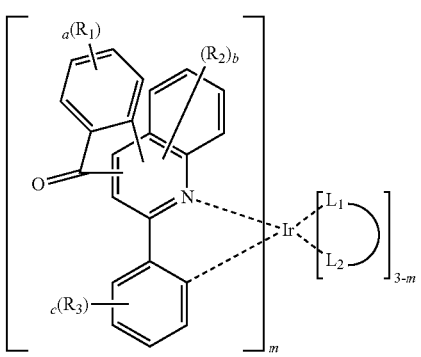

(8)

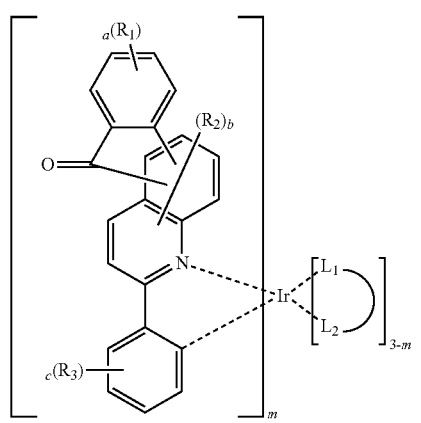

(9)

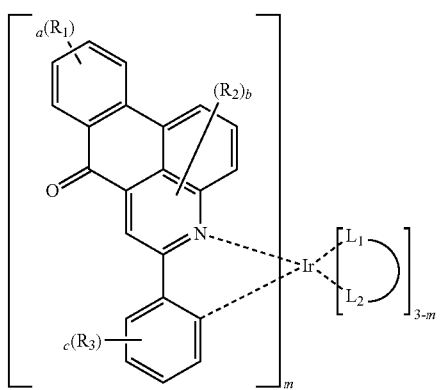

(10)

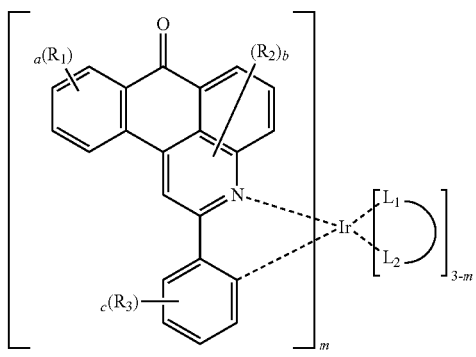

In formulas 3 to 10, $R_1$ to $R_3$, a to c, m and

each independently, are as defined in formula 1 or 2.

In the formulas of the present disclosure, if a substituent is linked to an adjacent substituent to form a ring, the ring may be a substituted or unsubstituted mono- or polycyclic (3- to 30-membered) alicyclic or aromatic ring, or the combination thereof, in which the formed ring may contain at least one heteroatom selected from nitrogen, oxygen, and sulfur.

Herein, the heteroaryl may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, and a substituted or unsubstituted (C1-C30)alkyl(C6-C30)arylamino.

The compound having the structure represented by formula 1 includes the following compounds, but is not limited thereto. Also, a hydrogen atom in the following compounds may be replaced with deuterium.

D-1

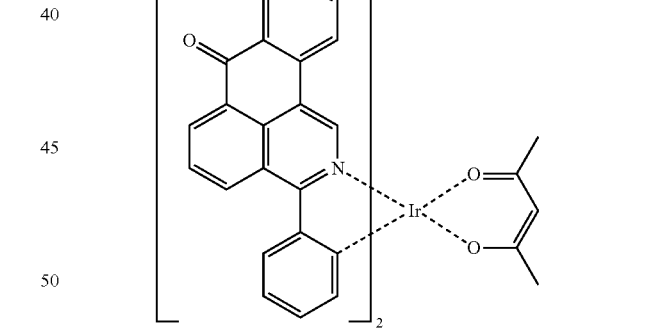

D-2

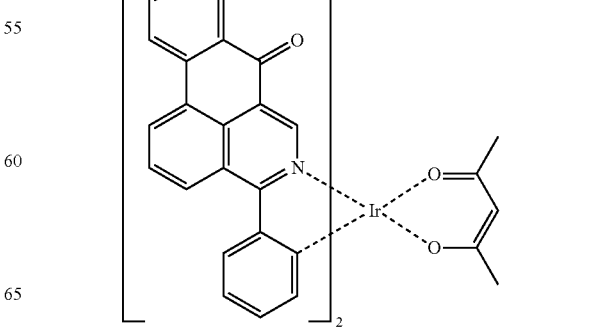

-continued
D-3
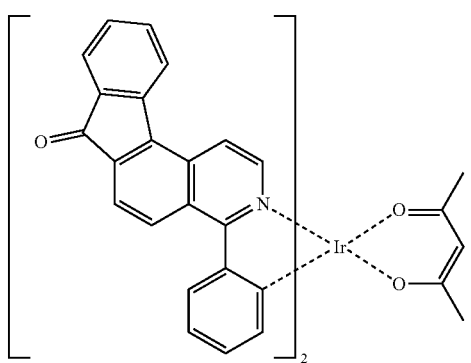
D-4
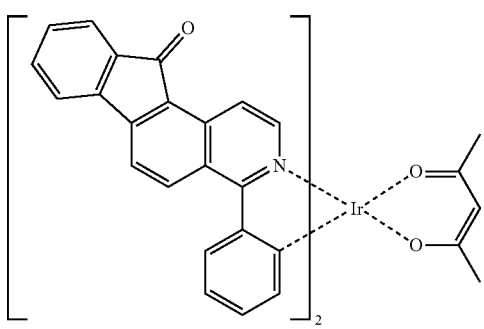
D-5
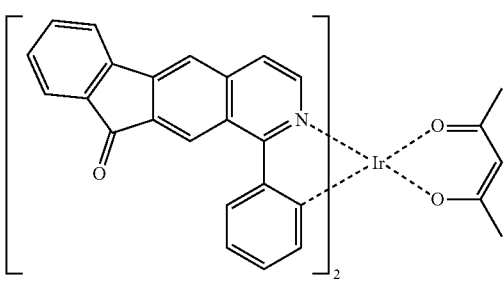
D-6
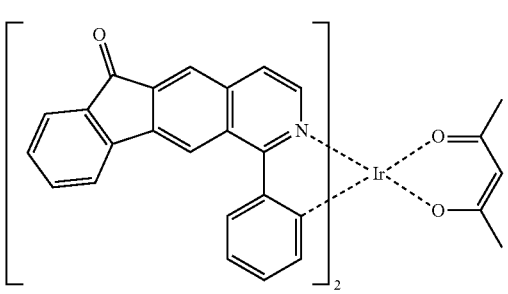
D-7
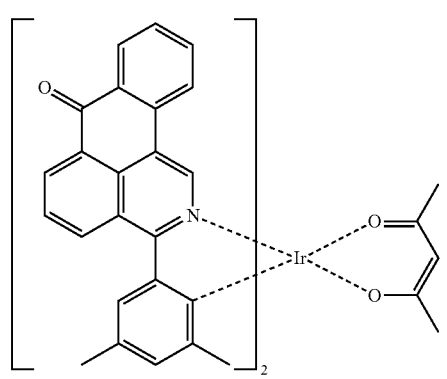
-continued
D-8
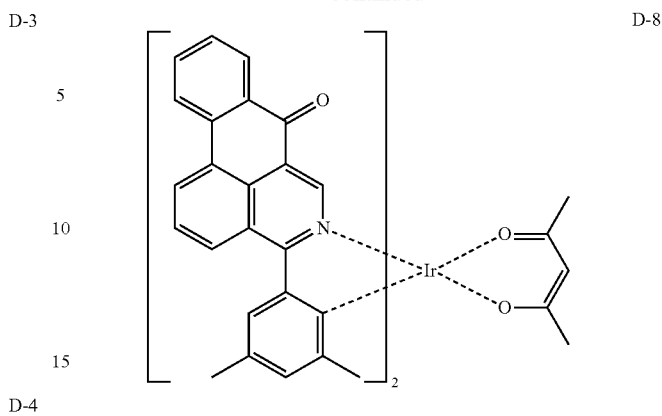
D-9
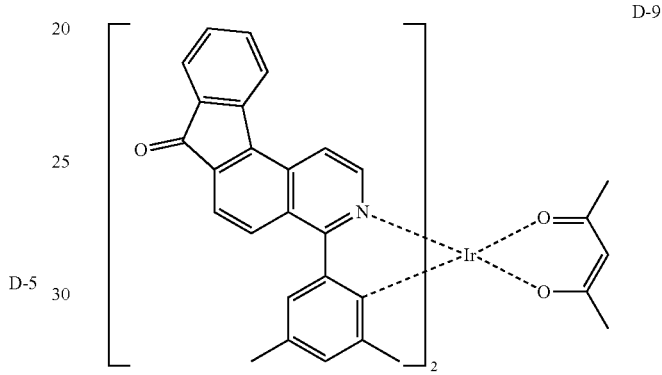
D-10
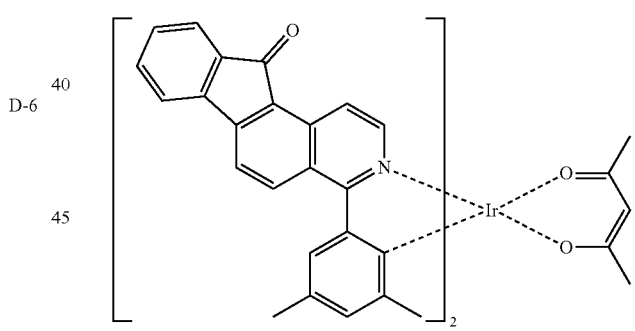
D-11
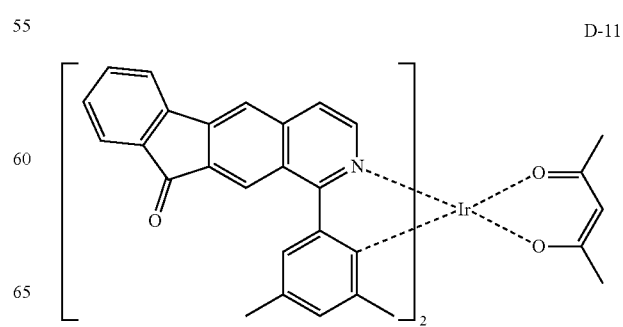

-continued
D-12
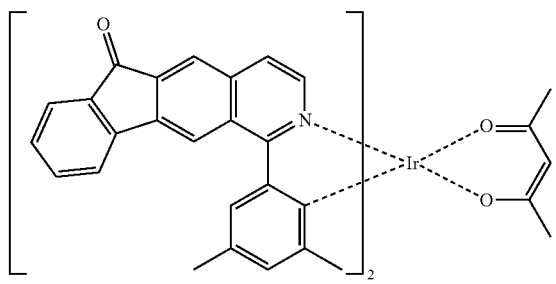
D-13
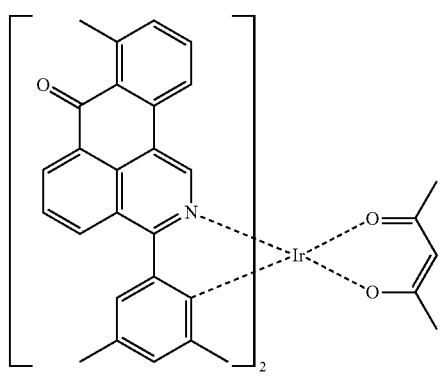
D-14
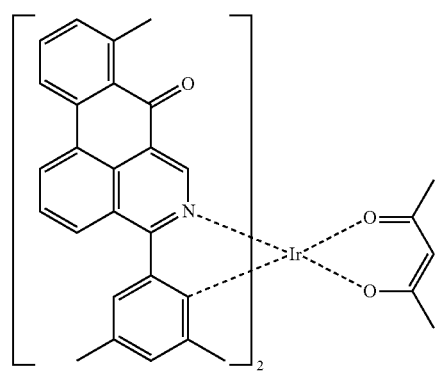
D-15
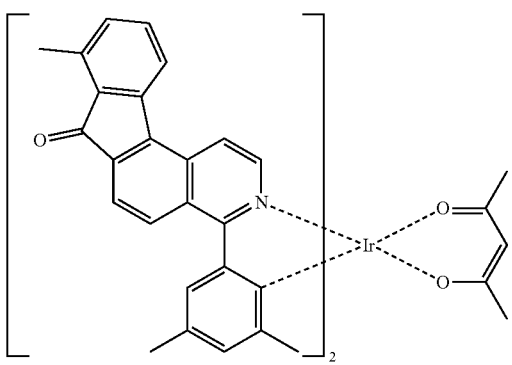
-continued
D-16
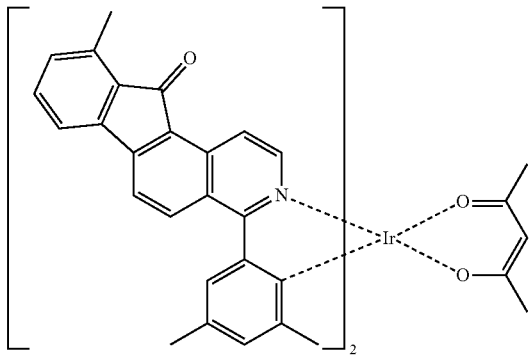
D-17
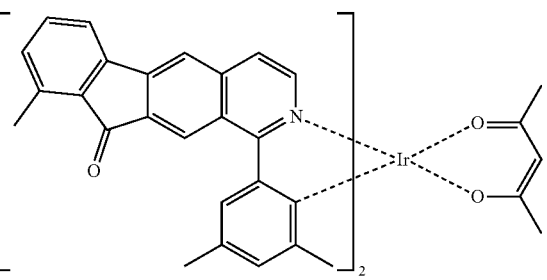
D-18
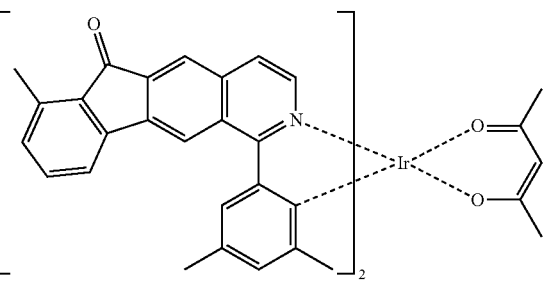
D-19
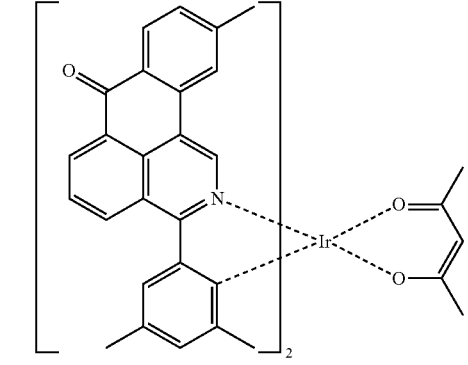

D-20
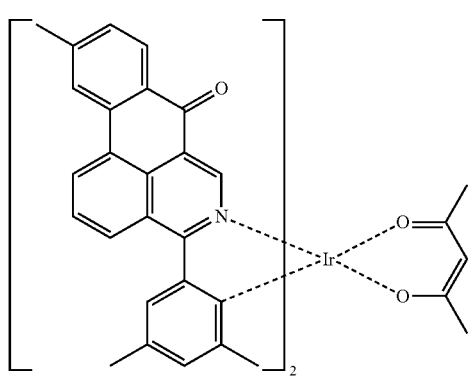
D-21
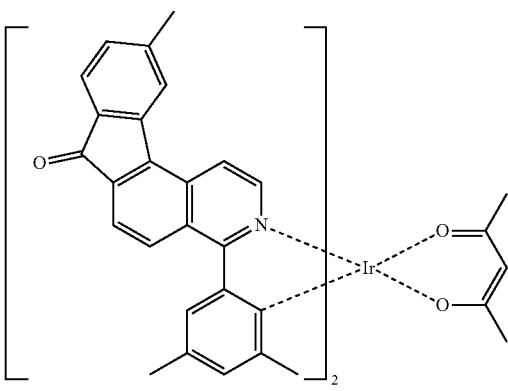
D-22
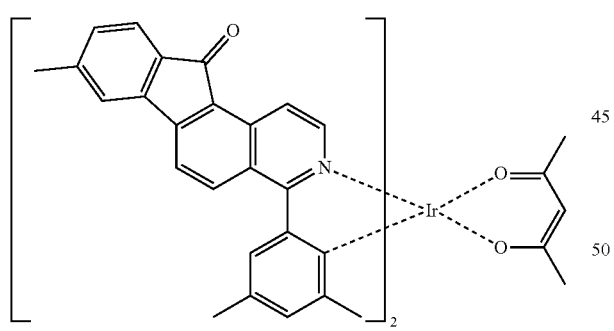
D-23
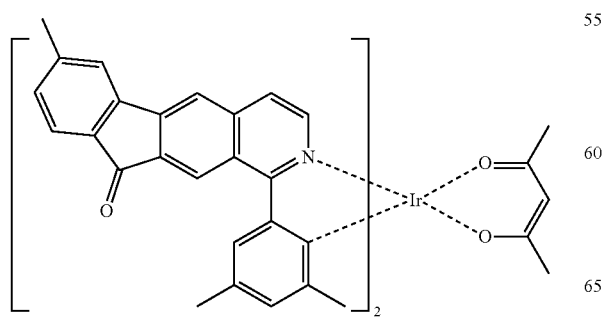
D-24
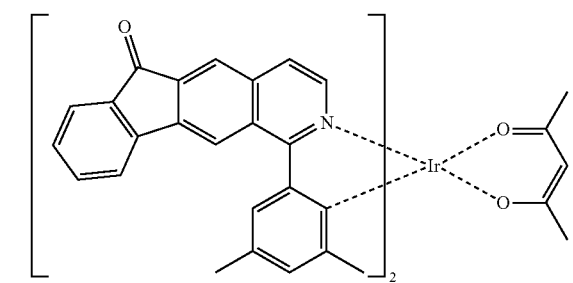
D-25
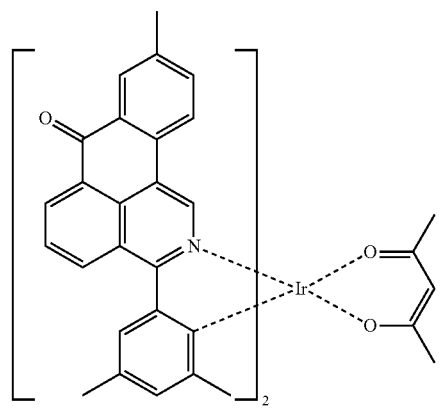
D-26
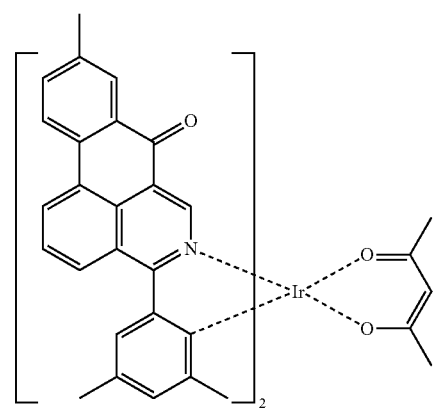
D-27
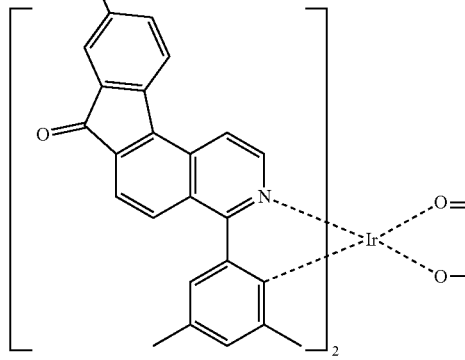

-continued
D-28
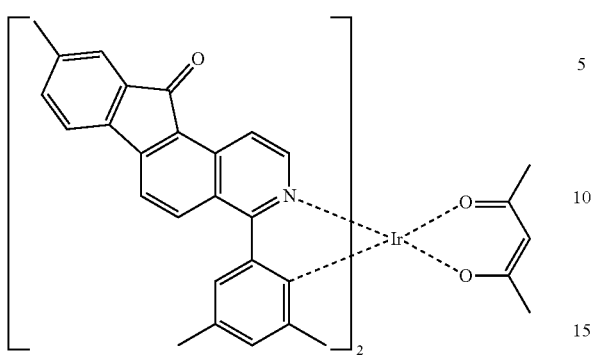
D-29
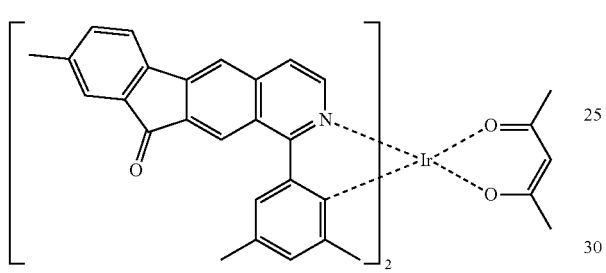
D-30
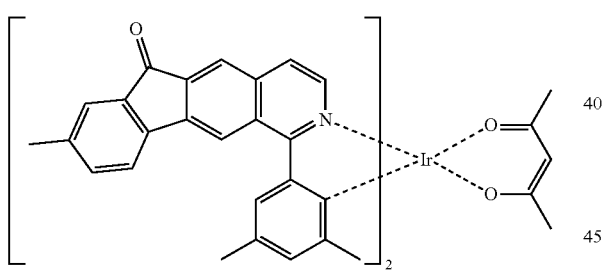
D-31
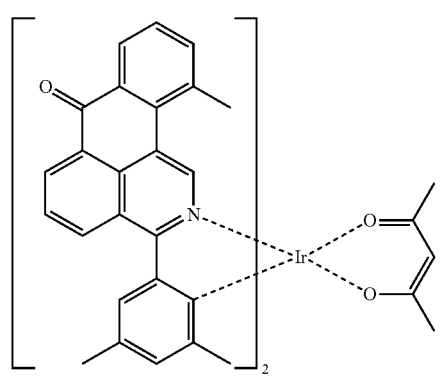
-continued
D-32
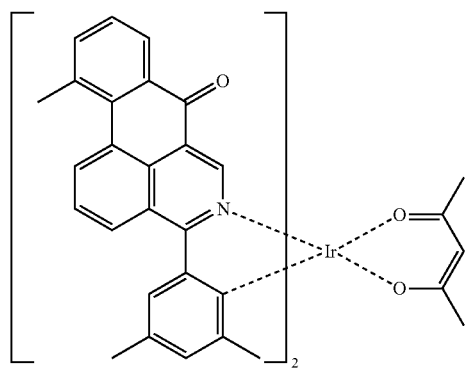
D-33
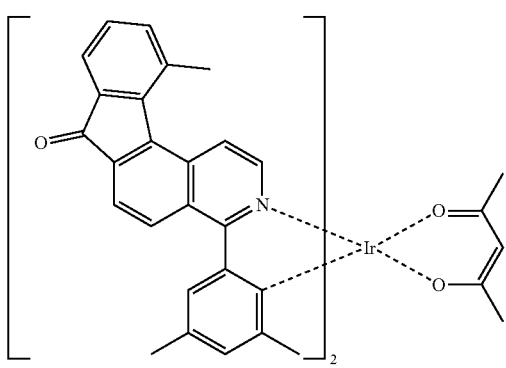
D-34
D-35
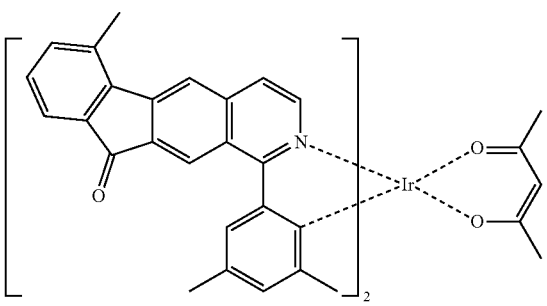

D-36
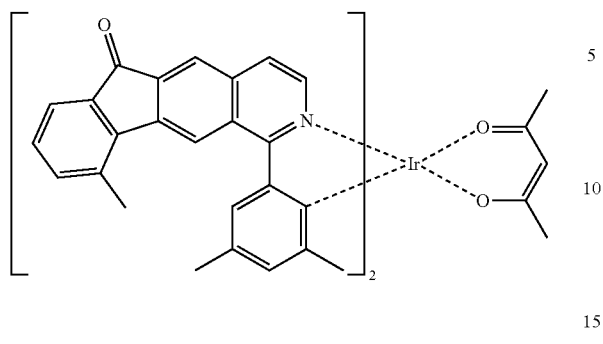
D-40
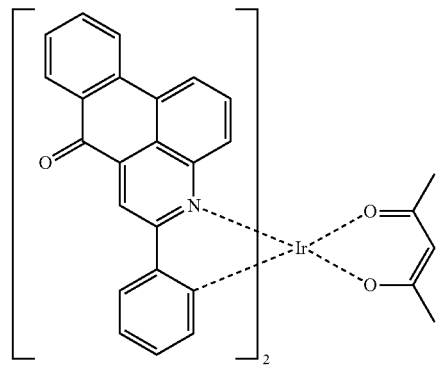
D-37
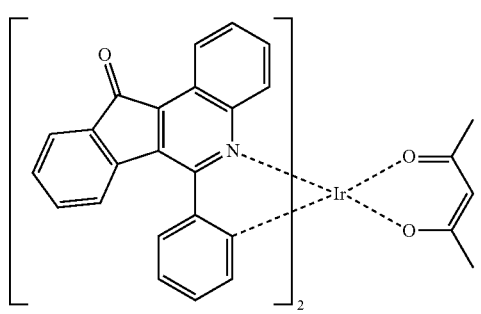
D-41
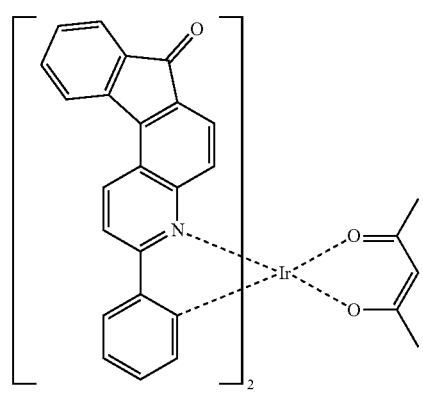
D-38
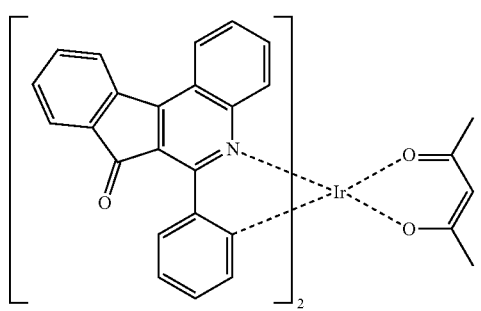
D-42
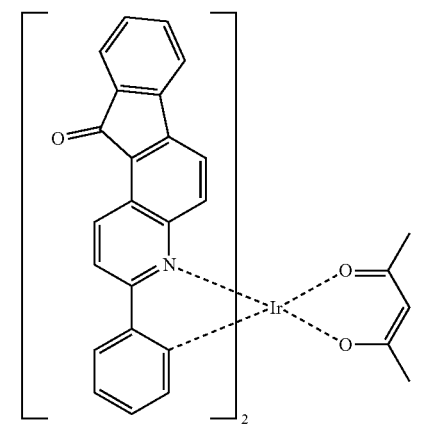
D-39
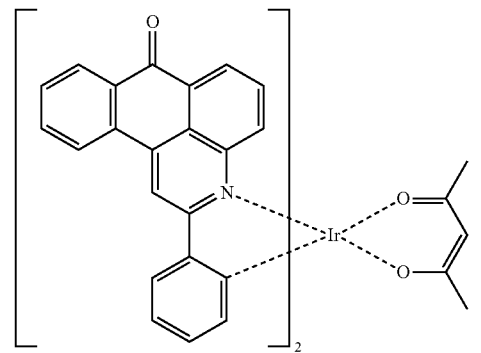
D-43
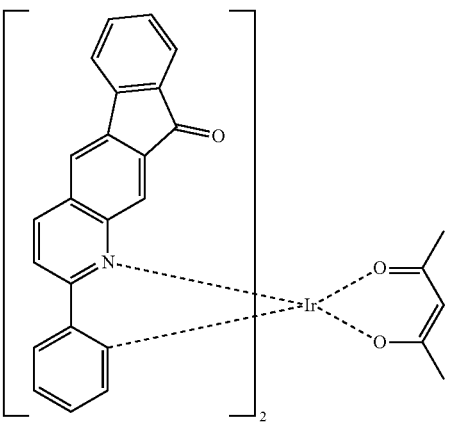

D-44
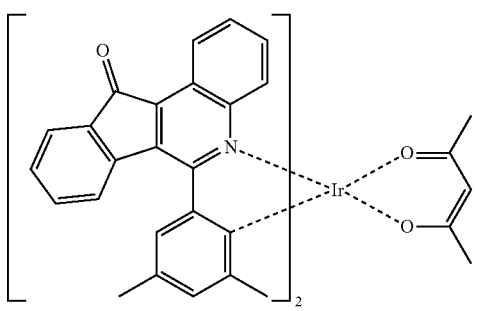
D-45
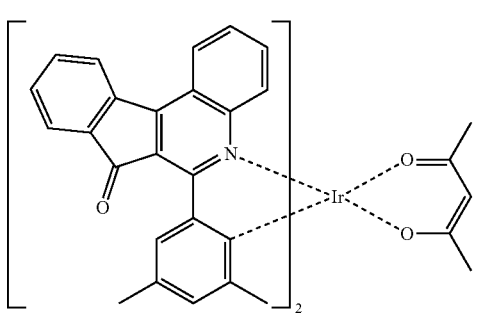
D-46
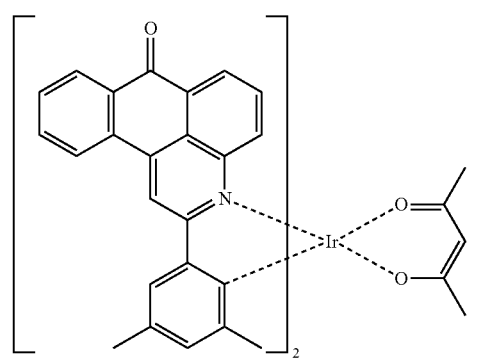
D-47
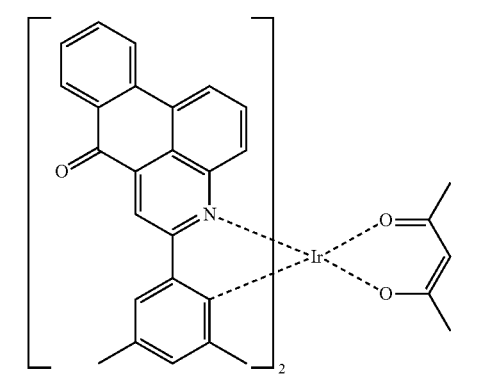
D-48
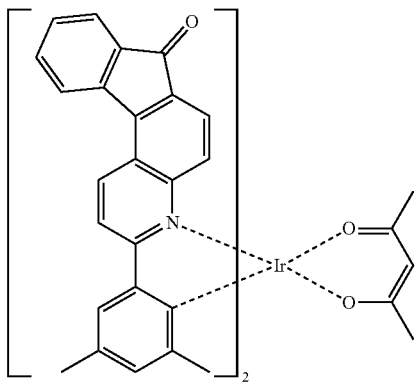
D-49
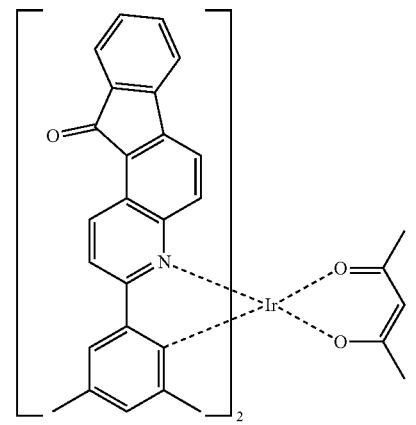
D-50
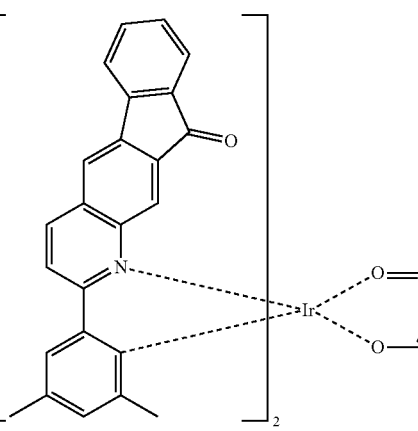
D-51
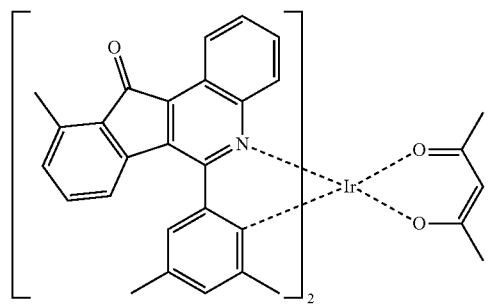

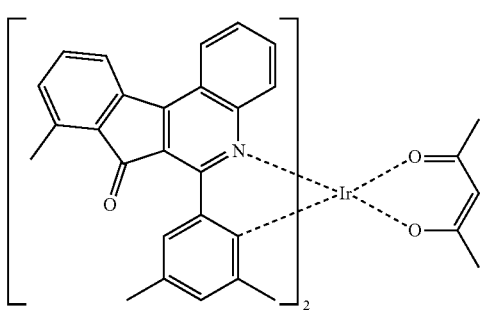
D-52
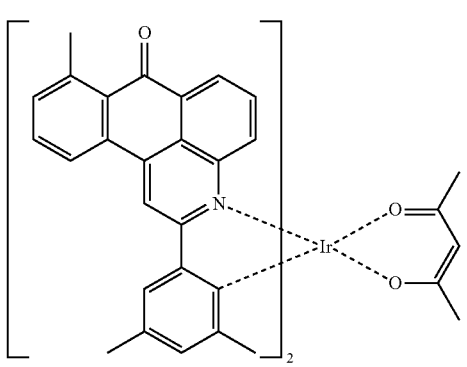
D-53
D-54
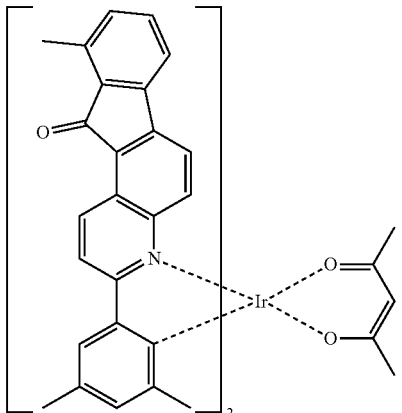
D-56
D-55
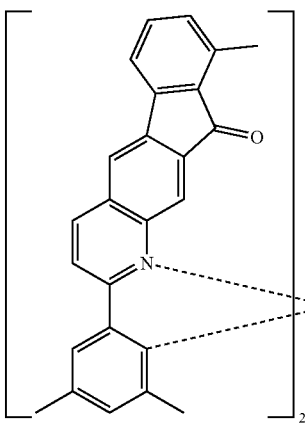
D-57
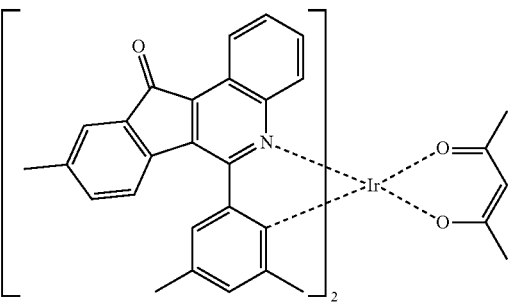
D-58
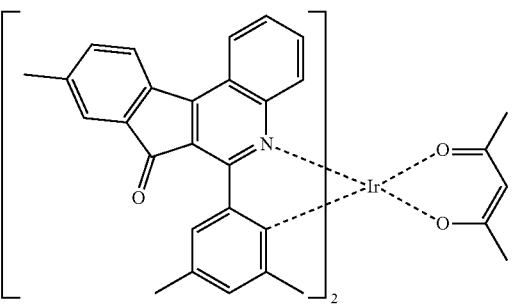
D-59

D-60
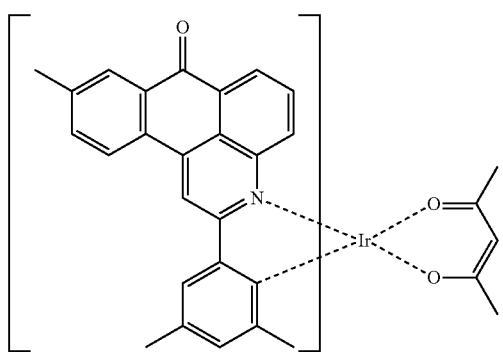
D-61
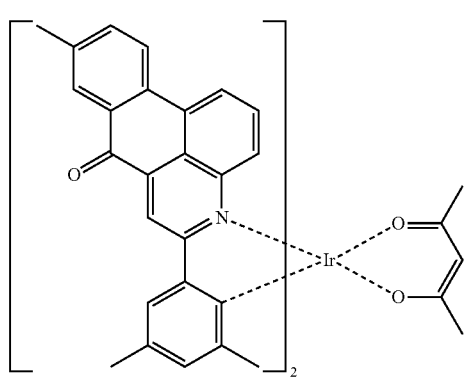
D-62
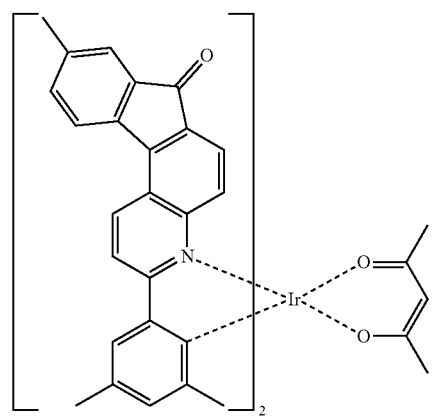
D-63
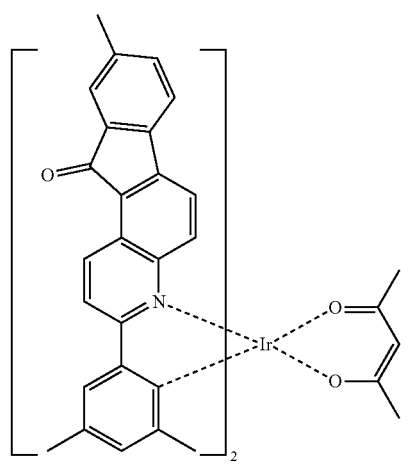
D-64
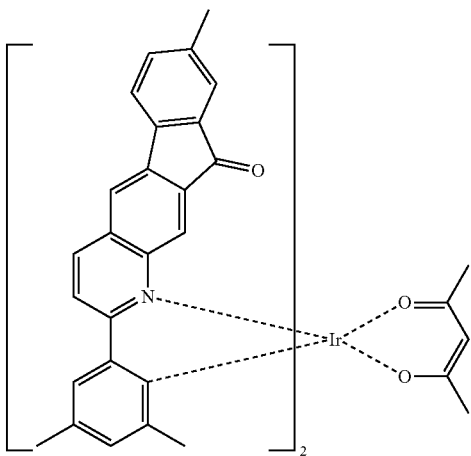
D-65
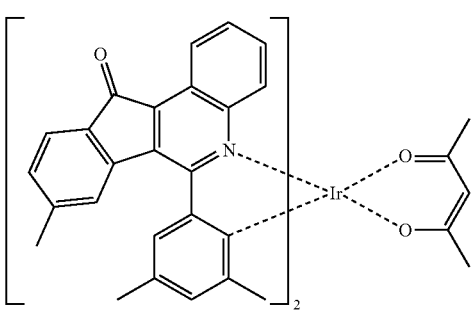
D-66
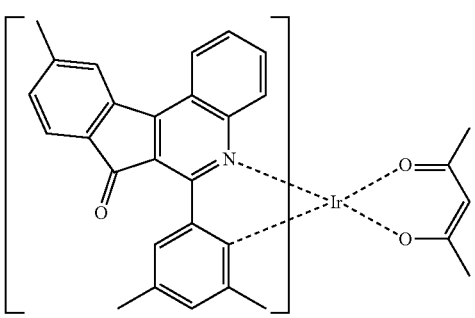
D-67
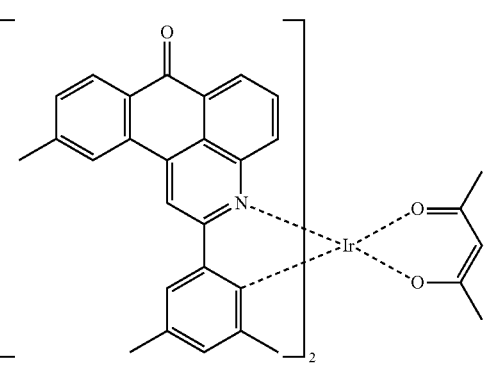

-continued
D-68
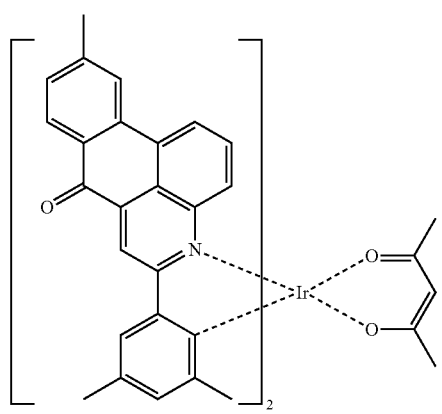
D-69
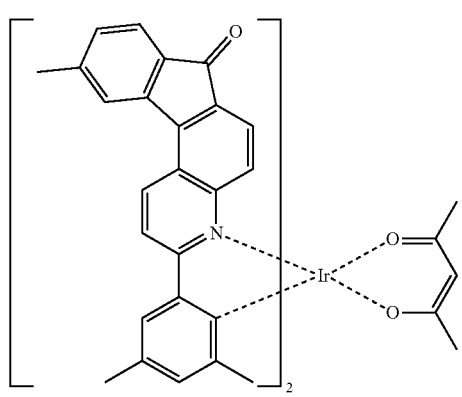
D-70
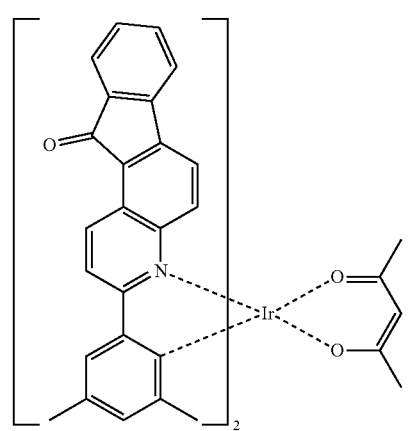
-continued
D-71
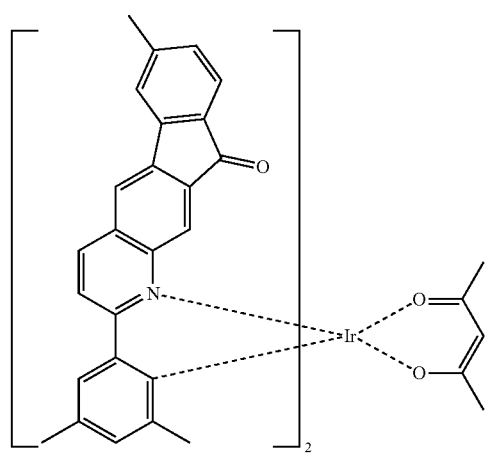
D-72
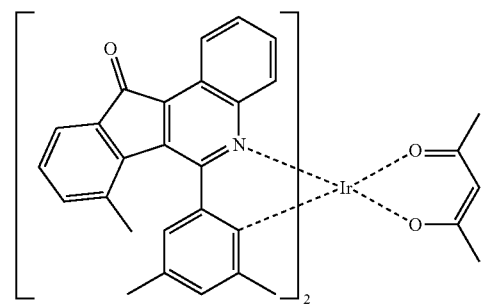
D-73
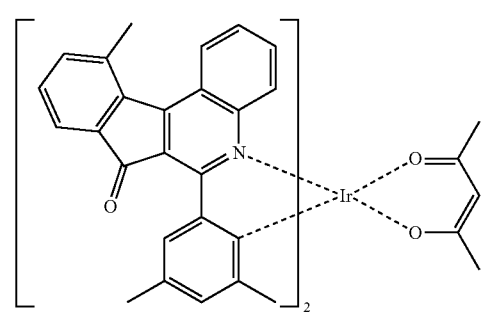
D-74
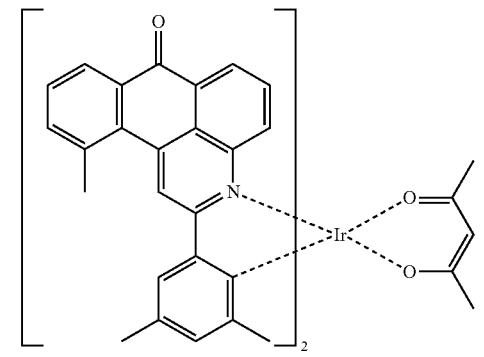

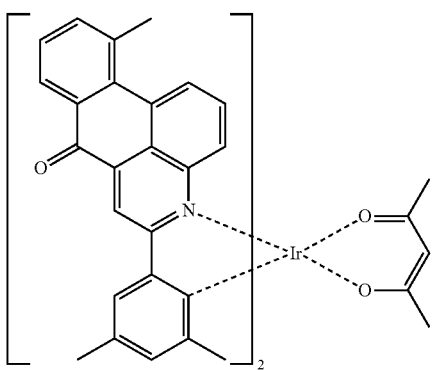
D-75
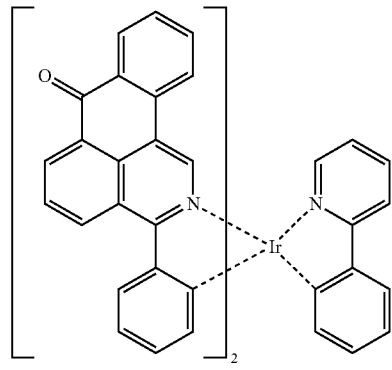
D-79
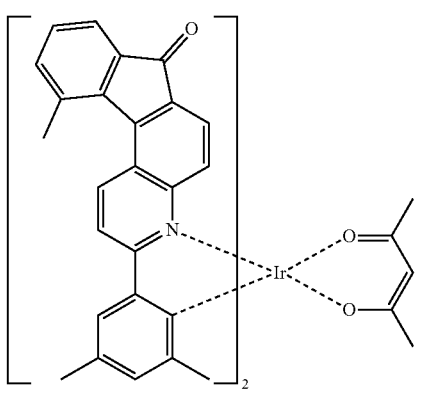
D-76
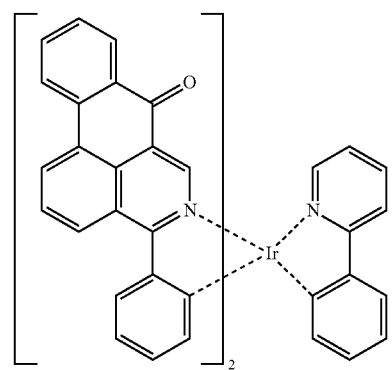
D-80
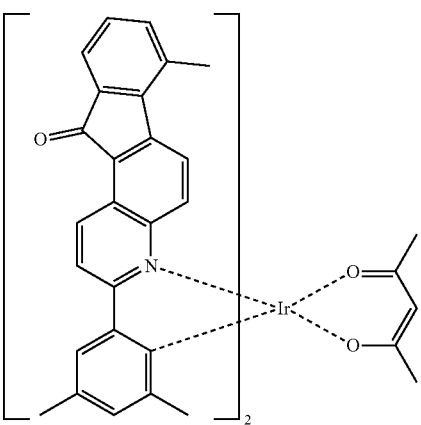
D-77
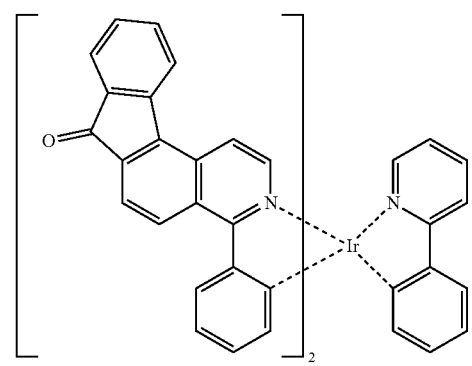
D-81
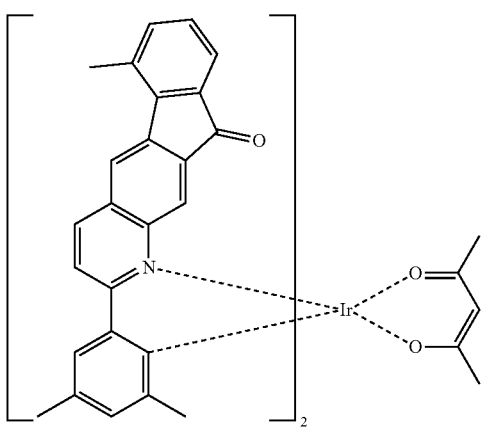
D-78
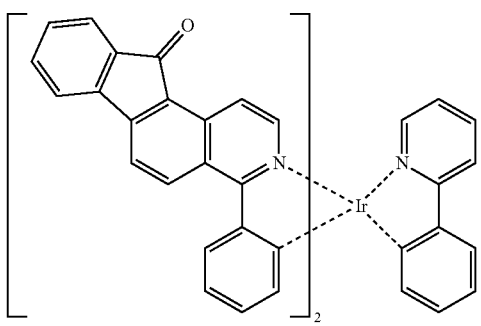
D-82

-continued
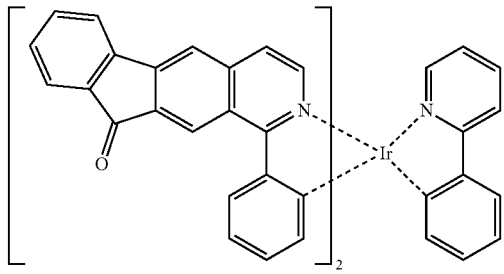
D-83
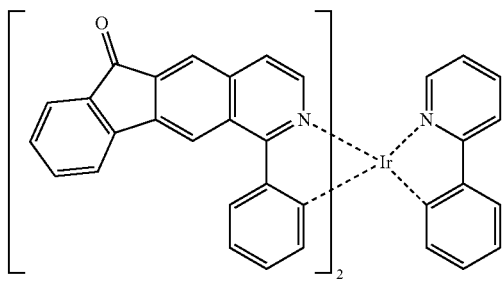
D-84
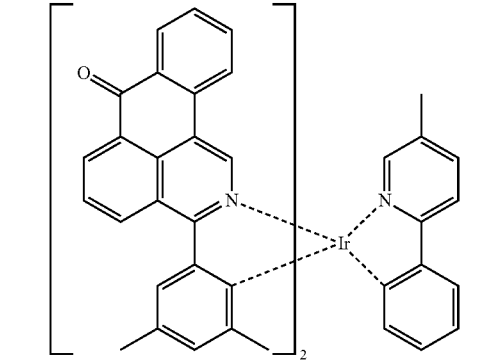
D-85
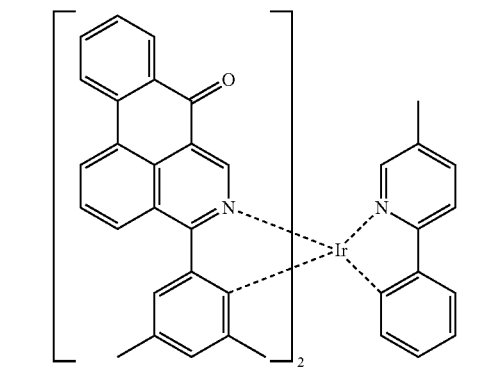
D-86
-continued
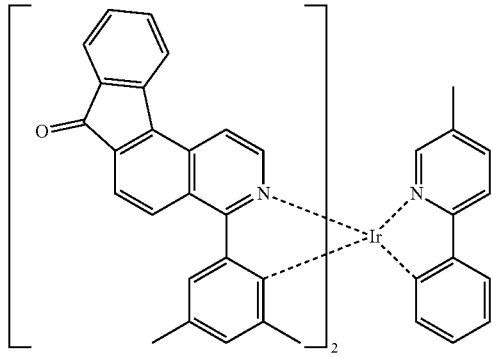
D-87
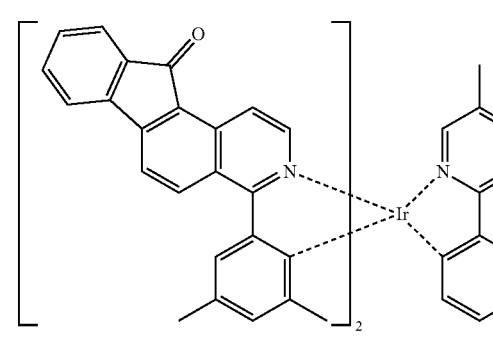
D-88
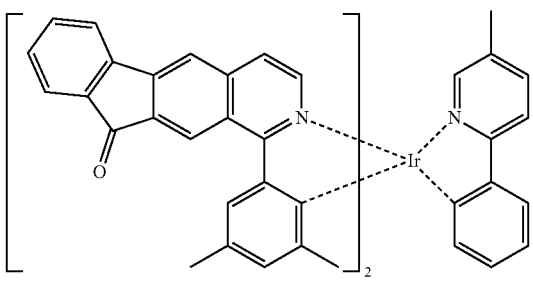
D-89
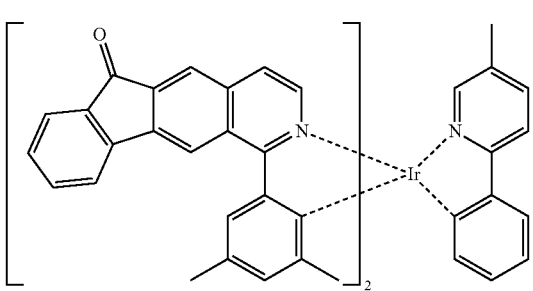
D-90
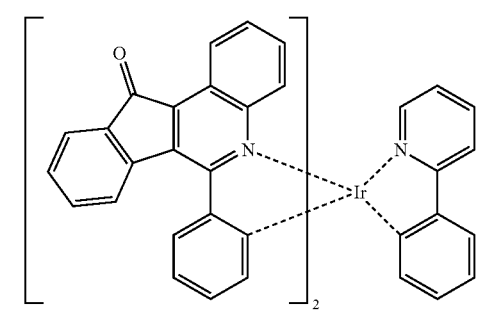
D-91

-continued
D-92
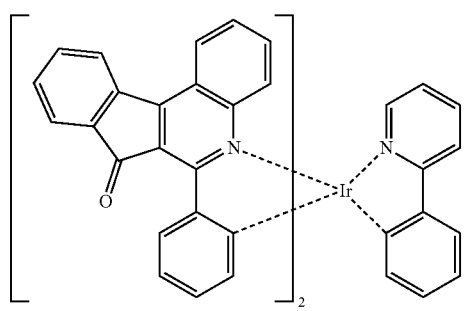
D-93
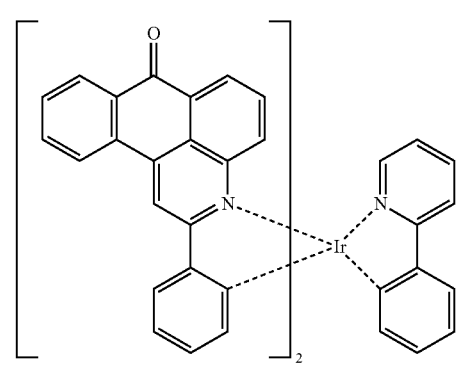
D-94
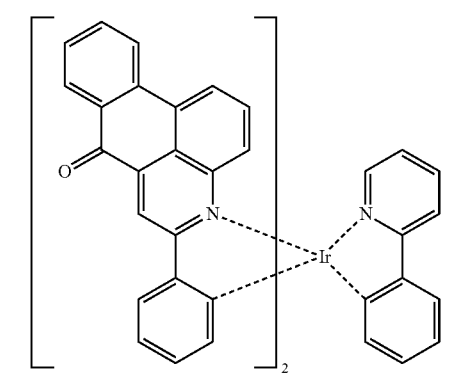
D-95
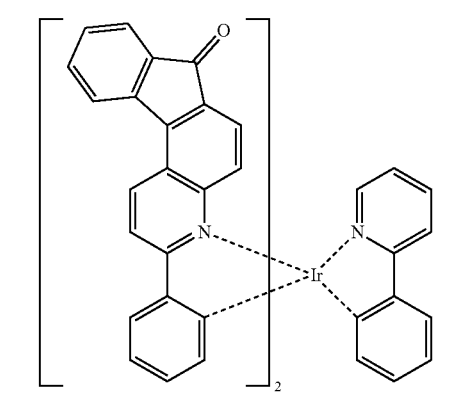
-continued
D-96
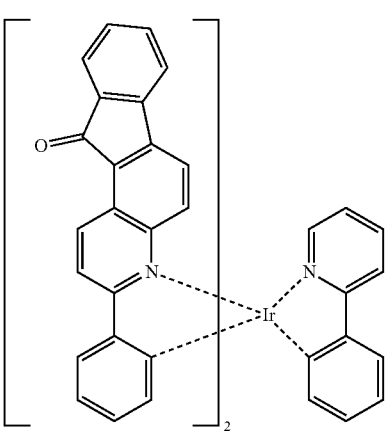
D-97
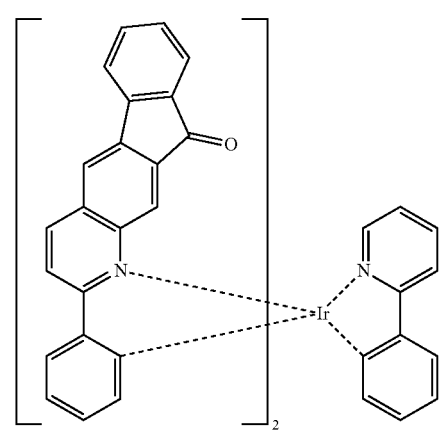
D-98
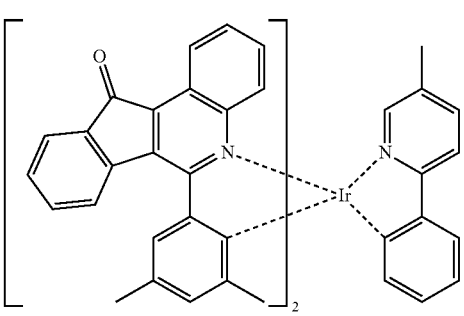
D-99
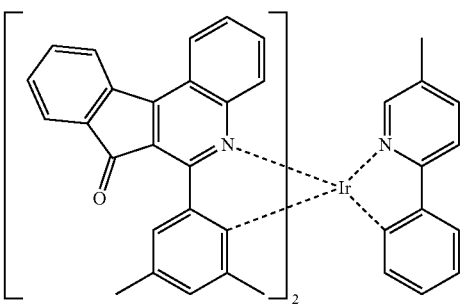

-continued
D-100
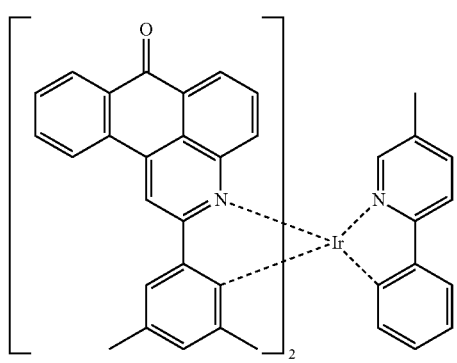
D-101
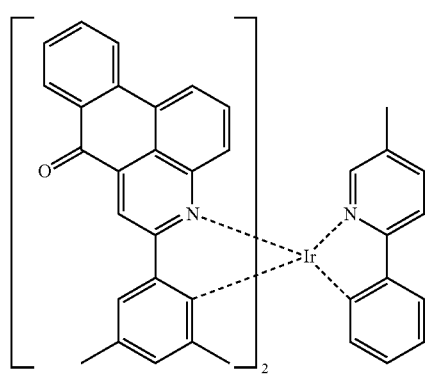
D-102
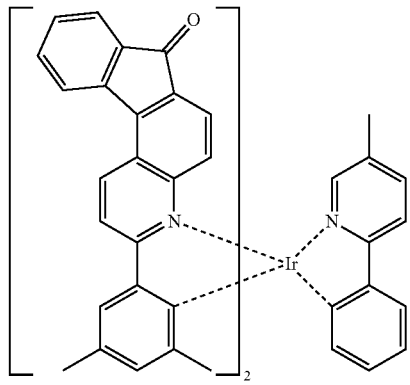
D-103
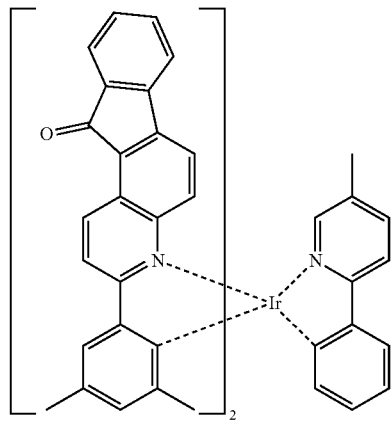
-continued
D-104
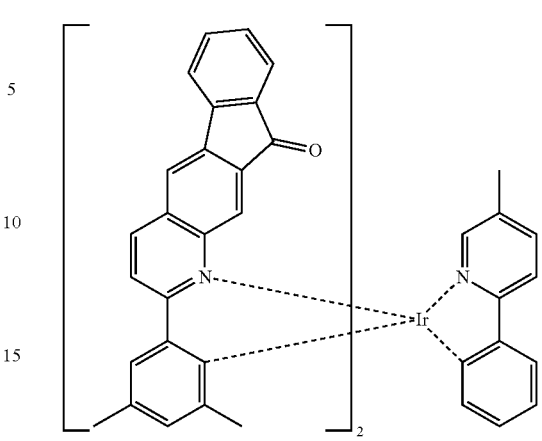
D-105
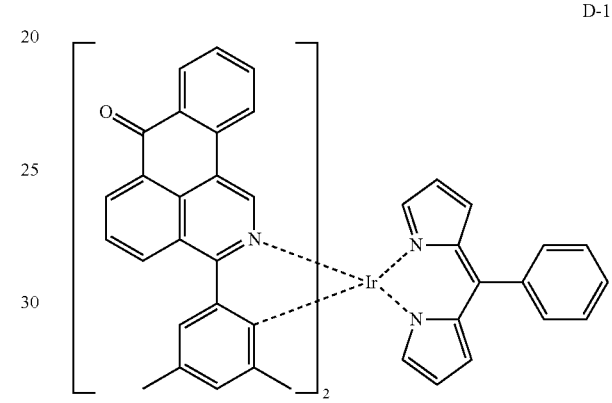
D-106
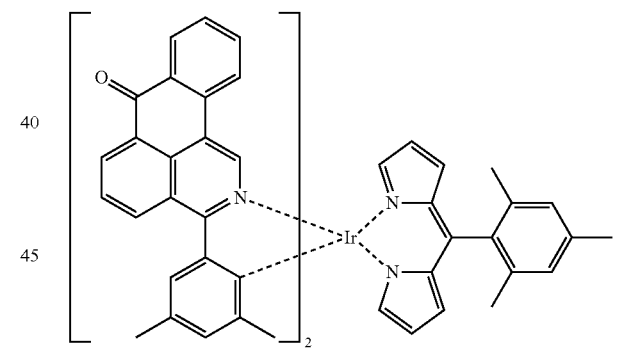
D-107
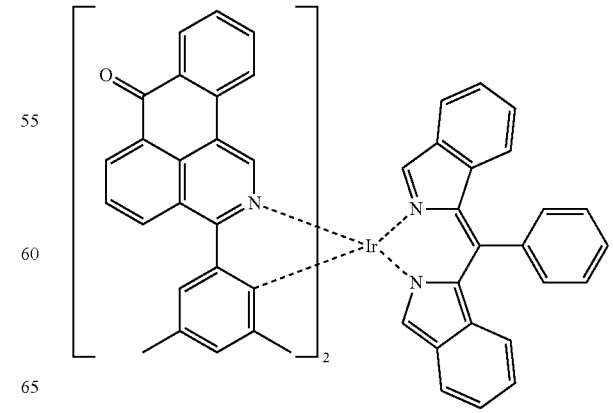

D-108
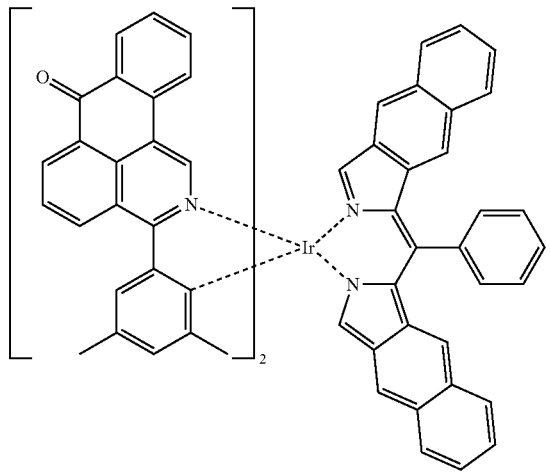
D-109
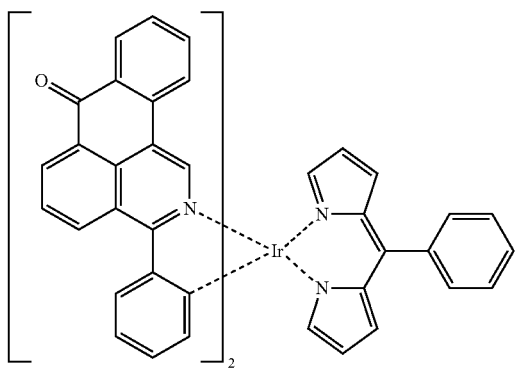
D-110
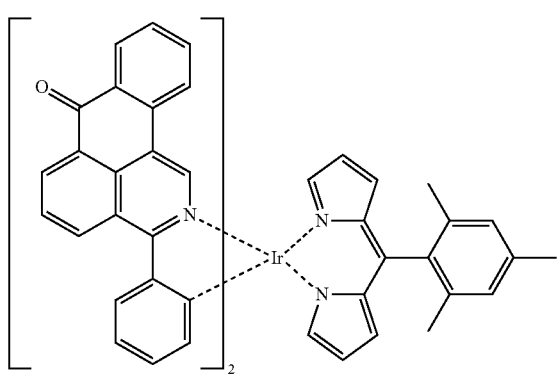
D-111
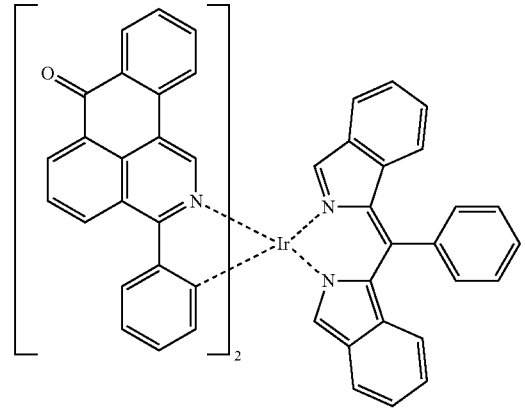
D-112
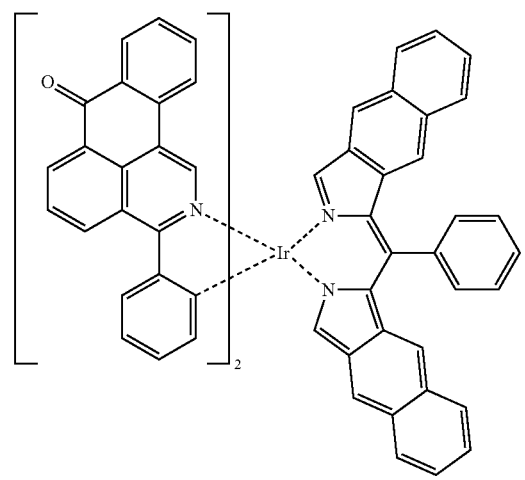
D-113
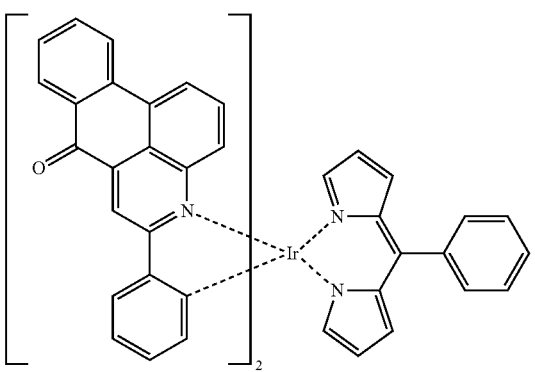

D-114
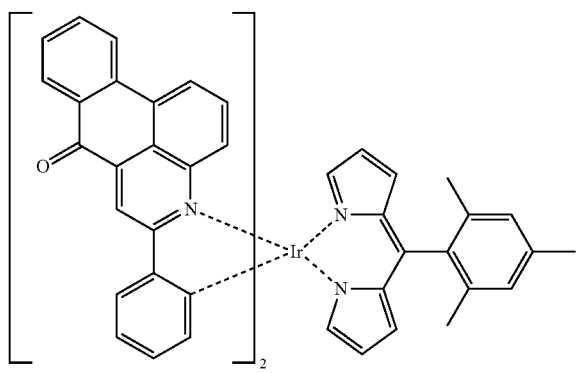
D-117
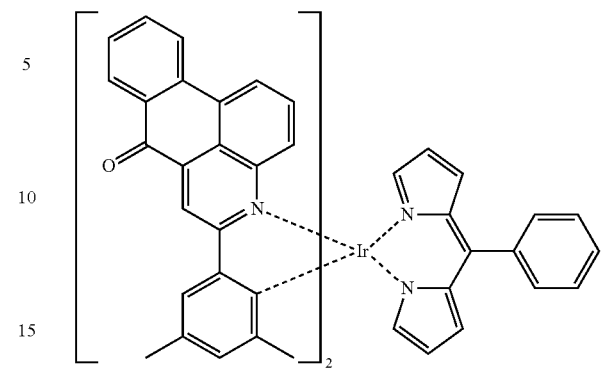
D-115
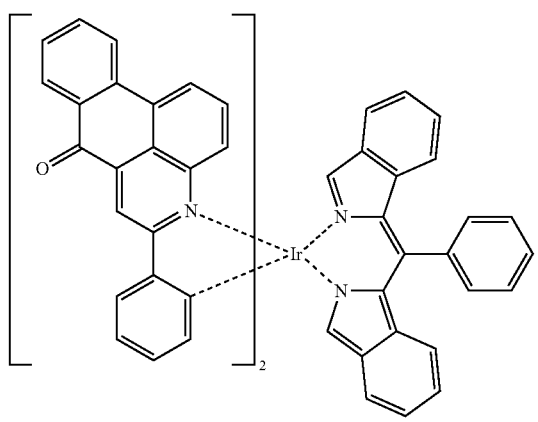
D-118
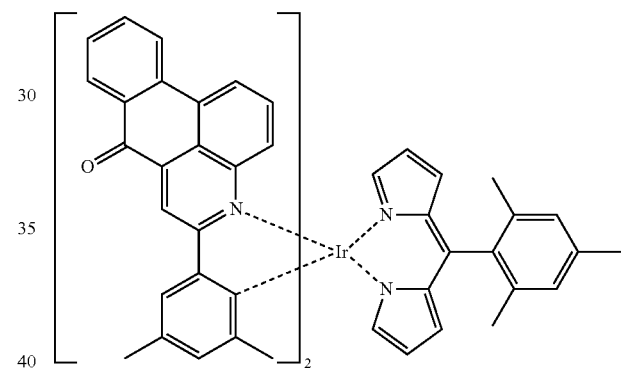
D-116
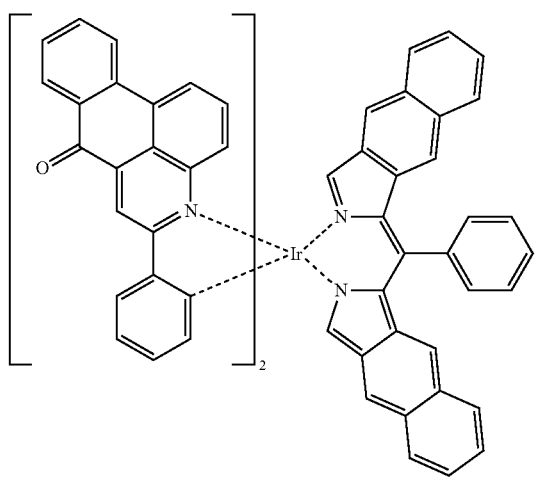
D-119
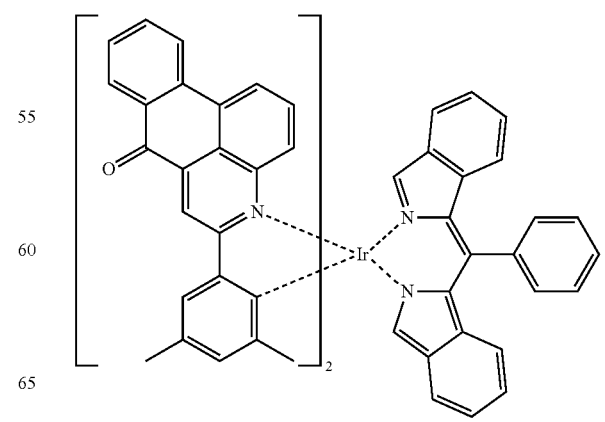

D-120
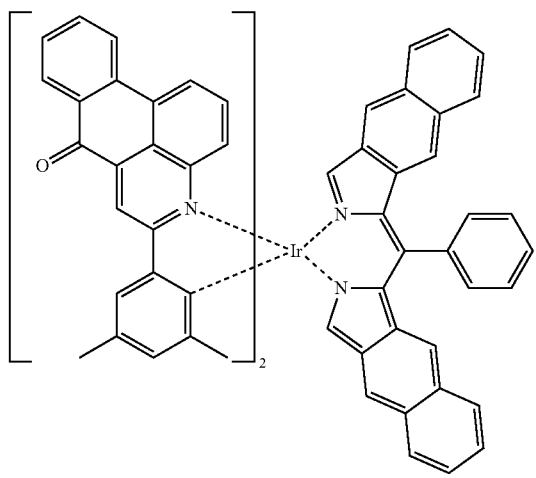
D-121
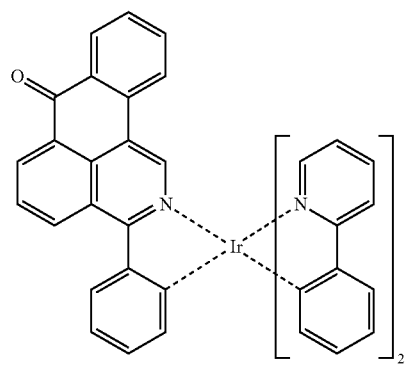
D-122
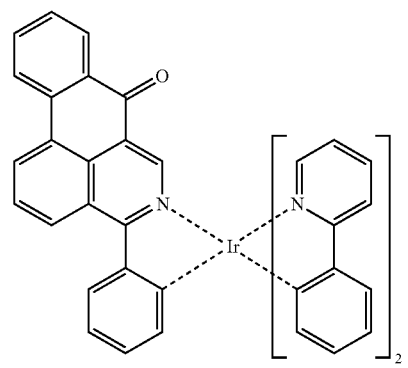
D-123
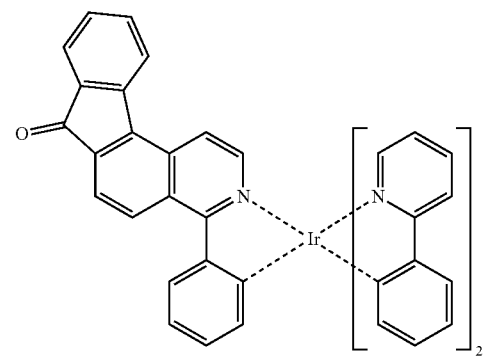
D-124
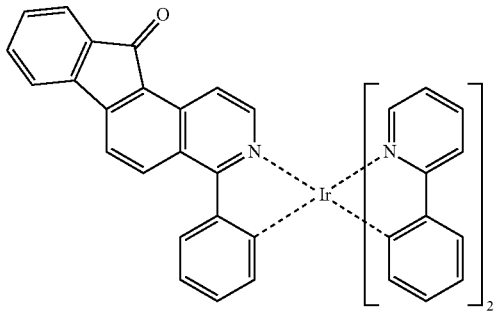
D-125
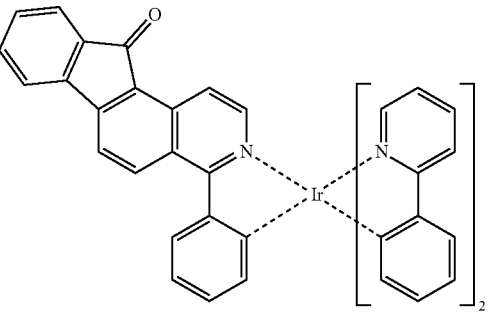
D-126
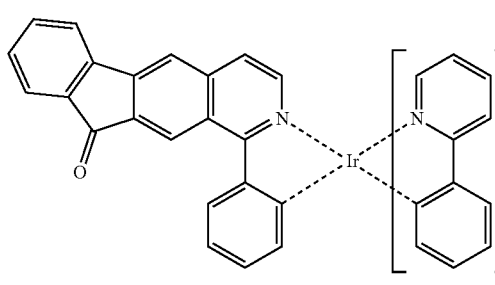
D-127
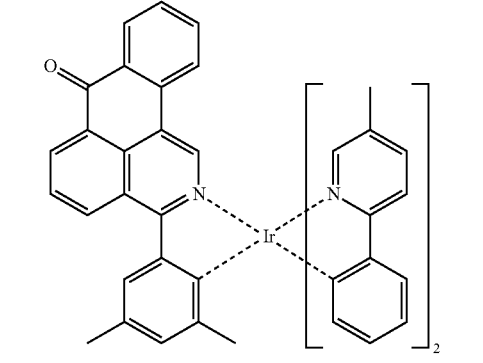
D-128
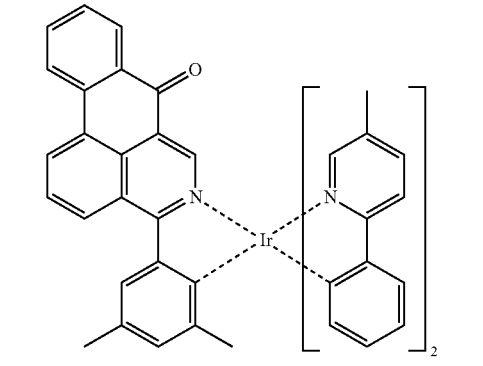

-continued
D-129
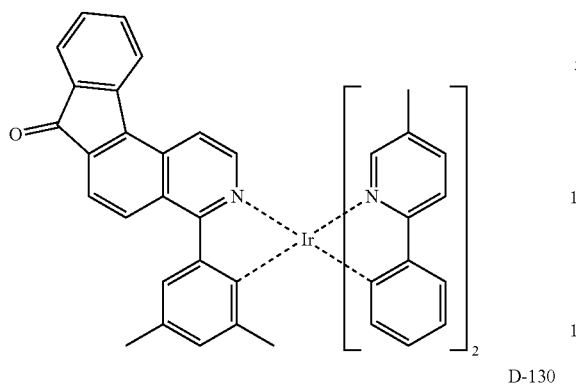
D-130
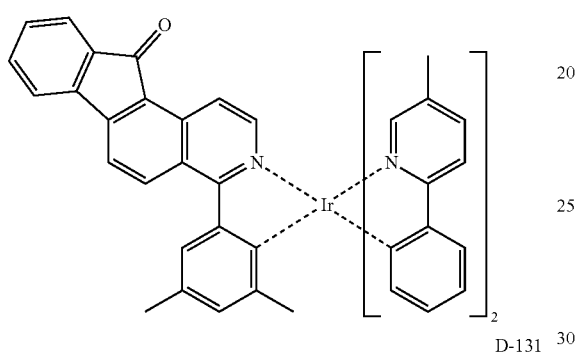
D-131
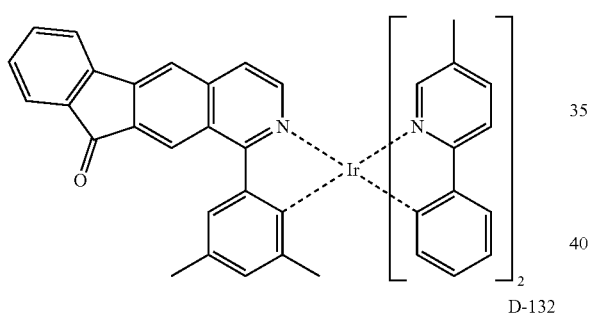
D-132
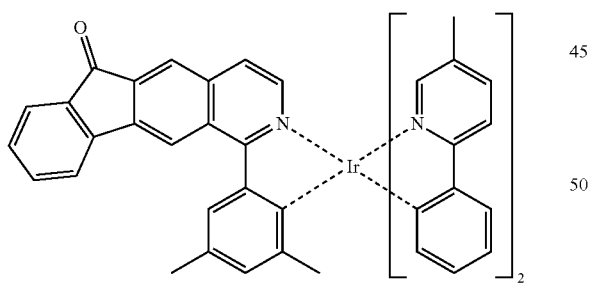
D-133
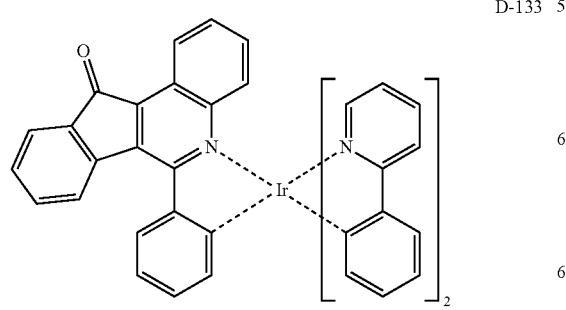
-continued
D-134
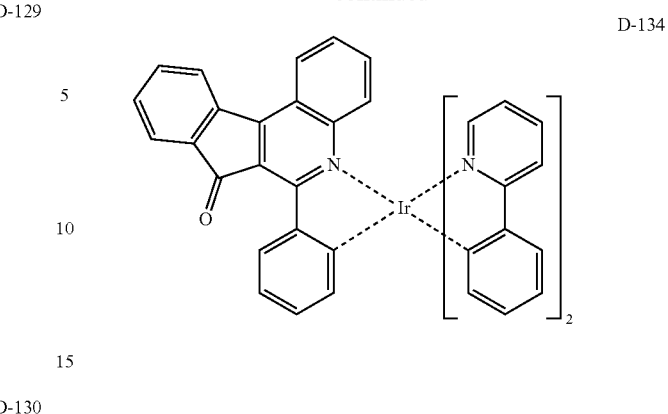
D-135
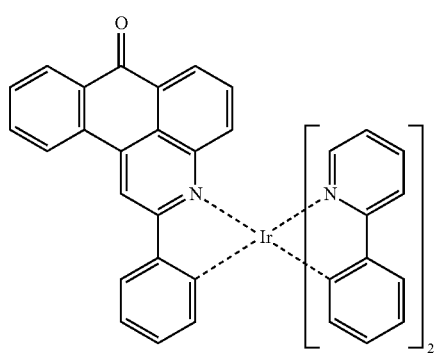
D-136
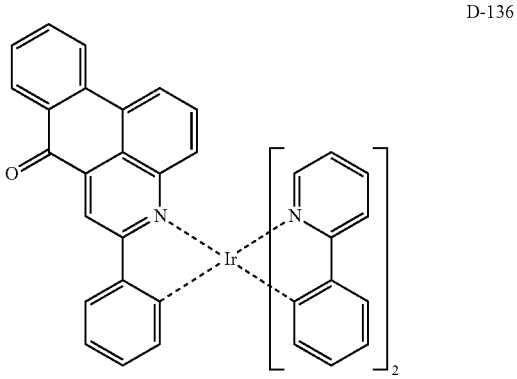
D-137
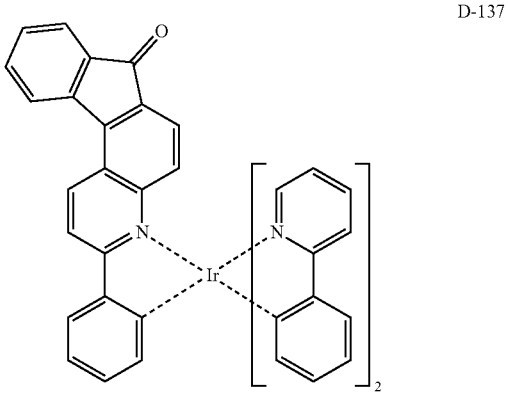

D-138
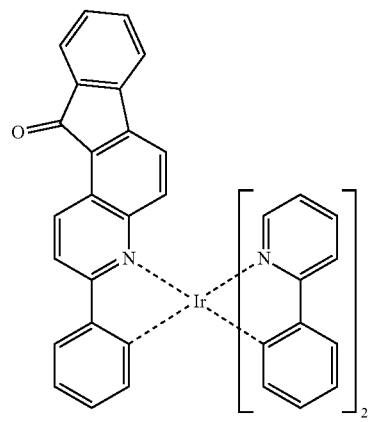
D-139
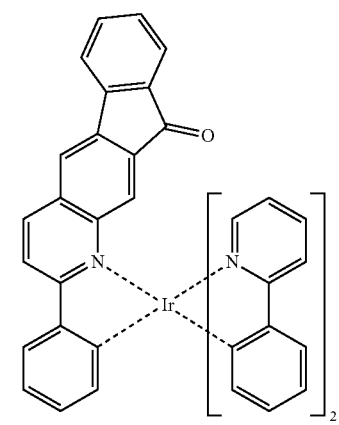
D-140
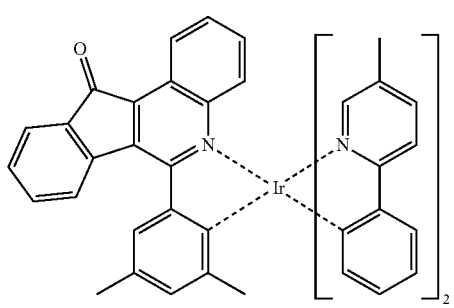
D-141
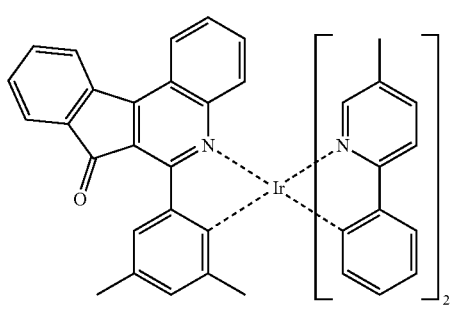
D-142
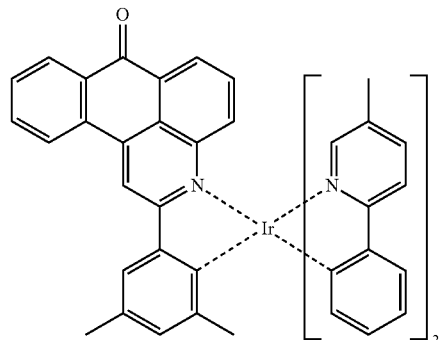
D-143
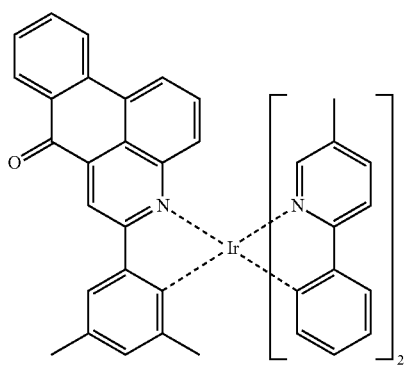
D-144
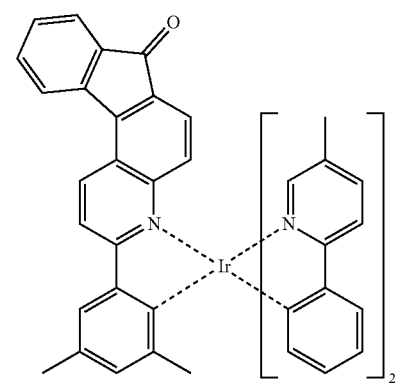
D-145
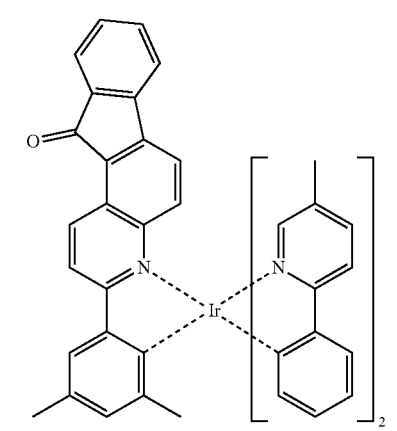

D-146
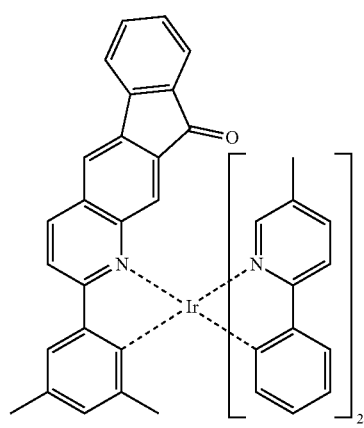
D-147
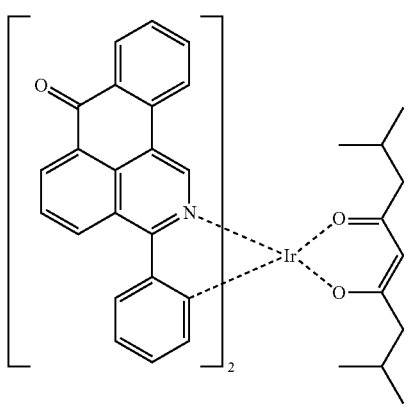
D-148
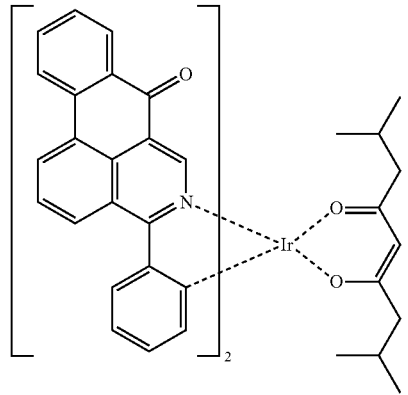
D-149
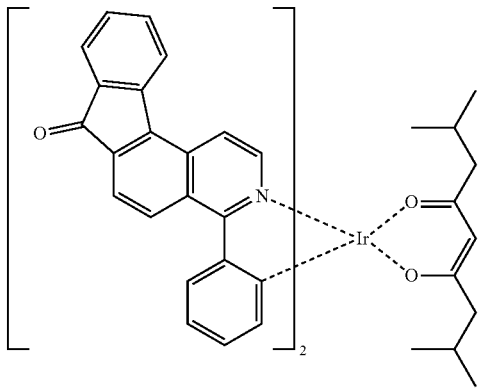
D-150
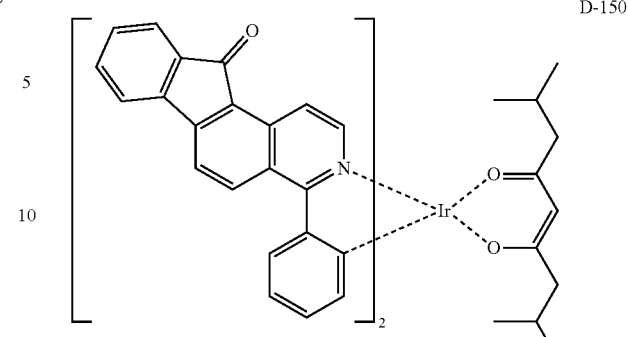
D-151
D-152
D-153
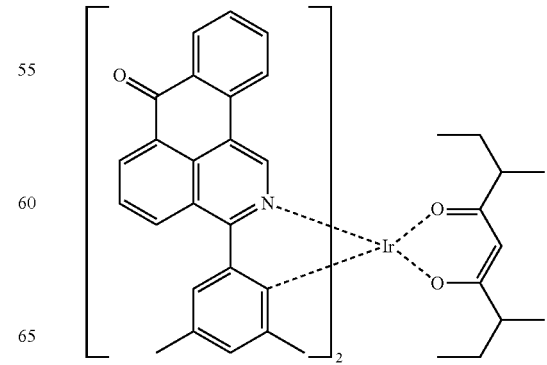

D-154
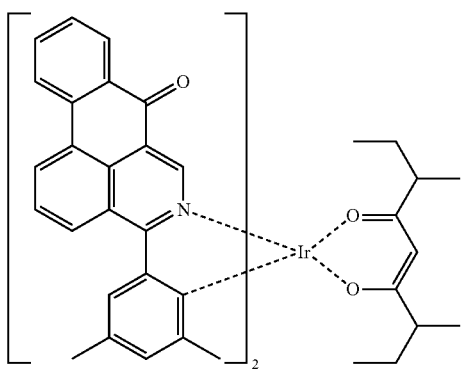
D-155
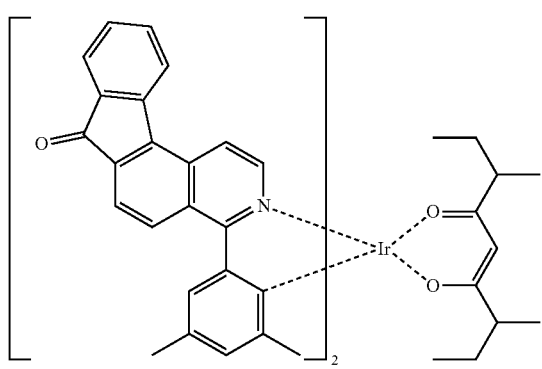
D-156
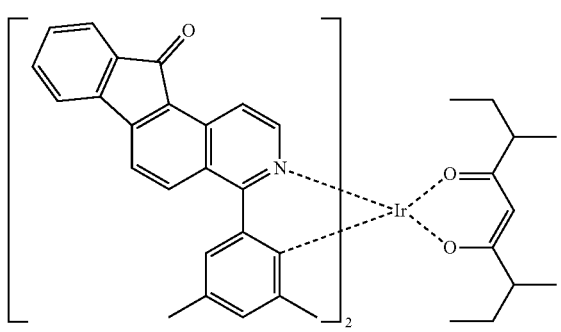
D-157
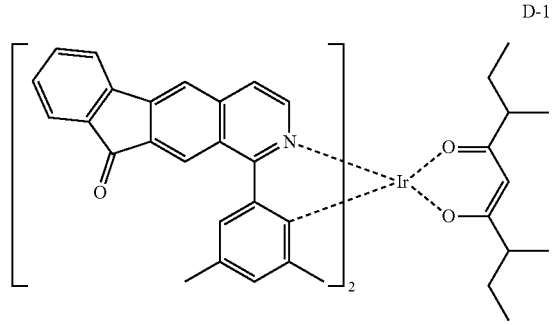
D-158
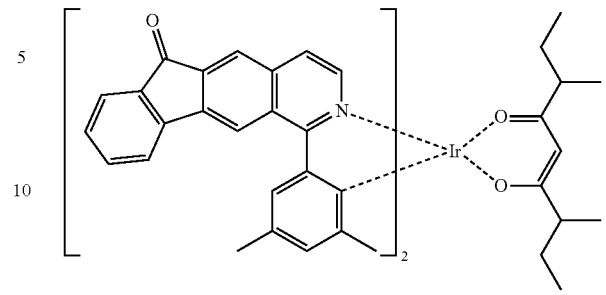
D-159
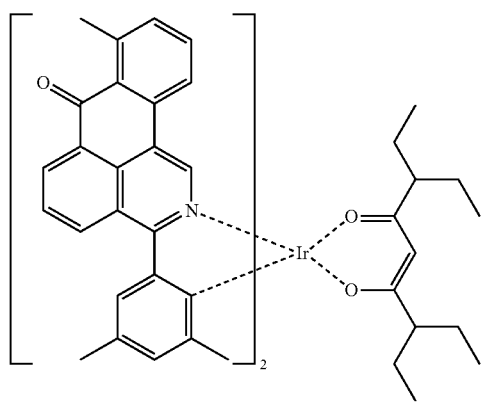
D-160
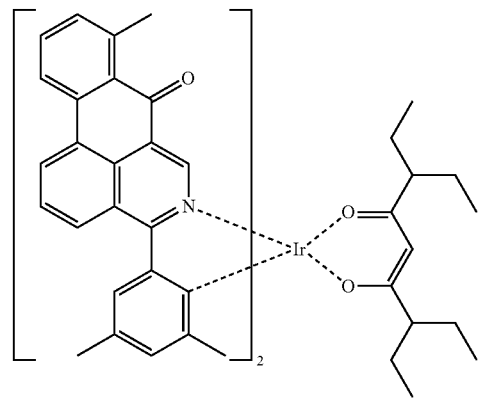
D-161
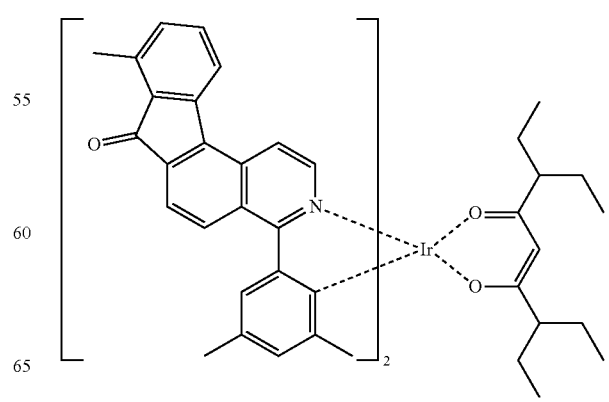

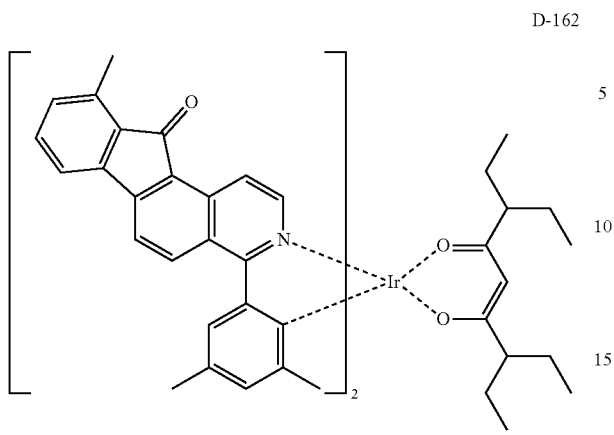
D-162
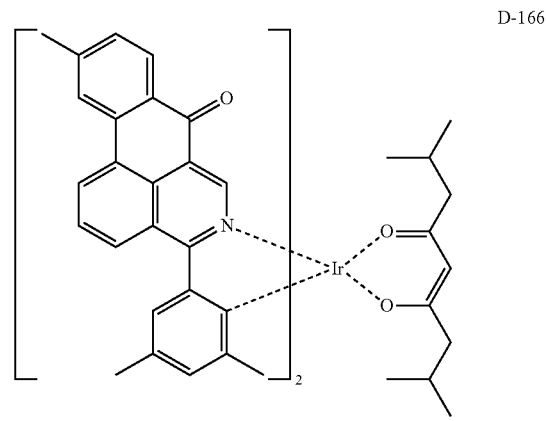
D-166
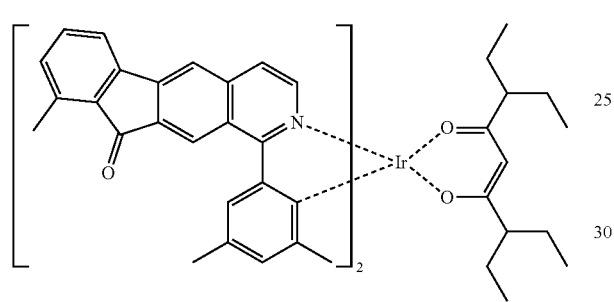
D-163
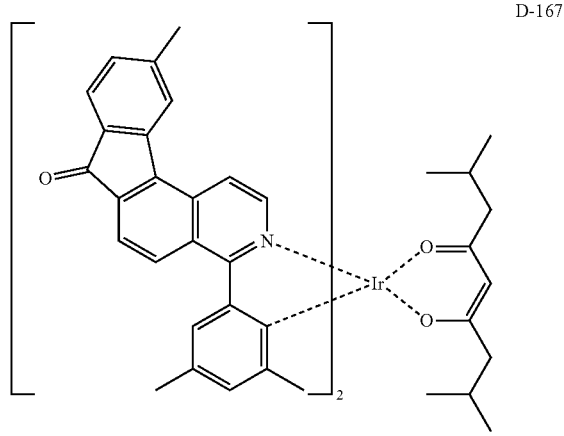
D-167
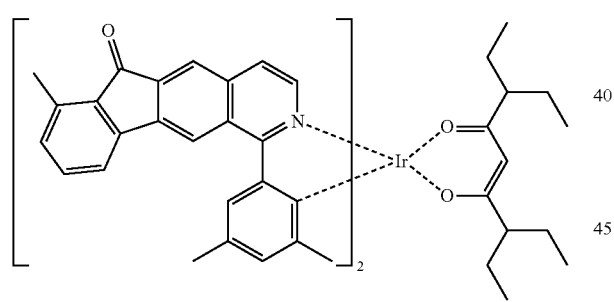
D-164
D-168
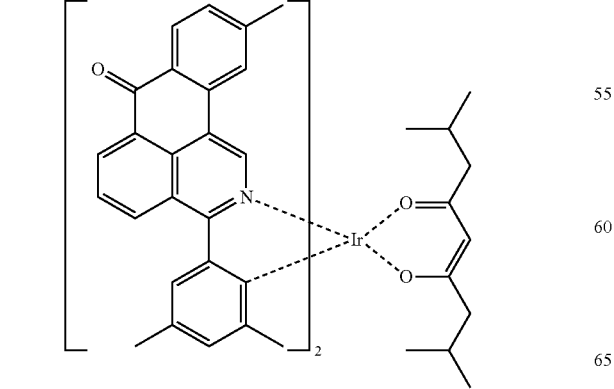
D-165
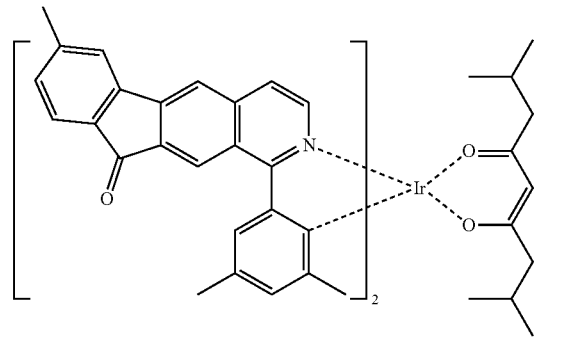
D-169

-continued
D-170
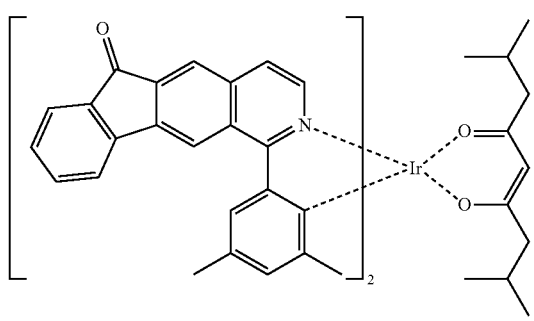
D-171
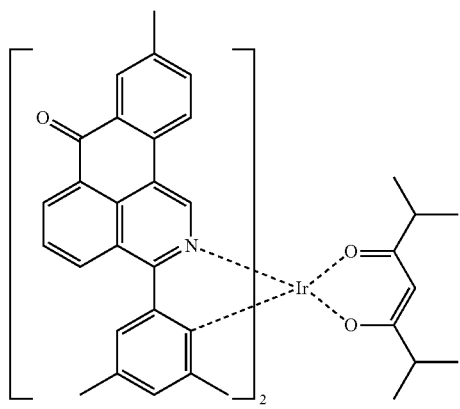
D-172
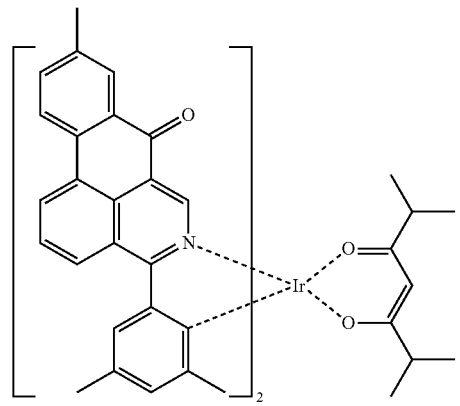
D-173
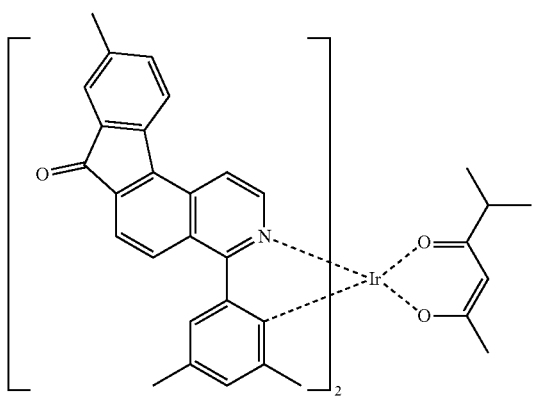
-continued
D-174
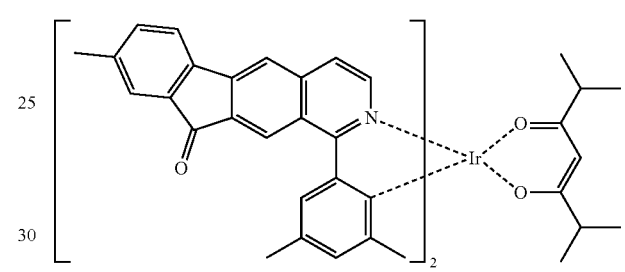
D-175
D-176
D-177
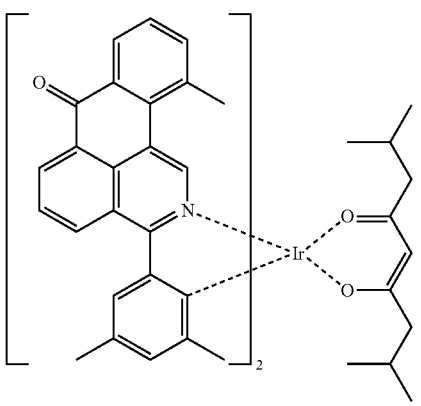

D-178
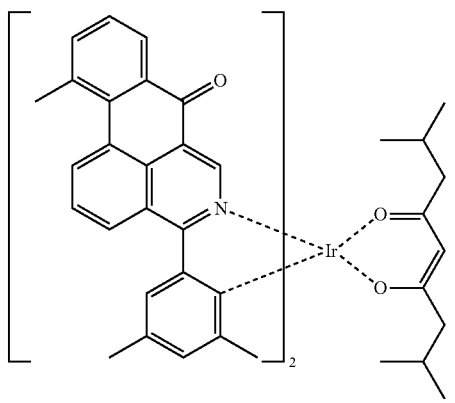
D-182
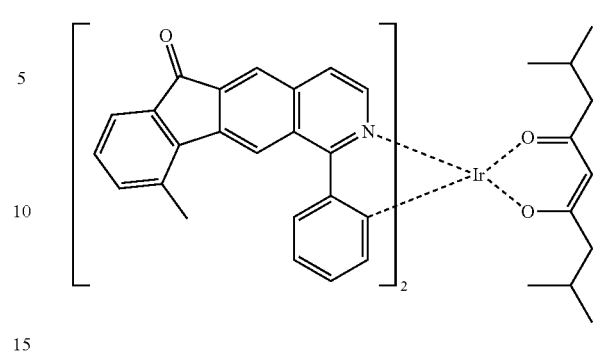
D-179
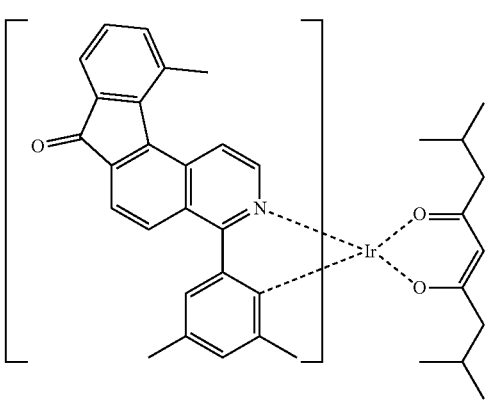
D-183
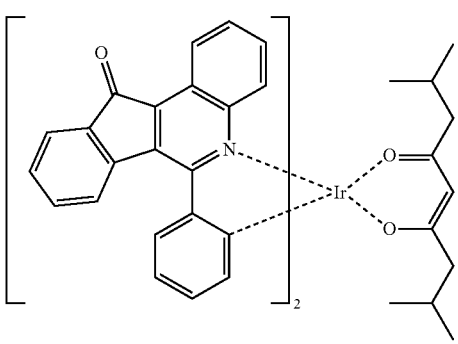
D-180
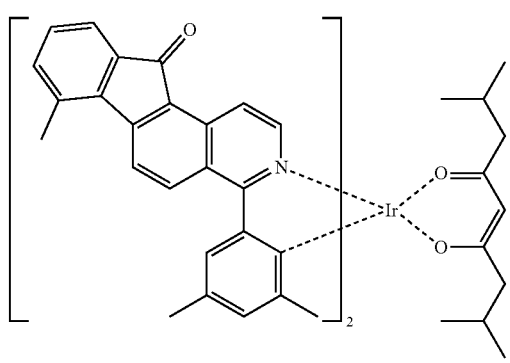
D-184
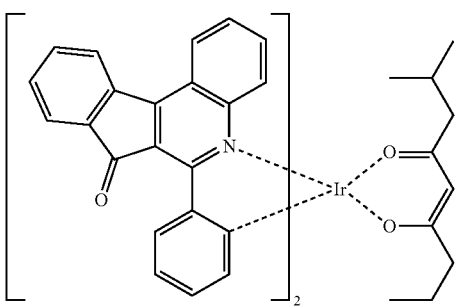
D-181
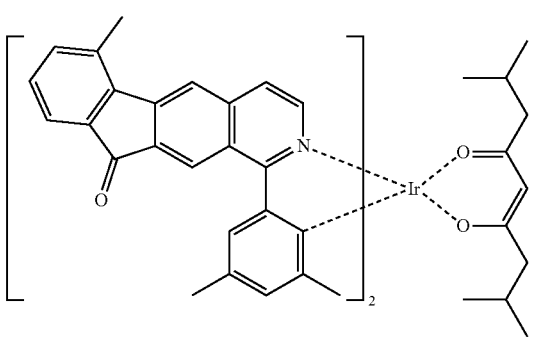
D-185
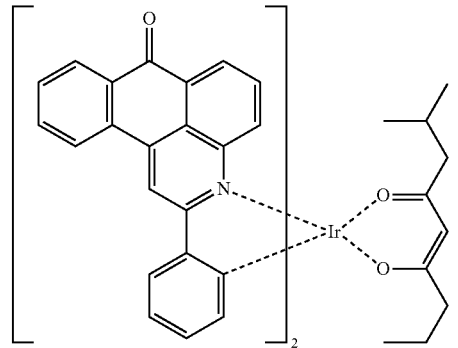

D-186
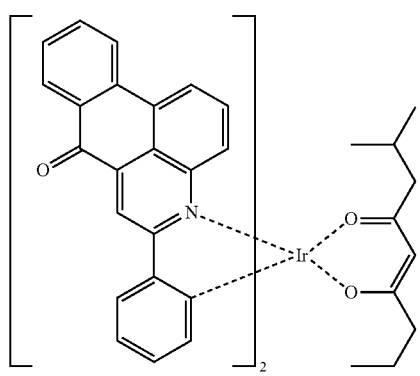
D-187
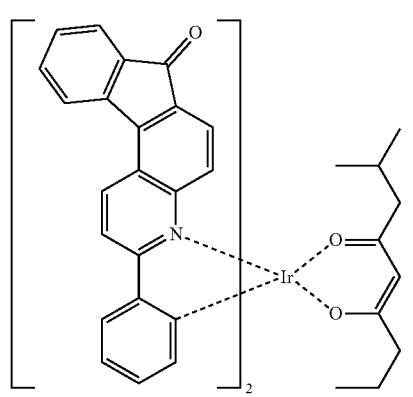
D-188
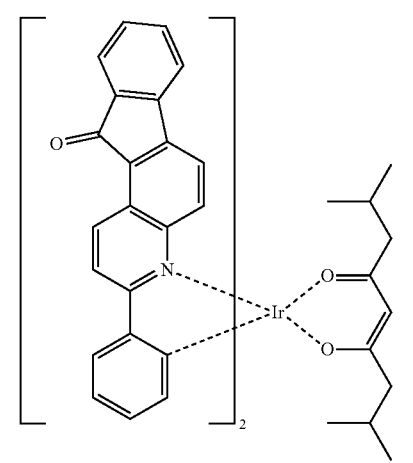
D-189
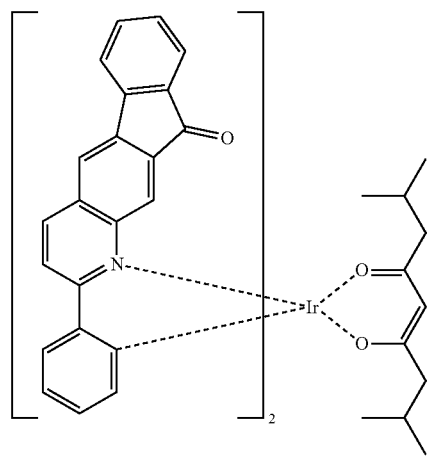
D-190
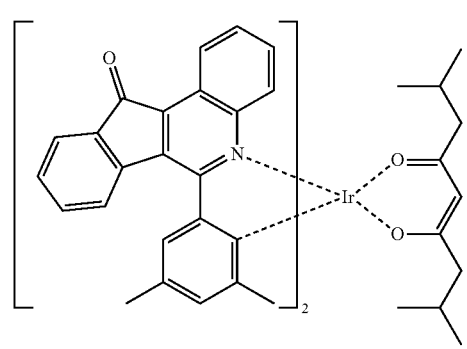
D-191
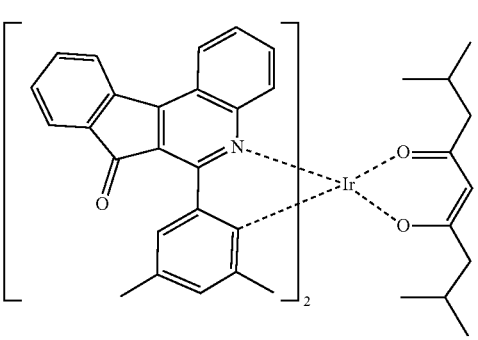
D-192
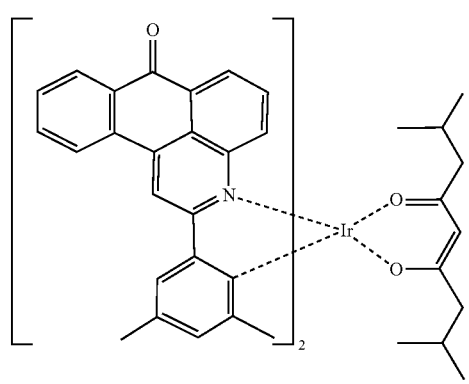

D-193
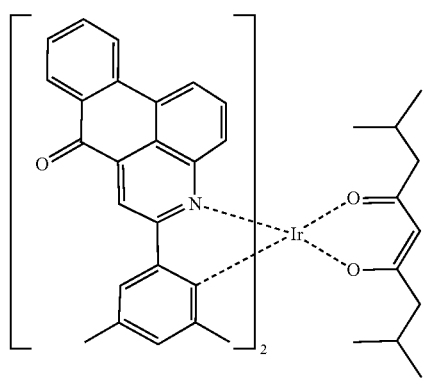
D-194
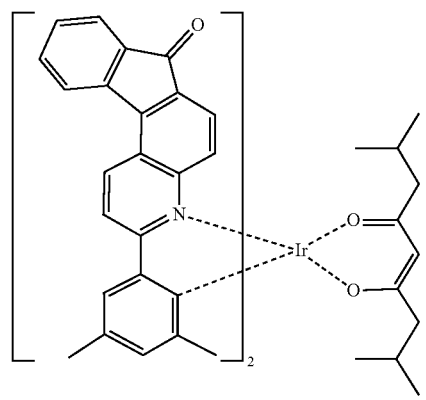
D-195
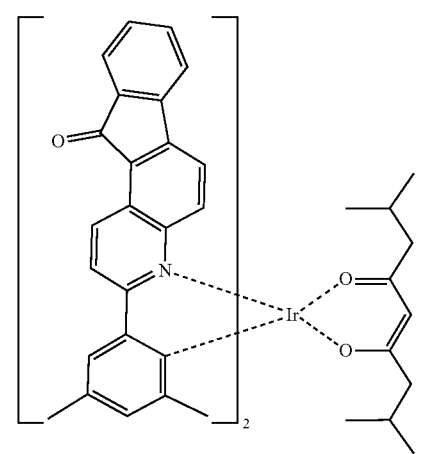
D-196
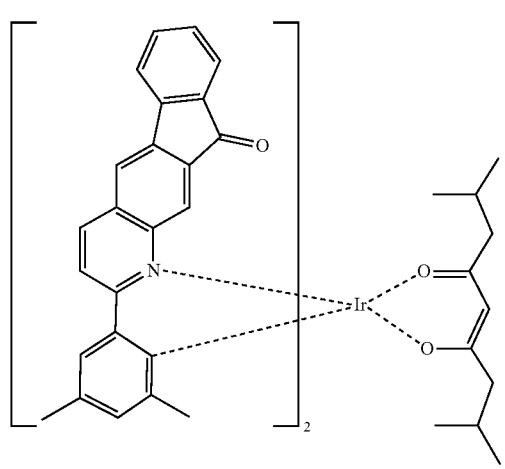
D-197
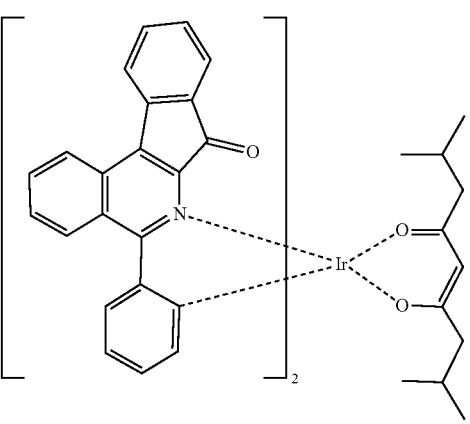
D-198
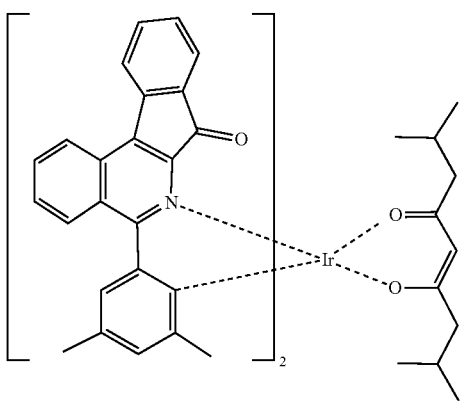

D-199
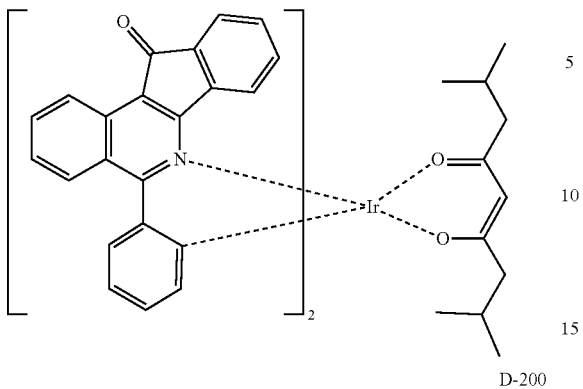
D-200
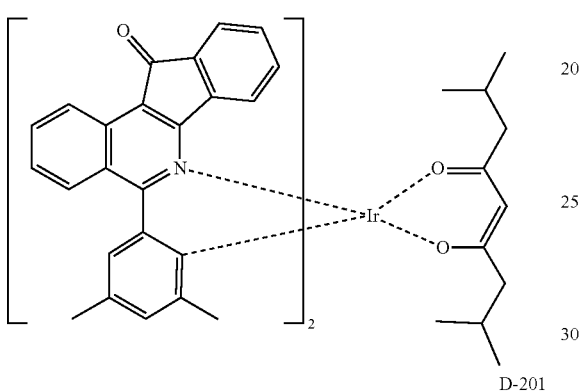
D-201
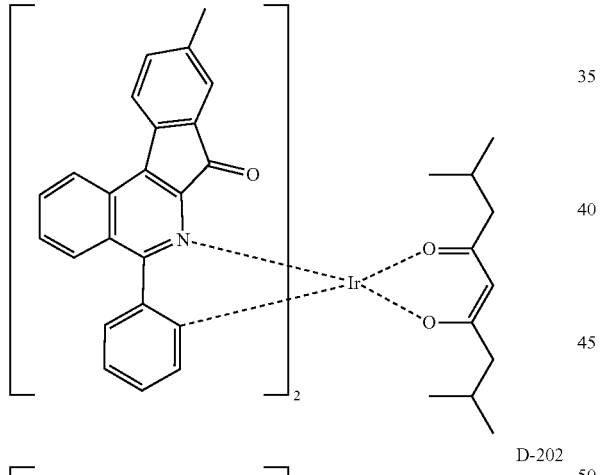
D-202
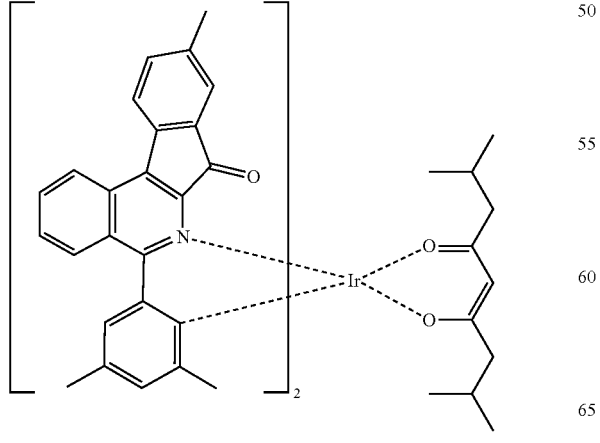
D-203
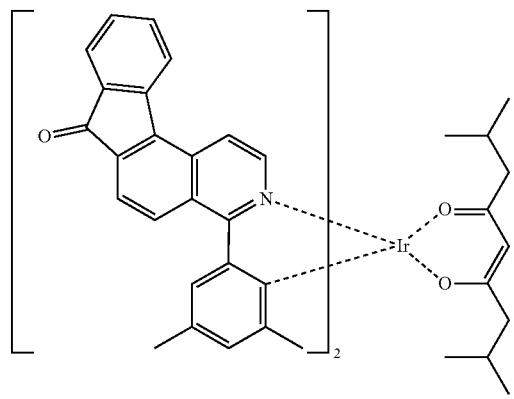
D-204
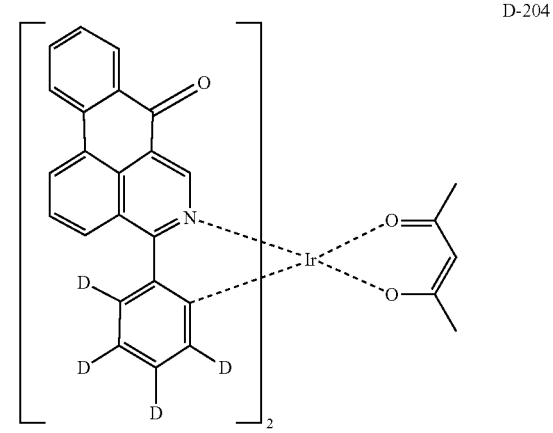
D-205
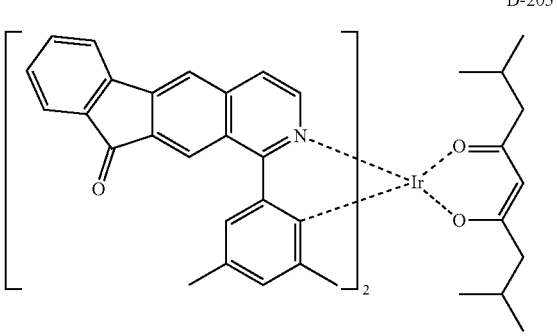
D-206

-continued
D-207
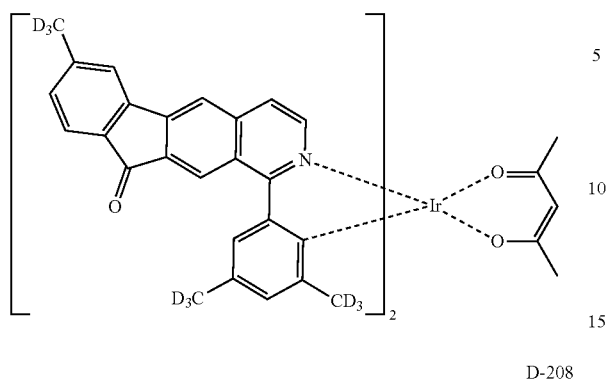
D-208
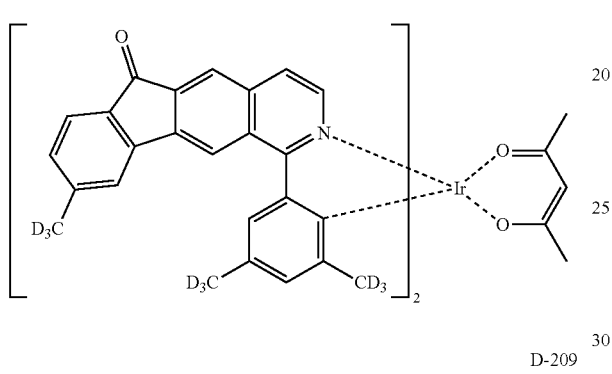
D-209
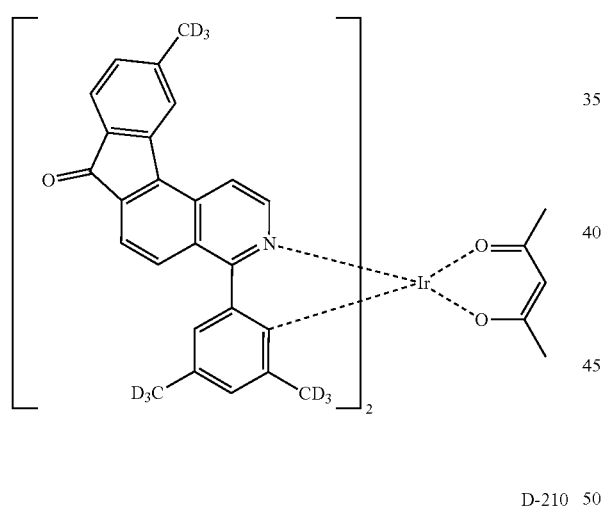
D-210
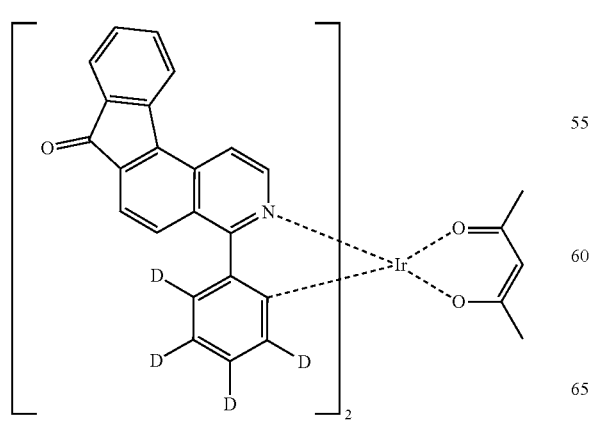
-continued
D-211
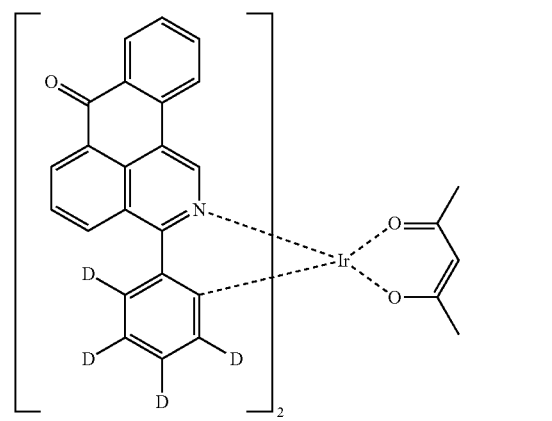
D-212
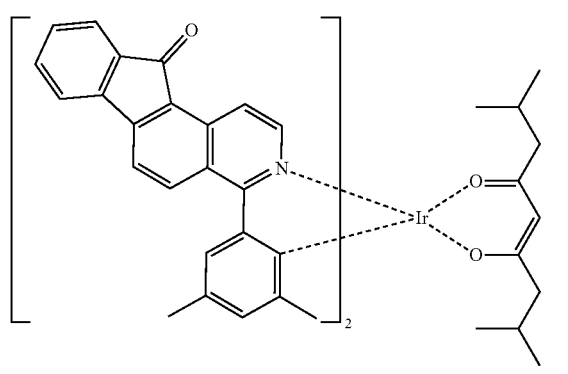
D-213
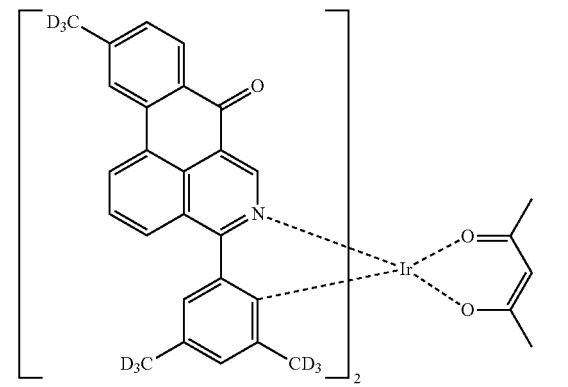
D-214
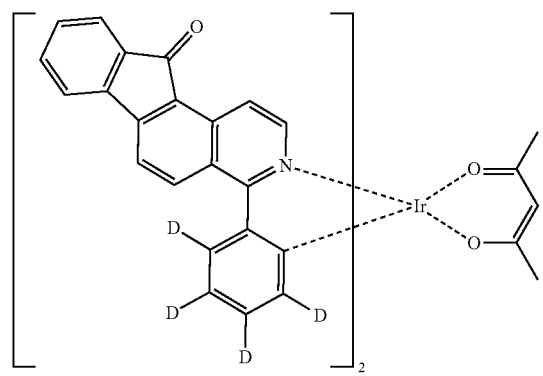

D-215
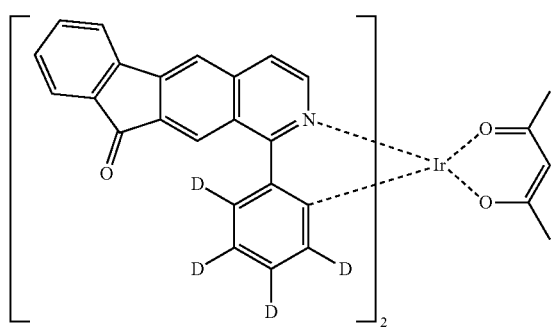
D-216
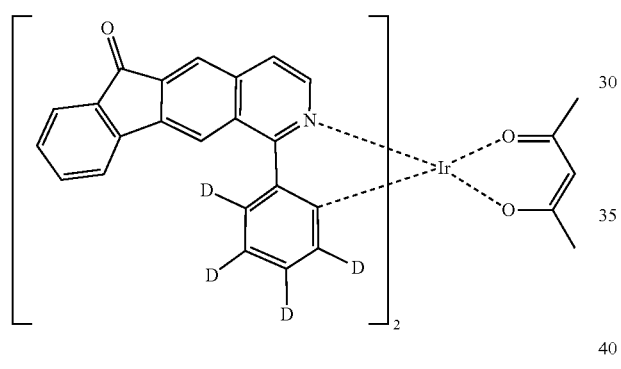
D-217
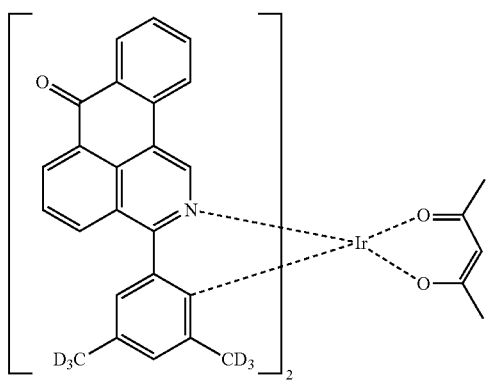
D-218
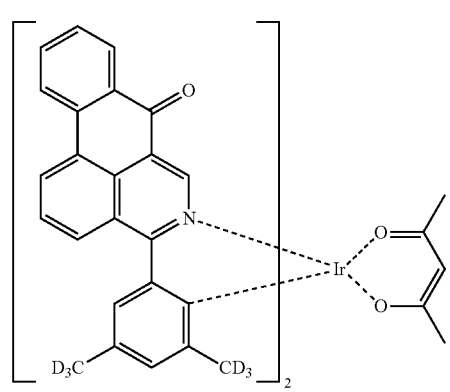
D-219
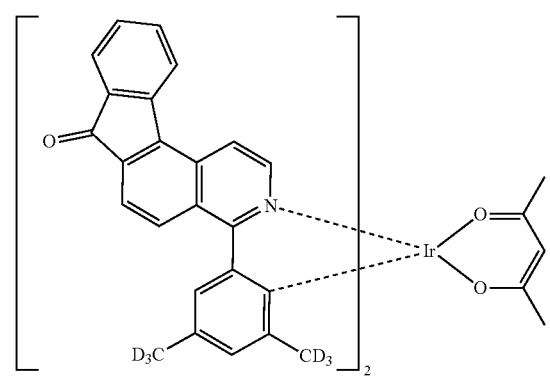
D-220
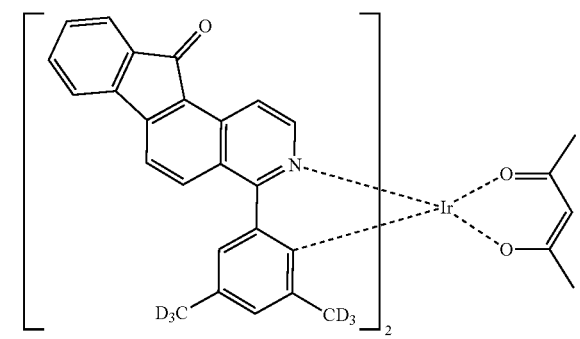

-continued
D-221
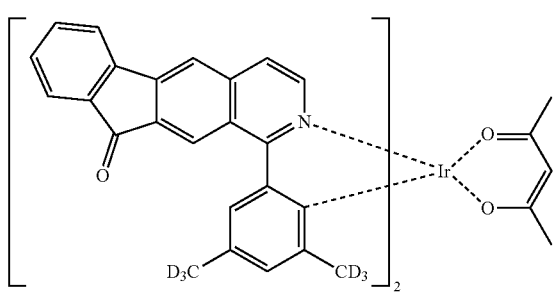
D-222
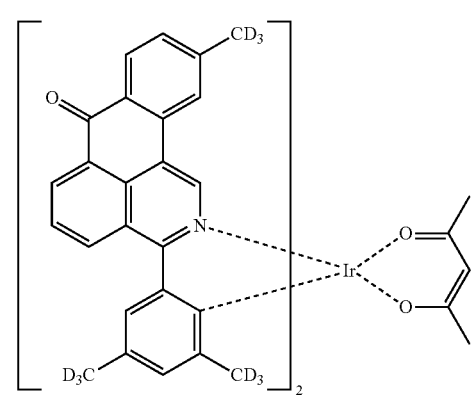
D-223
The compound according to the present disclosure may be prepared by a synthetic method known to one skilled in the art, and for example, as shown in the following reaction schemes 1 and 2, but is not limited thereto.
[Reaction Scheme 1]
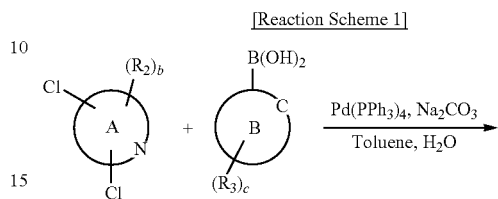
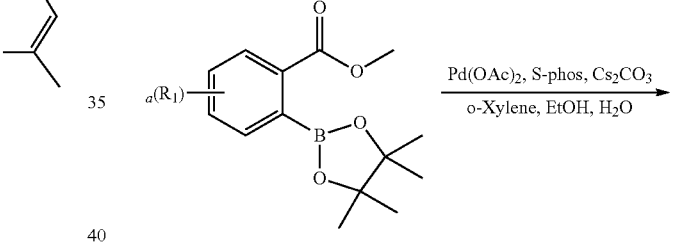
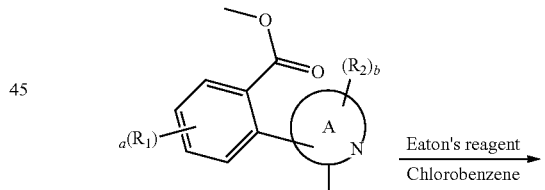
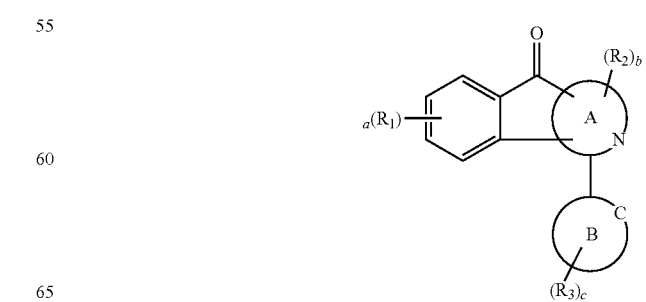

[Reaction Scheme 2]

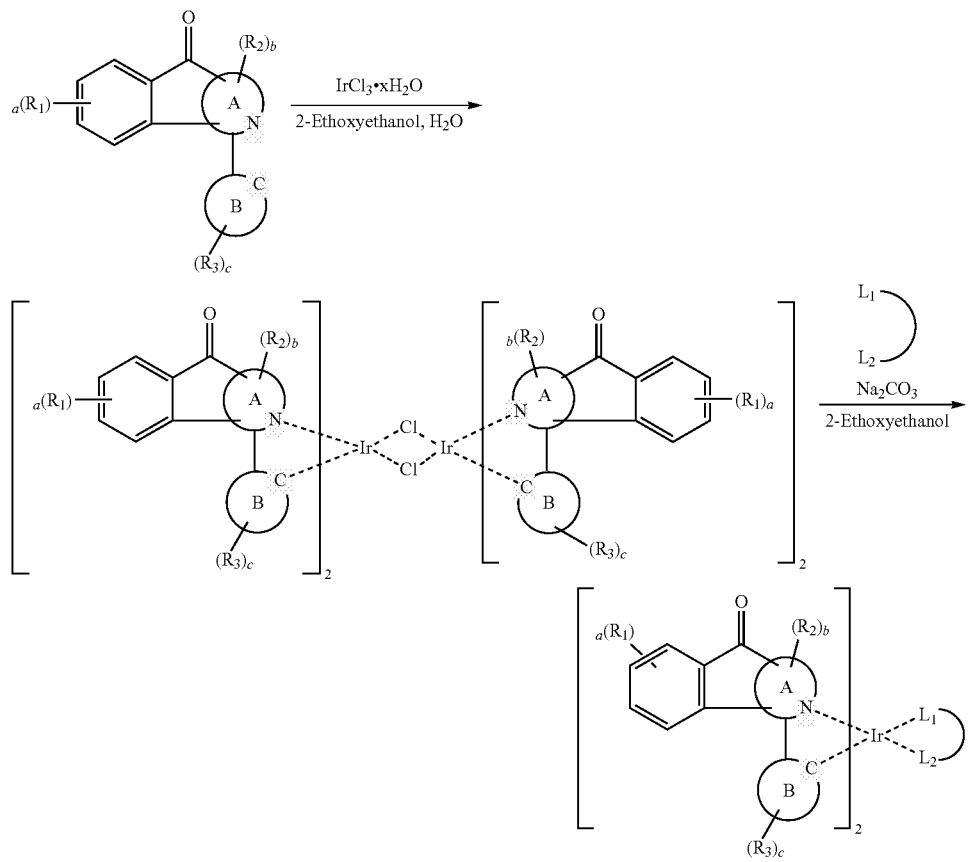

In reaction schemes 1 and 2, ring A, ring B, $R_1$ to $R_3$, and a to c are as defined in formula 1.

The compound having the structure represented by formula 1 may be included in at least one layer constituting the organic electroluminescent device, and may be included in the light-emitting layer, but not limited thereto. When used in the light-emitting layer, the compound may be included as a dopant material.

Also, the present disclosure provides an organic electroluminescent material comprising a compound having the structure represented by formula 1, and an organic electroluminescent device comprising the organic electroluminescent material.

The organic electroluminescent material of the present disclosure may include at least one compound having the structure represented by formula 1. The material may be a dopant material. The material may consist of the compound according to the present disclosure alone, or may further comprise conventional materials included in the organic electroluminescent material.

The organic electroluminescent device according to the present disclosure comprises a first electrode, a second electrode, and at least one organic layer between the first and second electrodes. The organic layer may comprise at least one compound having the structure represented by formula 1. One of the first and second electrodes may be an anode, and the other may be a cathode. The organic layer may comprise a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer.

Herein, the light-emitting layer is a layer from which light is emitted, and can be a single layer or a multi-layer in which two or more layers are stacked. According to one embodiment of the present disclosure, the doping concentration of the dopant compound with respect to the host compound in the light-emitting layer is less than 20 wt %. The light-emitting layer may include one or more hosts and one or more dopants. If necessary, the light-emitting layer may comprise a co-host material, i.e., a plurality of two or more host materials. The host used in the present disclosure may be a phosphorescent host compound or a fluorescent host compound, and these host compounds are not particularly limited.

In order to form each layer of the organic electroluminescent device of the present disclosure, dry film-forming methods such as vacuum evaporation, sputtering, plasma and ion plating methods, or wet film-forming methods such as ink jet printing, nozzle printing, slot coating, spin coating, dip coating, and flow coating methods can be used.

When using a solvent in a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

The present disclosure may provide a display system by using a compound including a ligand having the structure represented by formula 1. That is, it is possible to produce a display system or a lighting system by using the compound of the present disclosure. Specifically, it is possible to produce a display system, e.g., a display system for smartphones, tablets, notebooks, PCs, TVs, or cars, or a lighting system, e.g., an outdoor or indoor lighting system, by using the compound of the present disclosure.

Hereinafter, the preparation method of the compound of the present disclosure, and the properties thereof will be explained in detail with reference to the representative compounds of the present disclosure. However, the present disclosure is not limited to the following examples.

Example 1: Preparation of Compound D-147

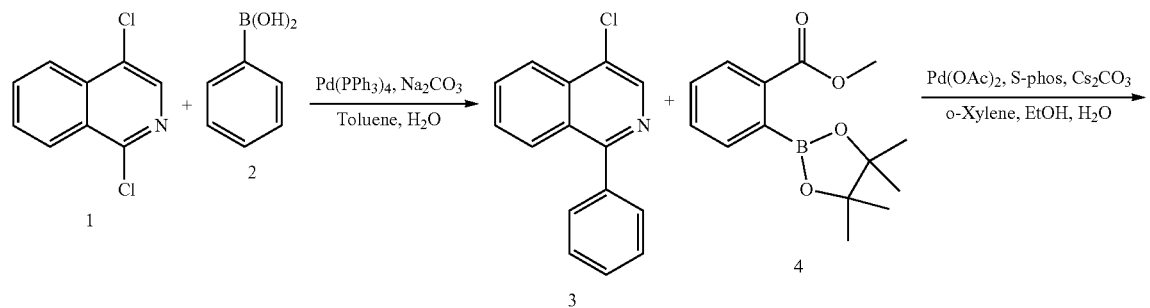

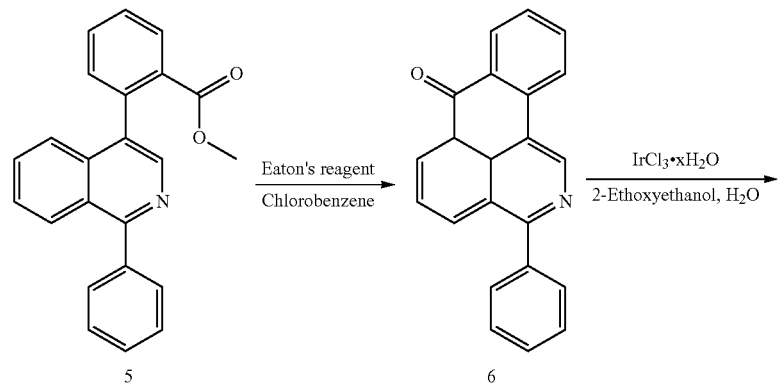

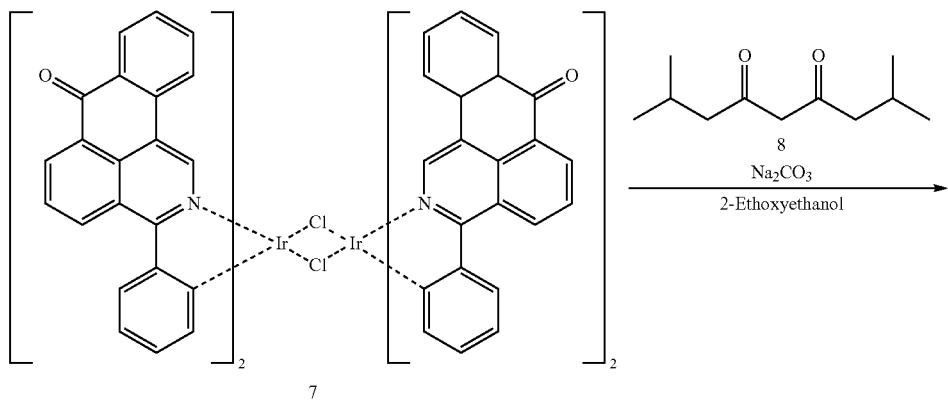

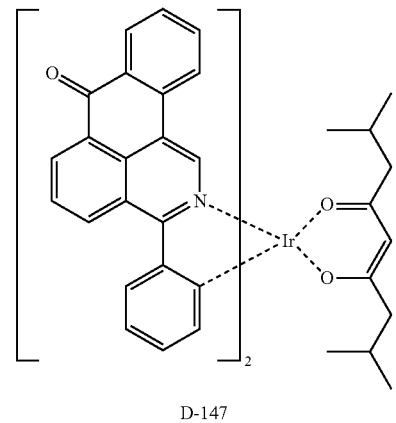

D-147

Synthesis of Compound 3

20 g of compound 1 (101 mmol), 12.31 g of compound 2 (101 mmol), 3.50 g of Pd(PPh$_3$)$_4$ (3.03 mmol), 32.11 g of Na$_2$CO$_3$ (303 mmol), 430 mL of toluene (0.24 M) and 151 mL of H$_2$O (2 M) were added to a 1 L round bottom flask (RBF), and the mixture was stirred under reflux at 120° C. After completion of the reaction, the reaction product was cooled to room temperature, and was extracted with ethyl acetate. The resulting mixture was separated by column chromatography to obtain 21.8 g of compound 3 (yield: 90%).

Synthesis of Compound 5

20.3 g of compound 3 (85 mmol), 27 g of compound 4 (102 mmol), 1.90 g of Pd(OAc)$_2$ (8.47 mmol), 82.78 g of Cs$_2$CO$_3$ (254 mmol), 6.95 g of S-phos (17 mmol), 440 mL of o-xylene (0.19 M), 220 mL of EtOH, and 127 mL of H$_2$O were added to a 1 L RBF, and the mixture was stirred under reflux at 130° C. After completion of the reaction, the reaction product was cooled to room temperature, and was extracted with ethyl acetate. The resulting mixture was separated by column chromatography to obtain 22.5 g of compound 5 (yield: 78%).

Synthesis of Compound 6

21.2 g of compound 5 (62.47 mmol), 56 mL of Eaton's reagent (25 wt %) and 223 mL of chlorobenzene (0.28 M) were added to a 1 L RBF, and the mixture was stirred under reflux at 160° C. for 12 hours. After completion of the reaction, the reaction product was cooled to room temperature. The reaction mixture was neutralized by being added to a saturated NaHCO$_3$ solution, and extracted with dichloromethane. The resulting mixture was separated by column chromatography to obtain 15.8 g of compound 6 (yield: 82%).

Synthesis of Compound 7

7.8 g of compound 6 (25.38 mmol), 3.45 g of IrCl$_3$.xH$_2$O (11.54 mmol), 90 mL of 2-ethoxyethanol (0.13 M) and 30 mL of H$_2$O were added to a 1 L RBF under nitrogen, and the mixture was stirred under reflux for 24 hours. After completion of the reaction, the reaction product was cooled to room temperature, and the solvent was removed as much as possible. Next, 100 mL of H$_2$O was added, and the mixture was stirred for 30 minutes. The reaction mixture was washed with MeOH and hexane, and dried to obtain 9.3 g of compound 7 (yield: 96%).

Synthesis of Compound D-147

9.0 g of compound 7 (5.35 mmol), 9.87 g of compound 8 (53.55 mmol), 11.35 g of Na$_2$CO$_3$ (107.10 mmol) and 89.2 mL of 2-ethoxyethanol (0.06 M) were added to a 250 mL RBF under nitrogen, and the mixture was stirred at room temperature for 3 days. After completion of the reaction, 330 mL of H$_2$O was added, and the mixture was stirred for 30 minutes, and then filtered. The resulting mixture was separated by column chromatography to obtain 4.0 g of compound D-147 (yield: 38%).

| Compound | MW (g/mol) | UV (nm) | PL (nm) | M.P. (° C.) |
|---|---|---|---|---|
| D-147 | 992.21 | 242 | 777 | 348 |

Example 2: Preparation of Compound D-212

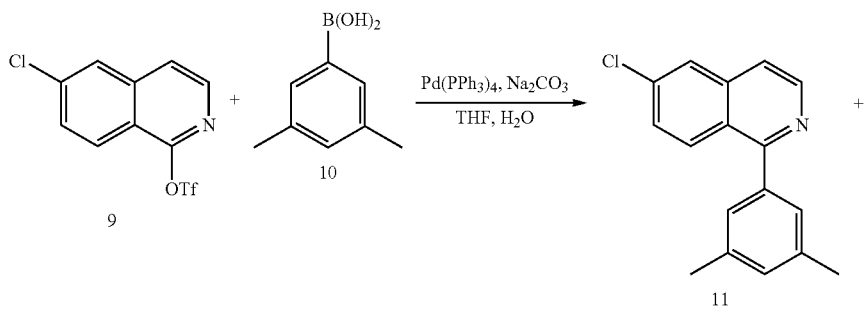

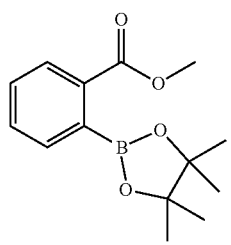
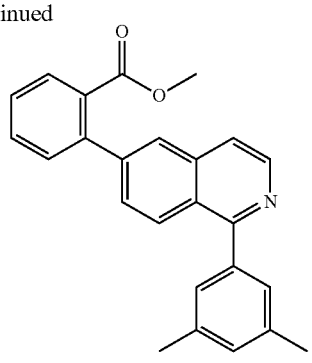
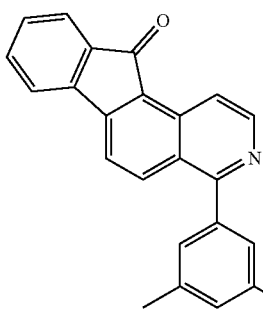
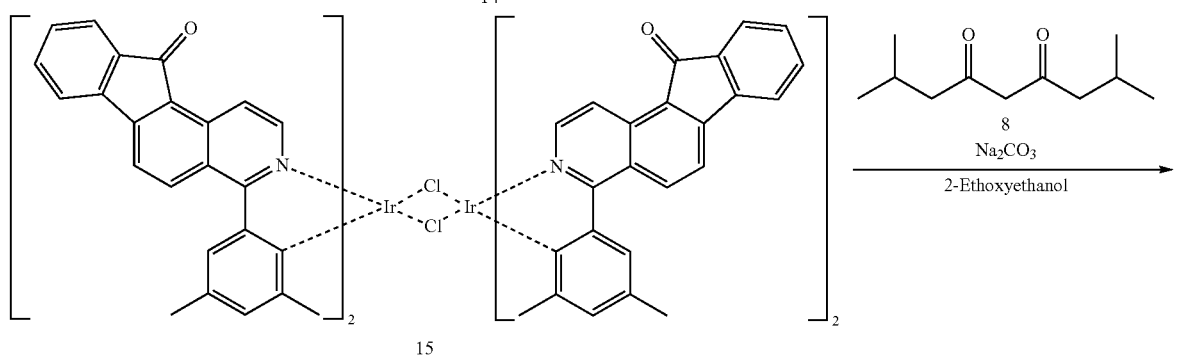
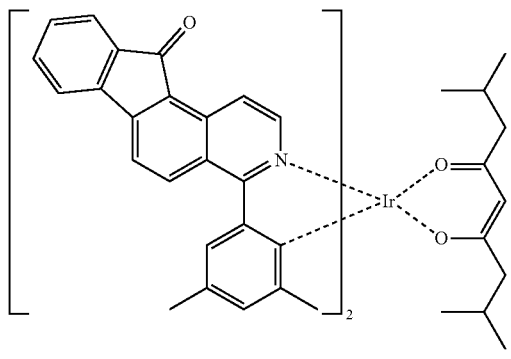

Synthesis of Compound 11

48 g of compound 9 (154 mmol), 17.77 g of compound 10 (118 mmol), 4.1 g of Pd(PPh$_3$)$_4$ (3.55 mmol), 29.96 g of Na$_2$CO$_3$ (355 mmol), 590 mL of THF (0.2 M) and 178 mL of H$_2$O (2 M) were added to a 3 L RBF, and the mixture was stirred under reflux at 110° C. After completion of the reaction, the reaction product was cooled to room temperature and was extracted with ethyl acetate. The resulting mixture was separated by column chromatography to obtain 26.4 g of compound 11 (yield: 83%).

Synthesis of Compound 13

10 g of compound 11 (42 mmol), 13.14 g of compound 12 (50 mmol), 937 mg of Pd(OAc)$_2$ (4.2 mmol), 40.78 g of Cs$_2$CO$_3$ (125 mmol), 3.43 g of S-Phos (8.3 mmol), 210 mL of o-xylene (0.2 M), 105 mL of EtOH and 63 mL of H$_2$O were added to a 1 L RBF, and the mixture was stirred under reflux at 130° C. After completion of the reaction, the reaction product was cooled to room temperature, and was extracted with ethyl acetate. The resulting mixture was separated by column chromatography to obtain 12 g of compound 13 (yield: 85%).

Synthesis of Compound 14

12 g of compound 13 (35 mmol), 32 mL of Eaton's reagent (25 wt %) and 126 mL of chlorobenzene (0.28 M) were added to a 0.5 L RBF, and the mixture was stirred under reflux at 160° C. for 12 hours. After completion of the reaction, the reaction product was cooled to room temperature. The reaction mixture was neutralized by being added to a saturated $NaHCO_3$ solution, and extracted with dichloromethane. The resulting mixture was separated by column chromatography to obtain 8 g of compound 14 (yield: 67%).

Synthesis of Compound 15

4 g of compound 14 (12 mmol), 1.62 g of $IrCl_3.xH_2O$ (5.42 mmol), 42 mL of 2-ethoxyethanol (0.13 M) and 14 mL of $H_2O$ were added to a 250 mL RBF under nitrogen, and the mixture was stirred under reflux for 24 hours. After completion of the reaction, the reaction product was cooled to room temperature and the solvent was removed as much as possible. Next, 100 mL of $H_2O$ was added and the mixture was stirred for 30 minutes. The reaction mixture was washed with MeOH and hexane, and dried to obtain 5.0 g of compound 15 (yield: 96%).

Synthesis of Compound D-212

5.0 g of compound 15 (2.79 mmol), 5.14 g of compound 8 (27.89 mmol), 5.91 g of $Na_2CO_3$ (56 mmol) and 47 mL of 2-ethoxyethanol (0.06 M) were added to a 250 mL RBF under nitrogen, and the mixture was stirred at room temperature for 3 days. After completion of the reaction, 330 mL of $H_2O$ was added, the mixture was stirred for 30 minutes, and then filtered. The resulting mixture was separated by column chromatography to obtain 1.0 g of compound D-212 (yield: 17%).

Hereinafter, the luminous properties of an OLED comprising the compound of the present disclosure will be explained. However, the following examples merely illustrate the properties of an OLED according to the present disclosure in detail, but the present disclosure is not limited to the following examples.

Device Example 1: Producing an OLED According to the Present

DISCLOSURE

An OLED according to the present disclosure was produced as follows: A transparent electrode indium tin oxide (ITO) thin film (10 Ω/sq) on a glass substrate for an OLED (GEOMATEC CO., LTD., Japan) was subjected to an ultrasonic washing with acetone and isopropanol, sequentially, and then was stored in isopropanol. The ITO substrate was mounted on a substrate holder of a vacuum vapor deposition apparatus. Compound HI-1 was introduced into a cell of the vacuum vapor deposition apparatus, and the pressure in the chamber of the apparatus was then controlled to $10^{-7}$ torr. Thereafter, an electric current was applied to the cell to evaporate the above-introduced material, thereby forming a first hole injection layer having a thickness of 60 nm on the ITO substrate. Next, compound HI-2 was introduced into another cell of the vacuum vapor deposition apparatus and was evaporated by applying an electric current to the cell, thereby forming a second hole injection layer having a thickness of 5 nm on the first hole injection layer. Compound HT was then introduced into another cell of the vacuum vapor deposition apparatus and was evaporated by applying an electric current to the cell, thereby forming a hole transport layer having a thickness of 25 nm on the second hole injection layer. After forming the hole injection layers and the hole transport layer, a light-emitting layer was formed thereon as follows: Compound H-1 was introduced into one cell of the vacuum vapor depositing apparatus as a host, and compound D-147 was introduced into another cell as a dopant. The dopant was deposited in a doping amount of 6 wt % based on the total amount of the host and dopant to form a light-emitting layer having a thickness of 40 nm on the hole transport layer. Next, compound ETL and compound EIL were evaporated at a weight ratio of 50:50 to deposit an electron transport layer having a thickness of 35 nm on the light-emitting layer. After depositing compound EIL as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at $10^{-6}$ torr.

Device Example 2: Producing an OLED According to the Present Disclosure

An OLED was produced in the same manner as in Device Example 1, except that compound D-212 was used as a dopant instead of compound D-147.

Comparative Examples 1 and 2: Producing an OLED not According to the Present Disclosure OLEDs were produced in the same manner as in Device Example 1, except that compound C-1 or compound C-2 was used as a dopant instead of compound D-147.

The electroluminescent (EL) characteristics of the OLED produced in Device Examples 1 and 2 and Comparative Examples 1 and 2 based on a current density of 100 mA/cm² were measured by using KEITHLEY 2400 SourceMeter and PR655, which are shown in FIG. 1. The compounds used in the Device Examples and the Comparative Examples are as follows.

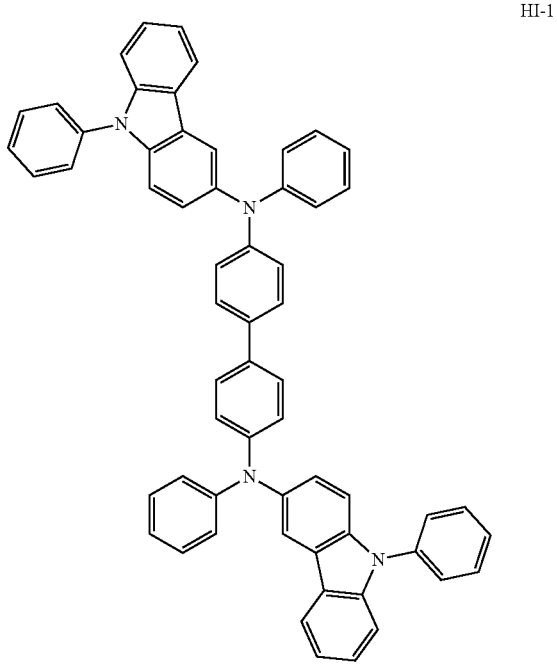

HI-1

HI-2
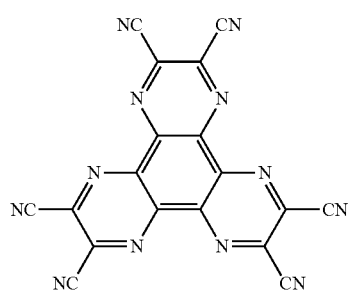
D-147
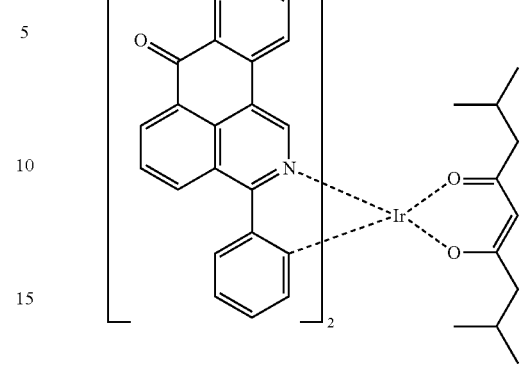
HT
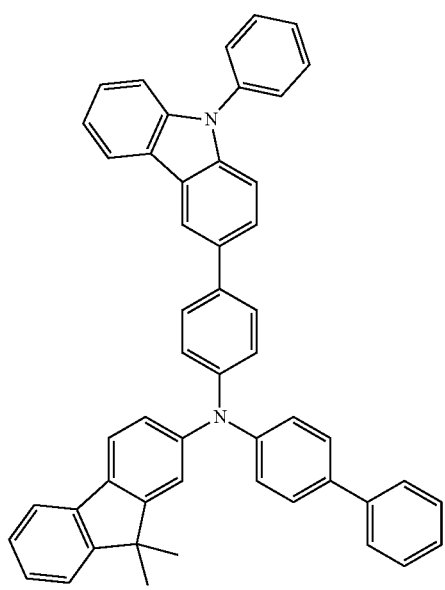
D-212
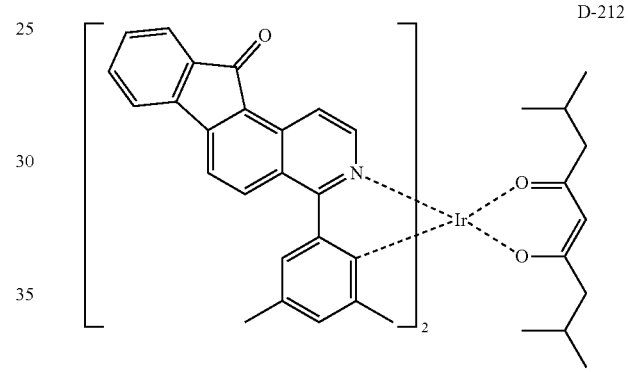
C-1
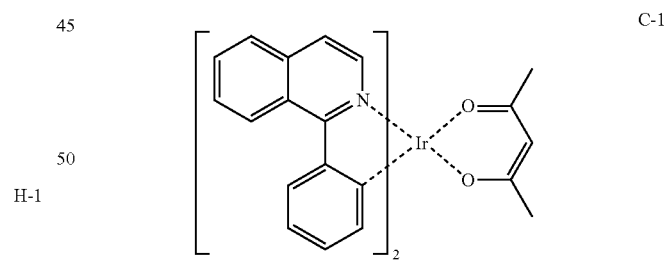
H-1
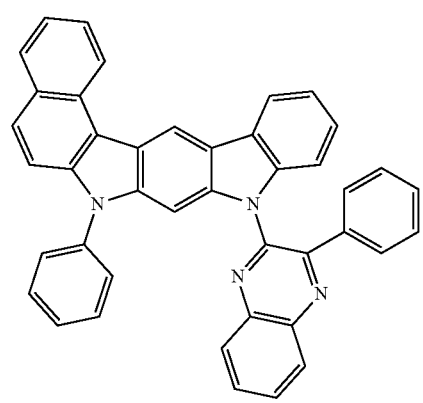
C-2

-continued

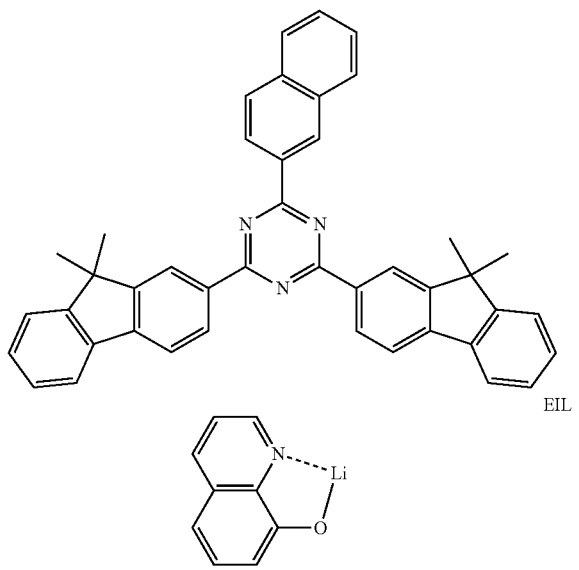

ETL

EIL

The invention claimed is:

1. A compound comprising a ligand having the structure represented by the following formula 1, wherein the ligand is coordinated to a metal having an atomic number greater than 40:

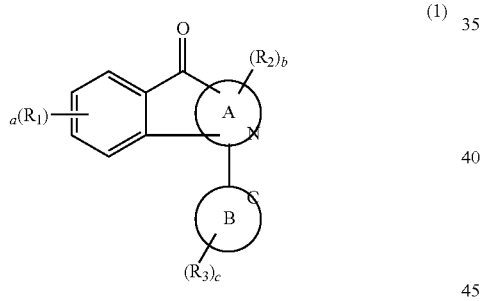

(1)

wherein
ring A represents an N-containing 10-membered heteroaryl ring which may be substituted with $R_2$;
ring B represents a (C6-C18)aryl ring which may be substituted with $R_3$;
$R_1$ to $R_3$, each independently, represent deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl, or each of $R_1$ to $R_3$ may be linked to each other to form a ring; and
a to c, each independently, represent an integer of 0 to 4, where if a to c, each independently, are an integer of 2 or more, each of $R_1$ to $R_3$ may be the same or different.

2. The compound according to claim 1, wherein the metal is any one selected from iridium, rhenium, osmium, and platinum.

3. The compound according to claim 1, wherein the compound is represented by the following formula 2:

(2)

wherein
m represents 1 or 2; ring A, ring B, $R_1$ to $R_3$, and a to c are as defined in claim 1;

$L_1\atop L_2$⟩ represents any one of the following formulas 2-a to 2-c:

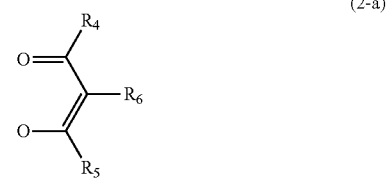

(2-a)

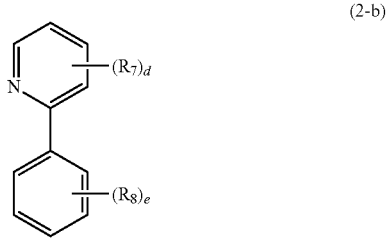

(2-b)

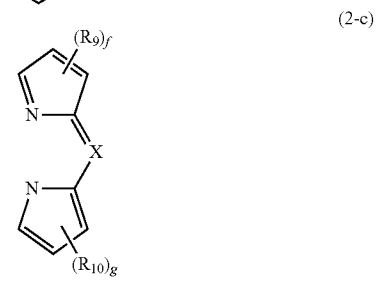

(2-c)

wherein
$R_4$ to $R_6$, each independently, represent hydrogen, deuterium, a substituted or unsubstituted (C1-C30)alkyl, a substituted or unsubstituted (C1-C30)alkoxy, an amino, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, or a substituted or unsubstituted (3- to 30-membered)heteroaryl;
$R_7$ and $R_8$, each independently, represent deuterium, a substituted or unsubstituted (C1-C30)alkyl, a substituted or unsubstituted (C1-C30)alkoxy, an amino, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, or a substituted or unsubstituted (3- to 30-membered)heteroaryl;

$R_9$ and $R_{10}$, each independently, represent deuterium, a substituted or unsubstituted (C1-C30)alkyl, a substituted or unsubstituted (C2-C30)alkenyl, or a substituted or unsubstituted (C6-C30)aryl, or each $R_9$ and each $R_{10}$ may be linked to each other to form a ring;

X represents N or $CR_{11}$;

$R_{11}$ represents hydrogen, deuterium, a substituted or unsubstituted (C6-C30)aryl, or a substituted or unsubstituted (C1-C30)alkyl;

d and e, each independently, represent an integer of 0 to 4, and f and g, each independently, represent an integer of 0 to 3, where if d to g, each independently, are an integer of 2 or more, each of $R_7$ to $R_{10}$ may be the same or different.

4. The compound according to claim 3, wherein the formula 2 is represented by any one of the following formulas 3 to 10:

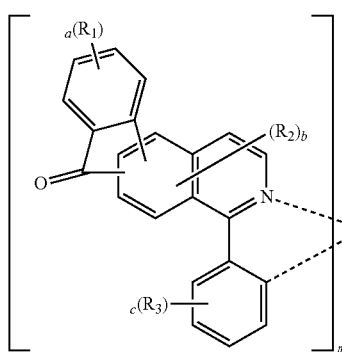

(3)

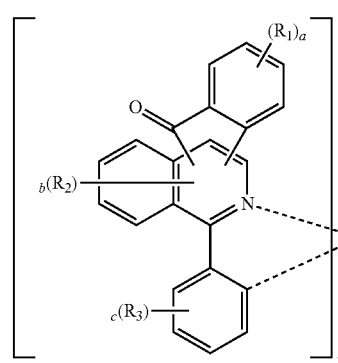

(4)

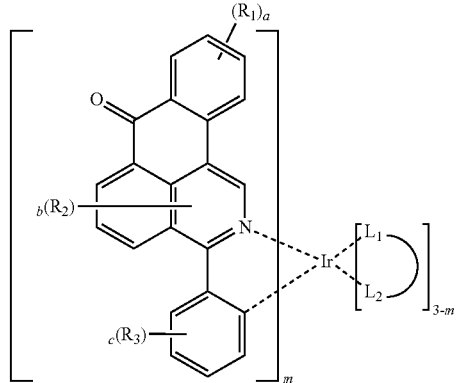

(5)

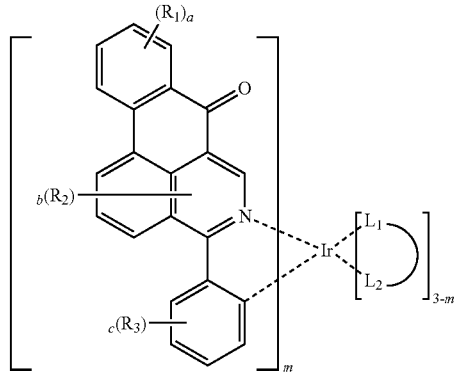

(6)

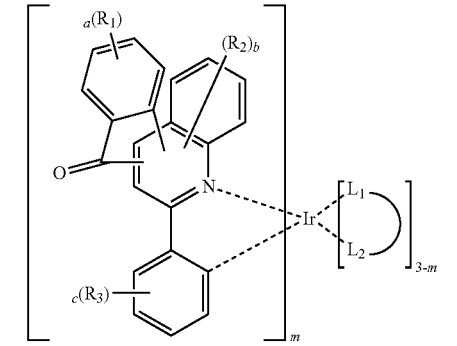

(7)

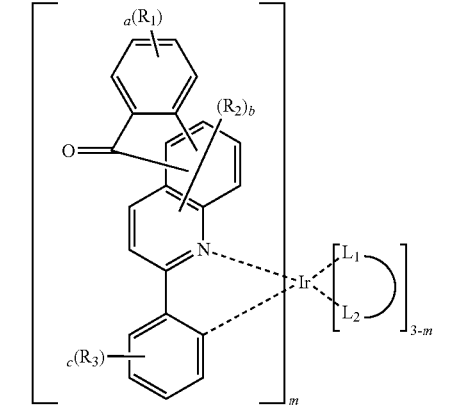

(8)

-continued (9)

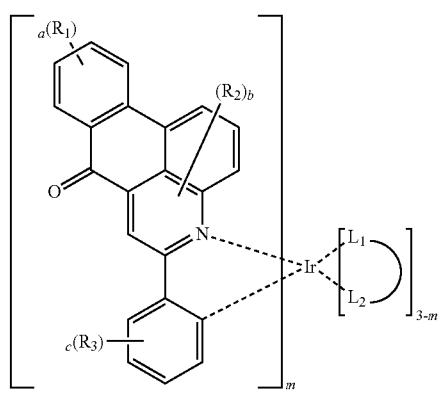

(10)

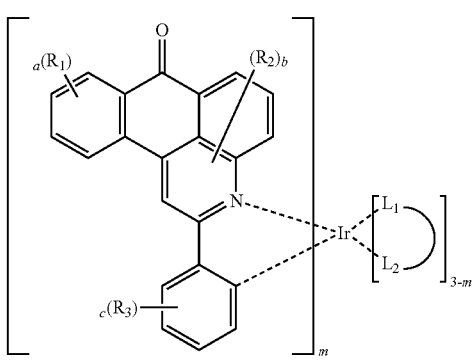

wherein, $R_1$ to $R_3$, a to c, m and

each independently, are as defined in claim 3.

5. The compound according to claim 1, wherein the substituents of the substituted alkyl, the substituted cycloalkyl, the substituted aryl, or the substituted heteroaryl in $R_1$ to $R_3$, each independently, are at least one selected from the group consisting of deuterium, a halogen, a cyano, a carboxyl, a nitro, a hydroxyl, a (C1-C30)alkyl, a halo(C1-C30)alkyl, a (C2-C30)alkenyl, a (C2-C30)alkynyl, a (C1-C30)alkoxy, a (C1-C30)alkylthio, a (C3-C30)cycloalkyl, a (C3-C30)cycloalkenyl, a (3-to 7-membered)heterocycloalkyl, a (C6-C30)aryloxy, a (C6-C30)arylthio, a (5- to 30-membered)heteroaryl, a (C6-C30)aryl, a tri(C1-C30)alkylsilyl, a tri(C6-C30)arylsilyl, a di(C1-C30)alkyl(C6-C30)arylsilyl, a (C1-C30)alkyldi(C6-C30)arylsilyl, an amino, a mono- or di-(C1-C30)alkylamino, a mono- or di-(C6-C30)arylamino, a (C1-C30)alkyl(C6-C30)arylamino, a (C1-C30)alkylcarbonyl, a (C1-C30)alkoxycarbonyl, a (C6-C30)arylcarbonyl, a di(C6-C30)arylboronyl, a di(C1-C30)alkylboronyl, a (C1-C30)alkyl(C6-C30)arylboronyl, a (C6-C30)aryl(C1-C30)alkyl, and a (C1-C30)alkyl(C6-C30)aryl.

6. The compound according to claim 1, wherein the compound is selected from the group consisting of the following compounds:

D-1

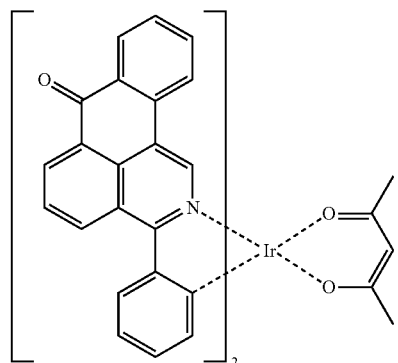

D-2

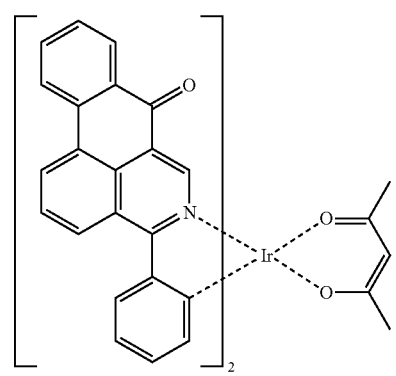

D-3

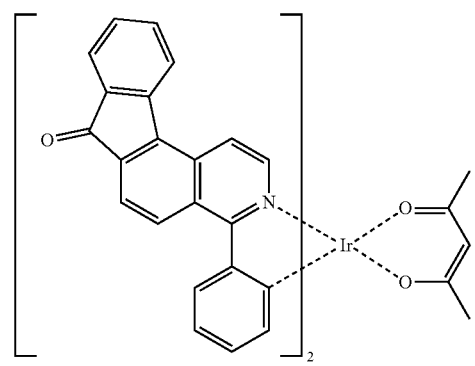

D-4

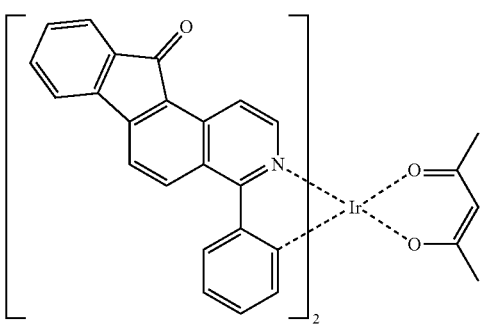

D-5
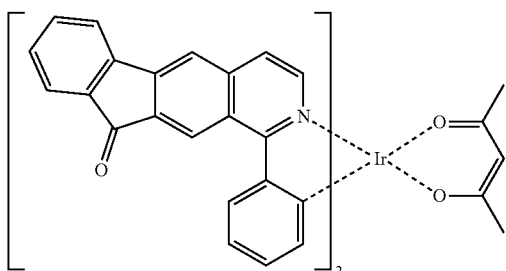
D-6
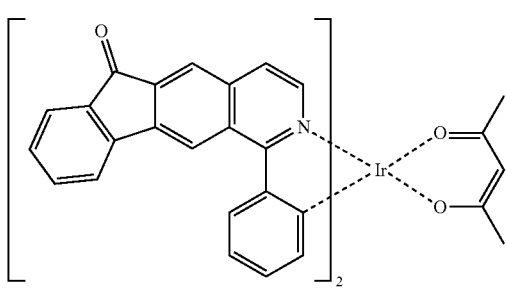
D-7
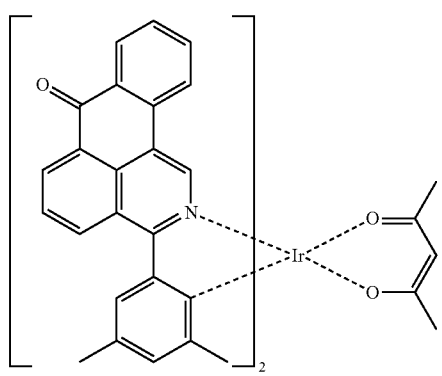
D-8
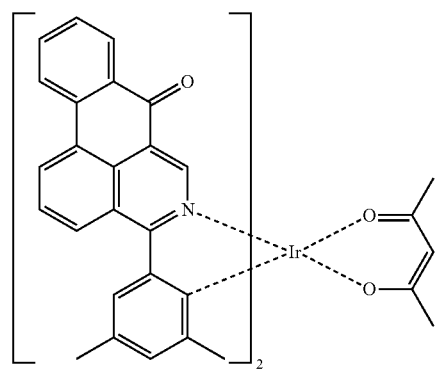
D-9
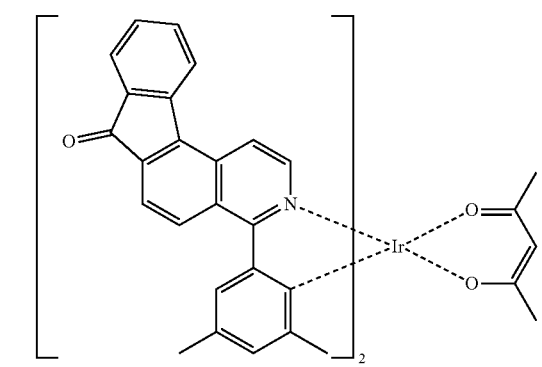
D-10
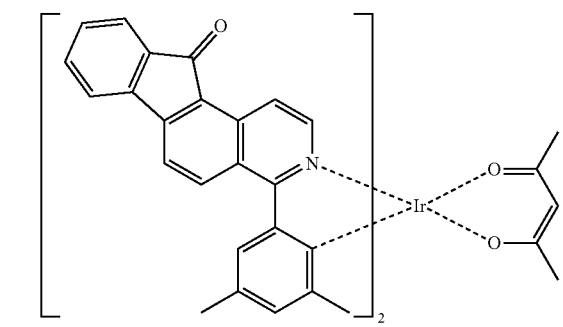
D-11
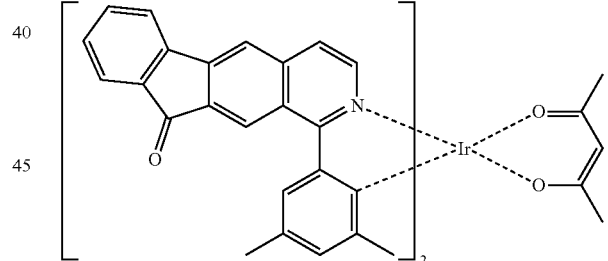
D-12
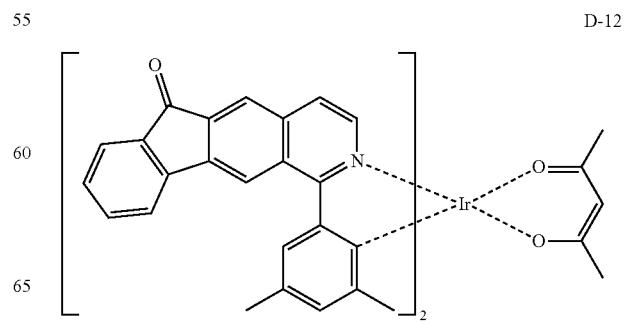

-continued
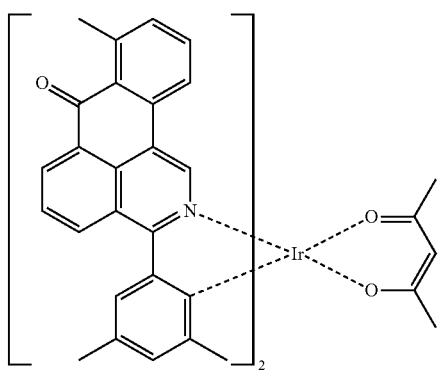
D-13
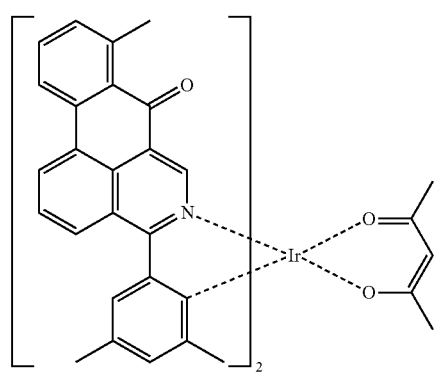
D-14
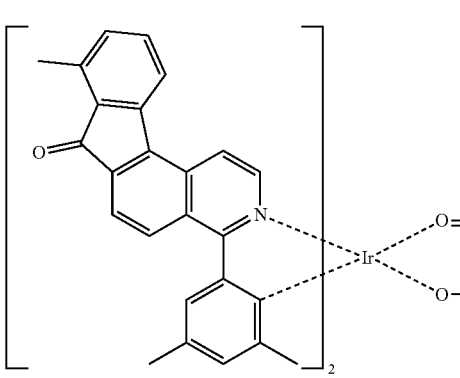
D-15
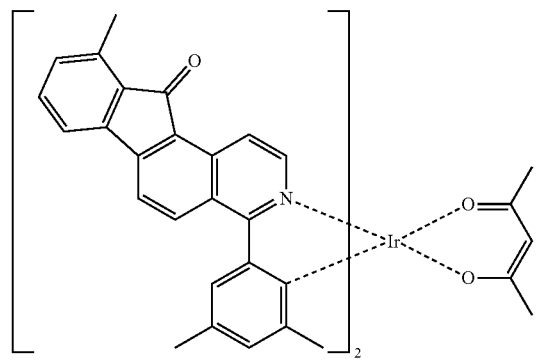
D-16
-continued
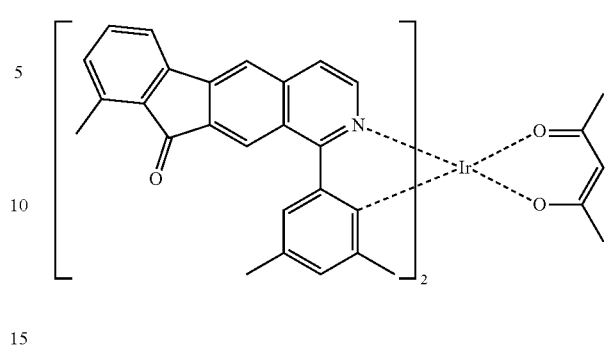
D-17
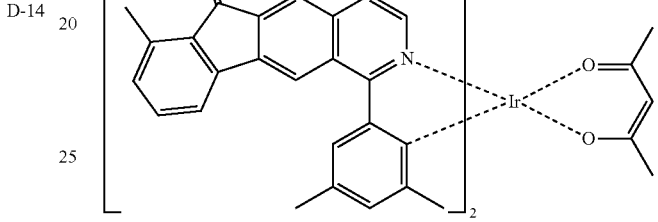
D-18
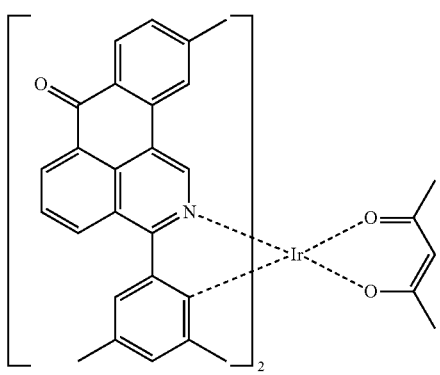
D-19
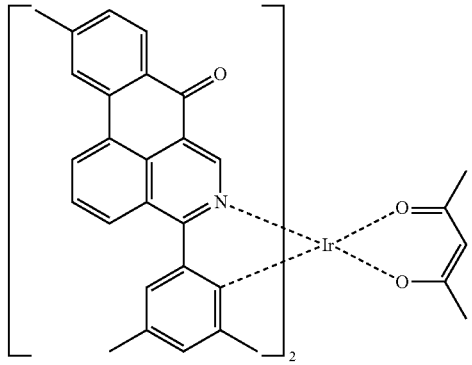
D-20

D-21 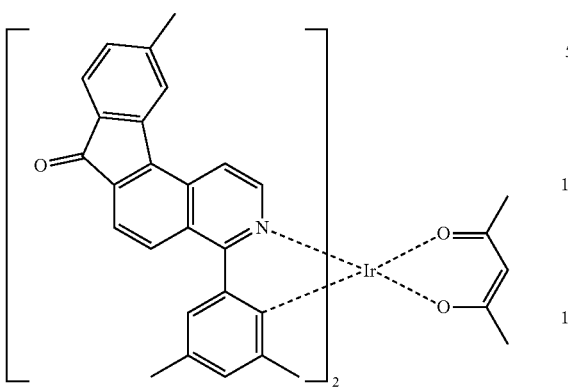
D-25 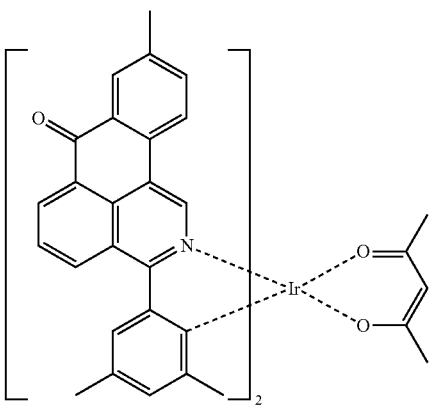
D-22 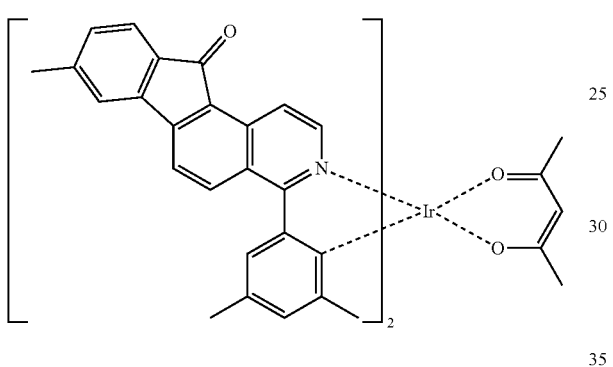
D-26 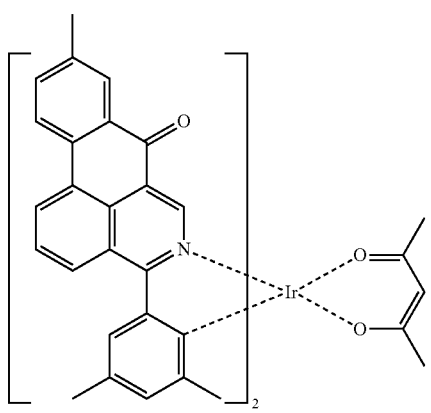
D-23 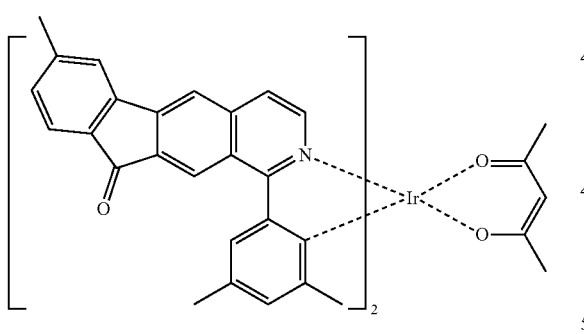
D-27 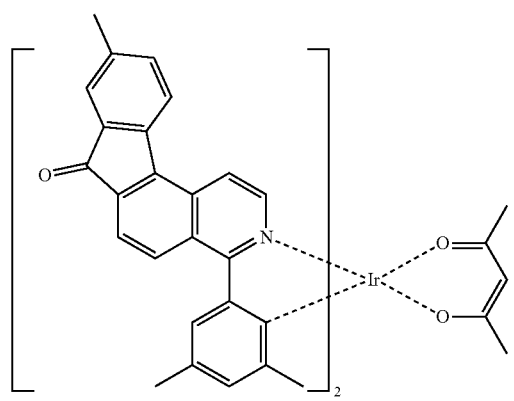
D-24 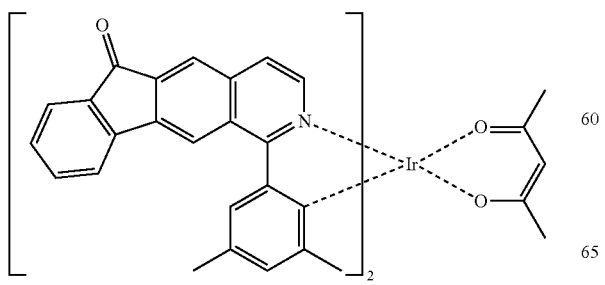
D-28 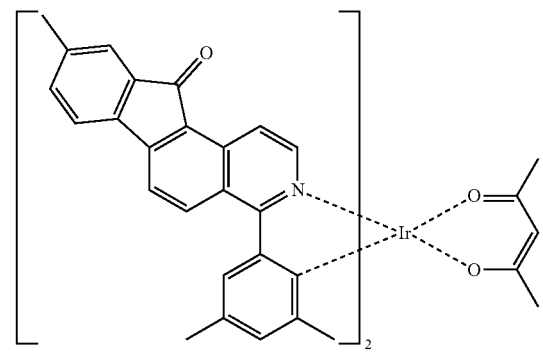

-continued
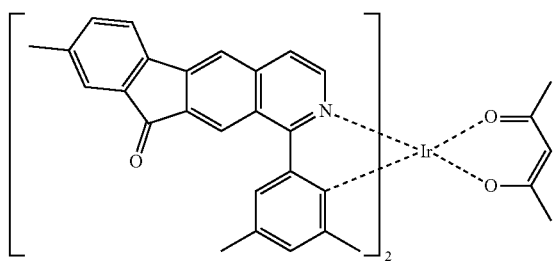
D-29
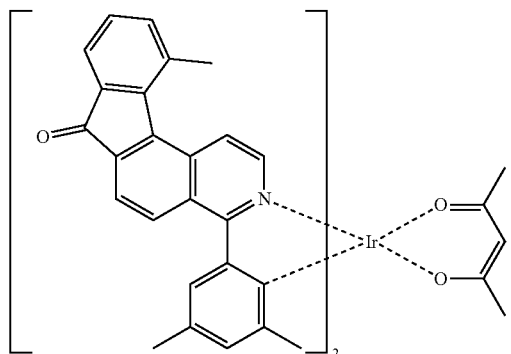
D-33
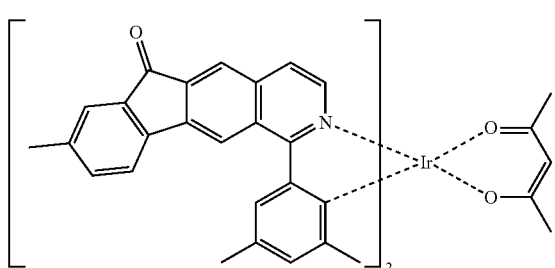
D-30
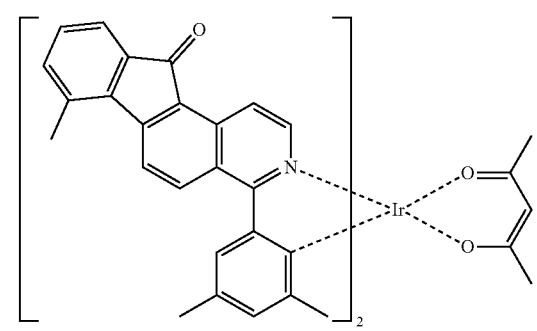
D-34
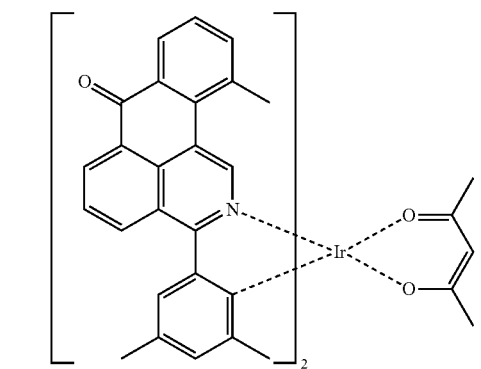
D-31
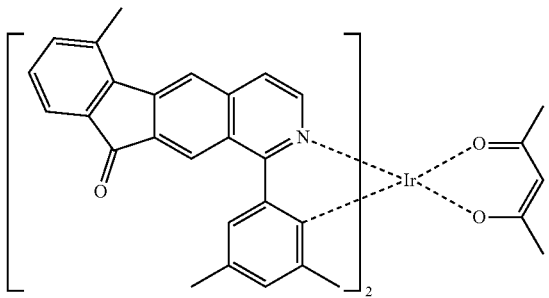
D-35
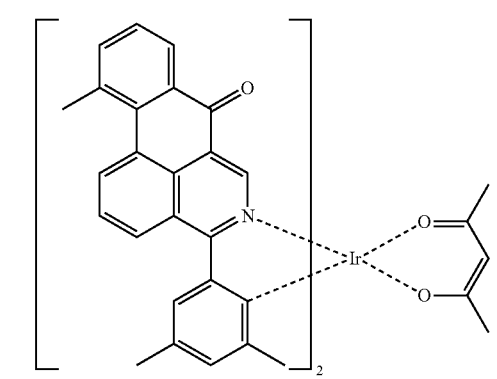
D-32
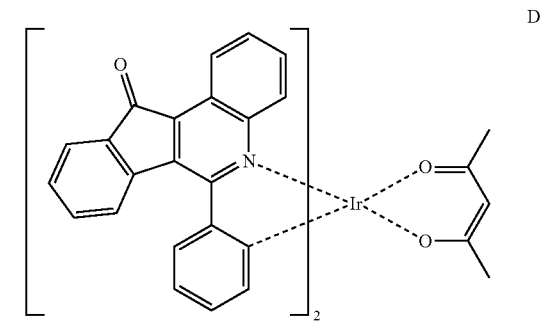
D-36
D-37

-continued
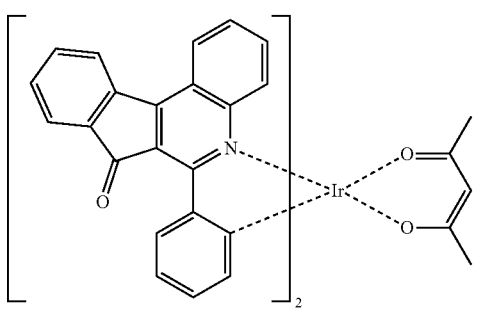
D-38
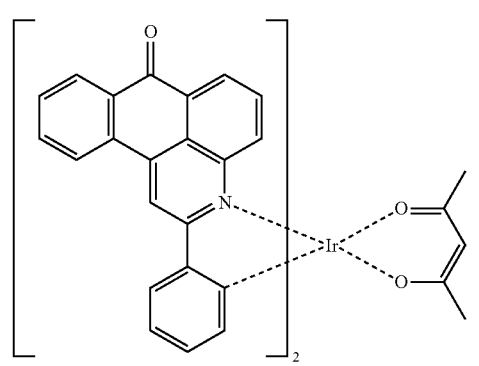
D-39
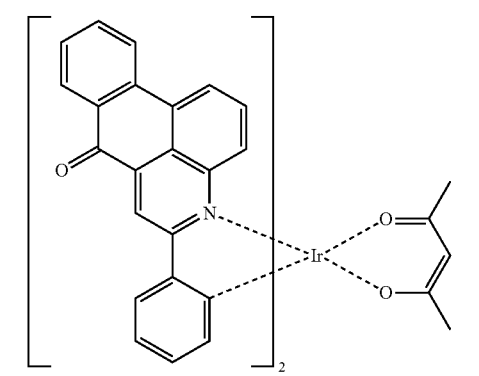
D-40
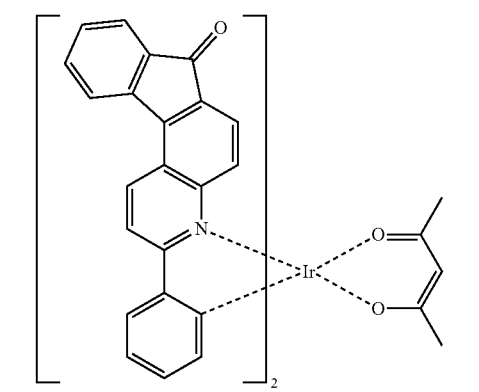
D-41
-continued
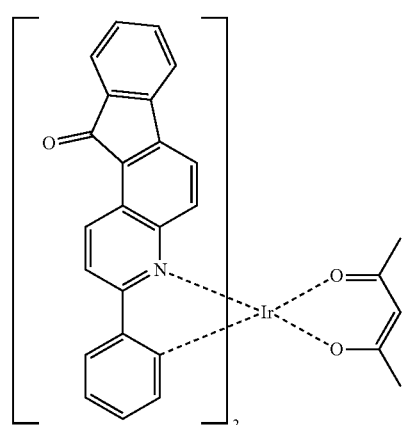
D-42
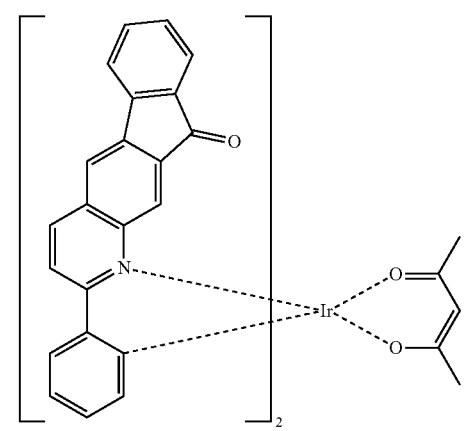
D-43
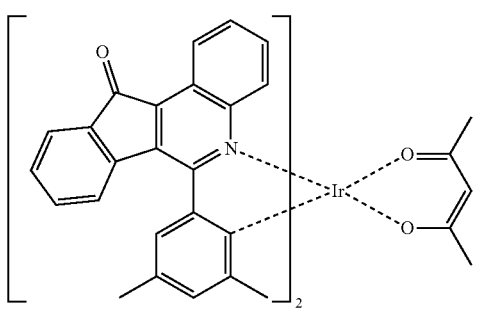
D-44
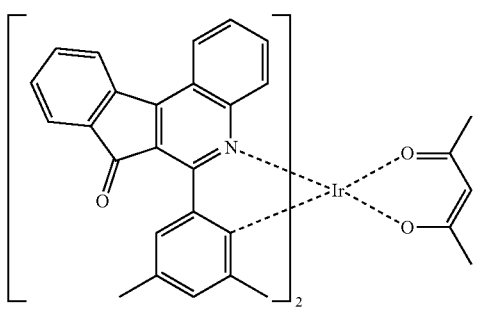
D-45

D-46
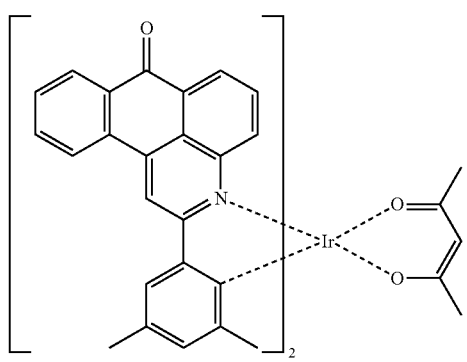
D-50
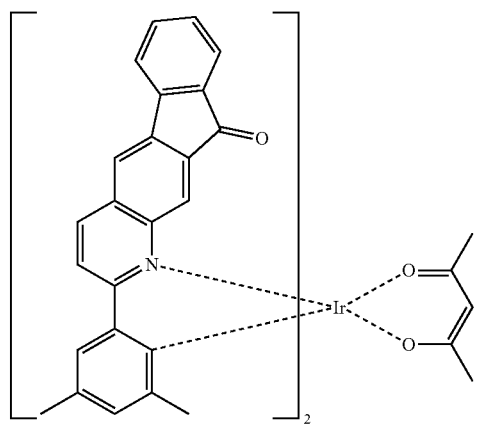
D-47
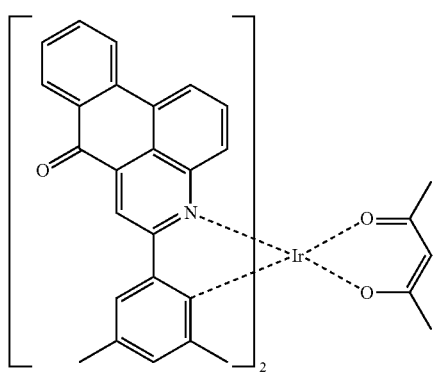
D-51
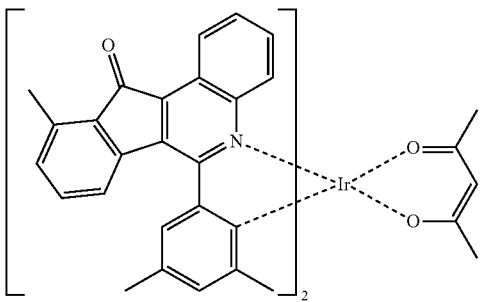
D-48
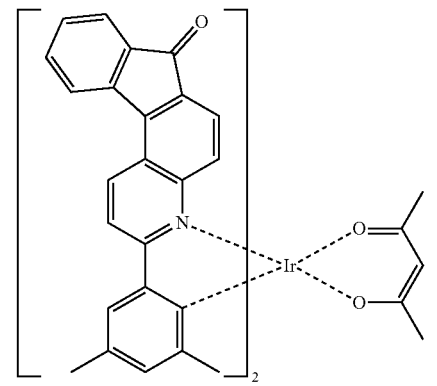
D-52
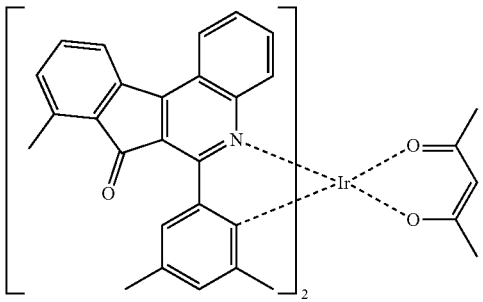
D-49
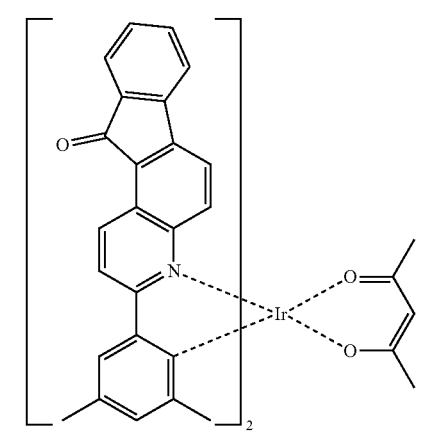
D-53
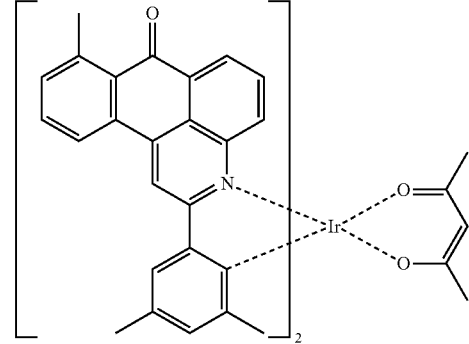

D-54
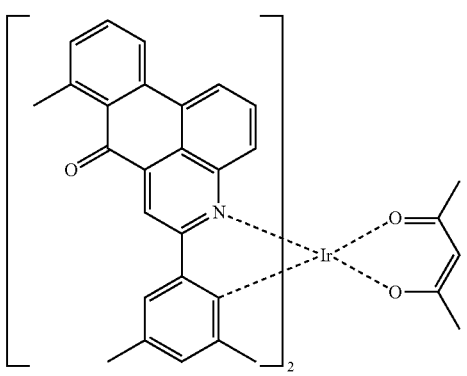
D-55
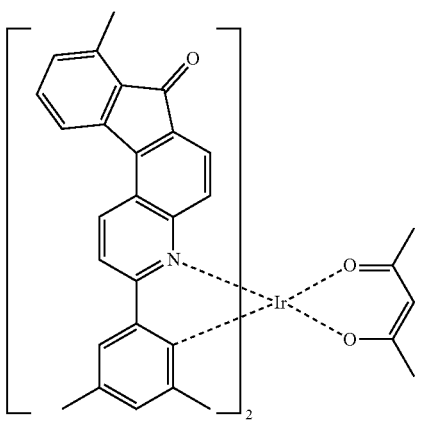
D-56
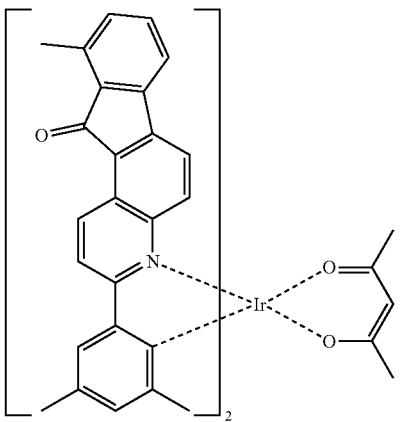
D-57
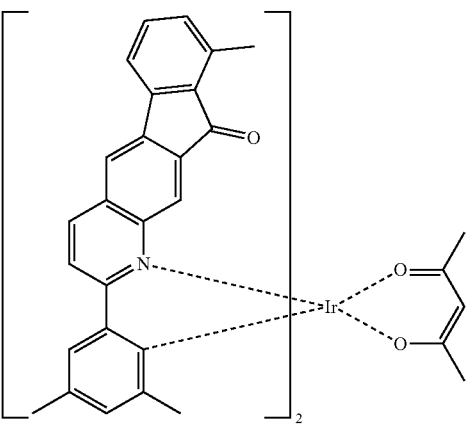
D-58
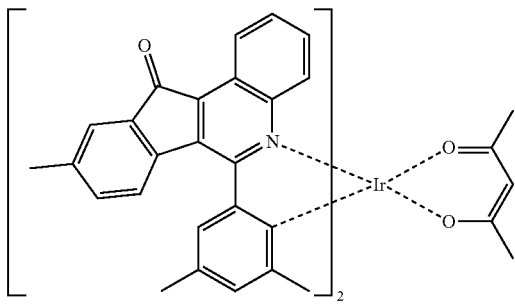
D-59
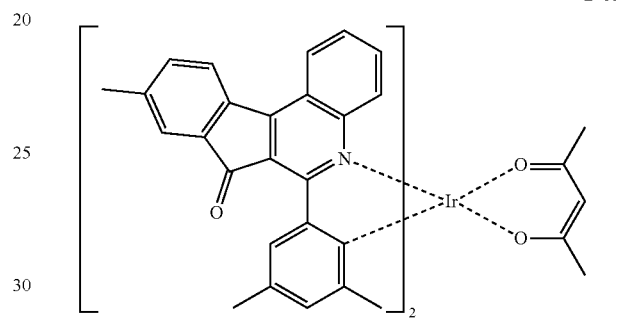
D-60
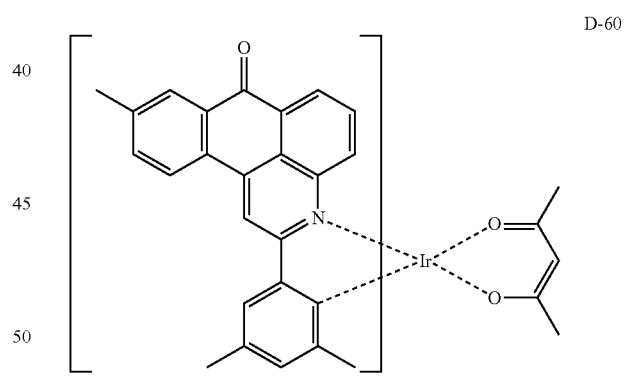
D-61
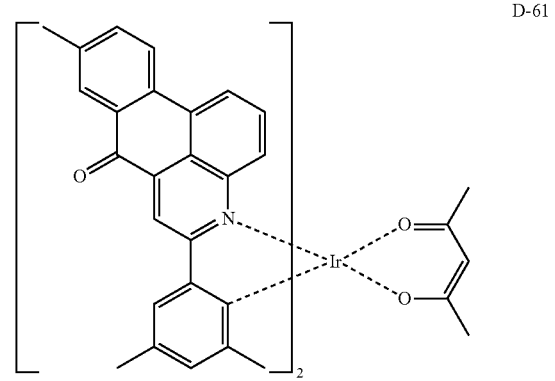

-continued
D-62
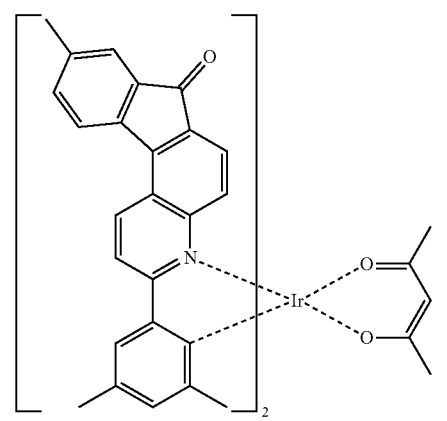
D-63
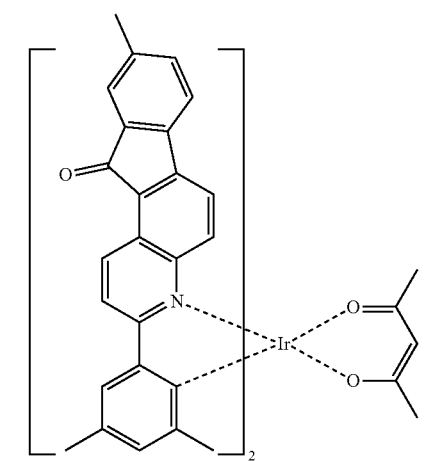
D-64
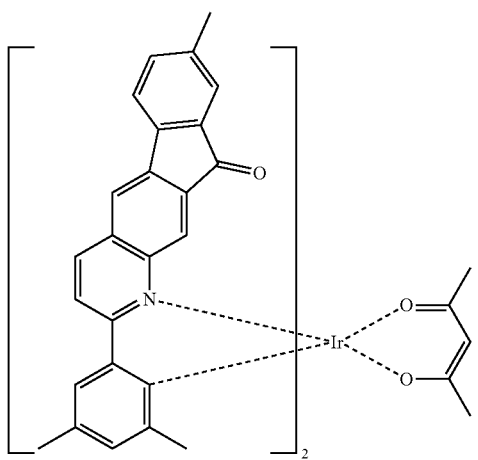
D-65
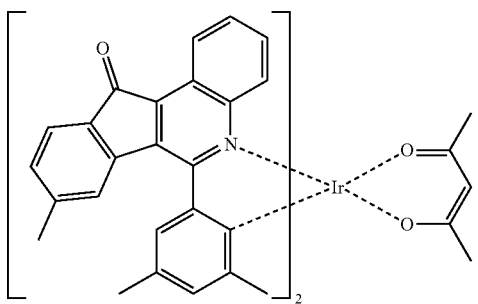
-continued
D-66
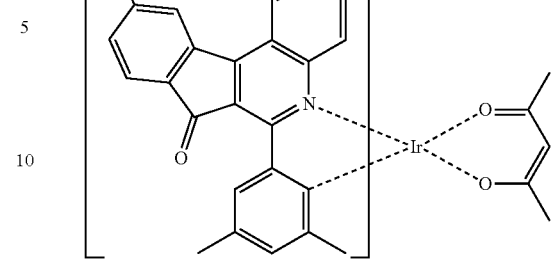
D-67
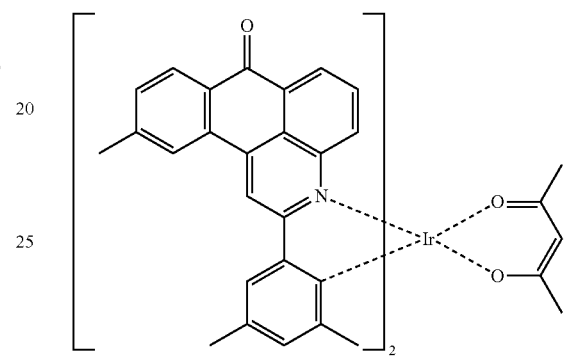
D-68
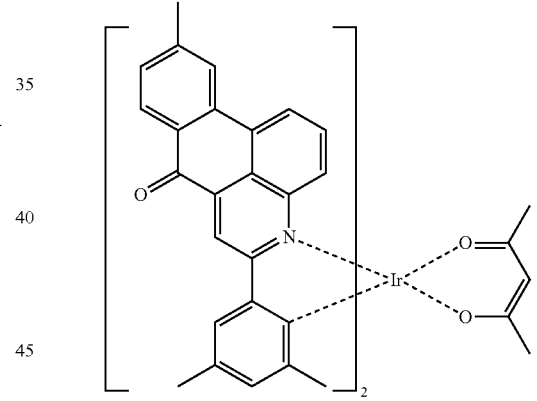
D-69
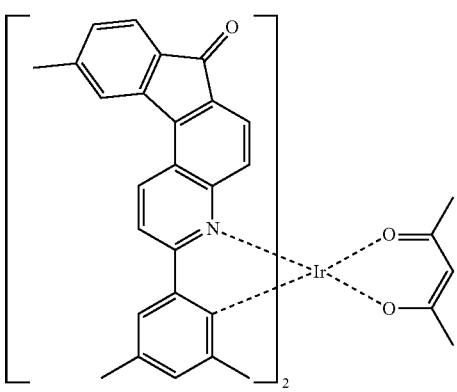

-continued
D-70
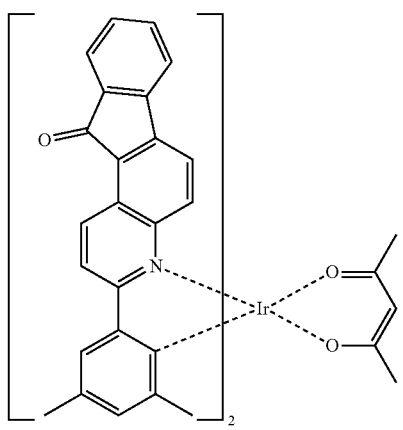
D-71
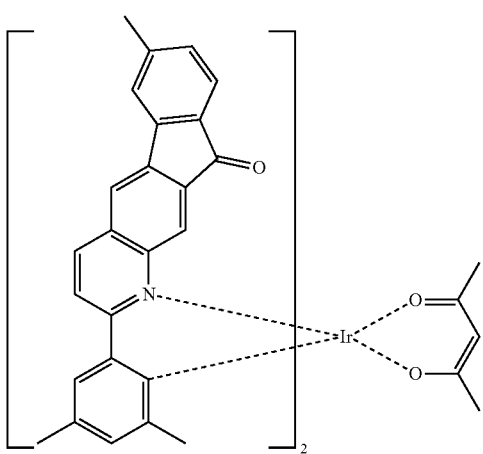
D-72
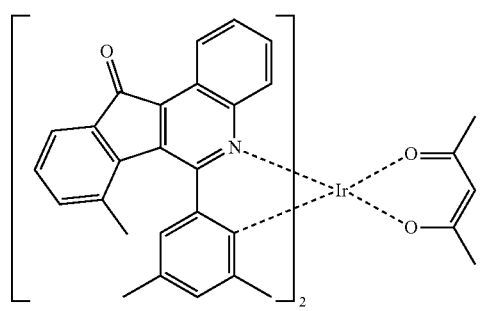
D-73
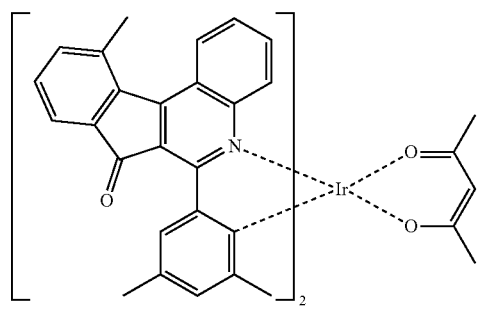
-continued
D-74
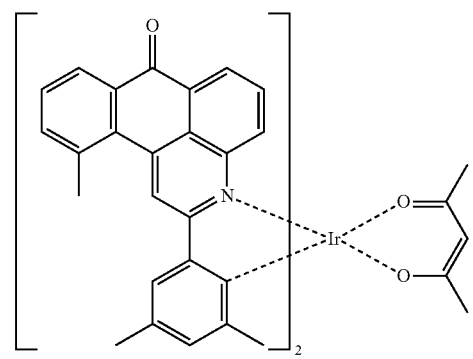
D-75
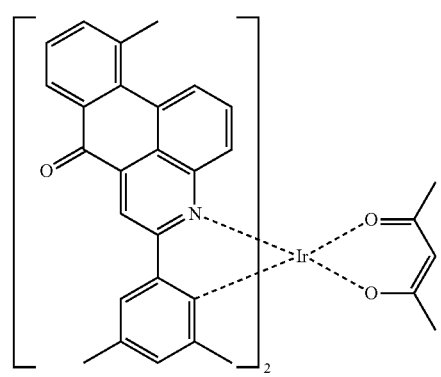
D-76
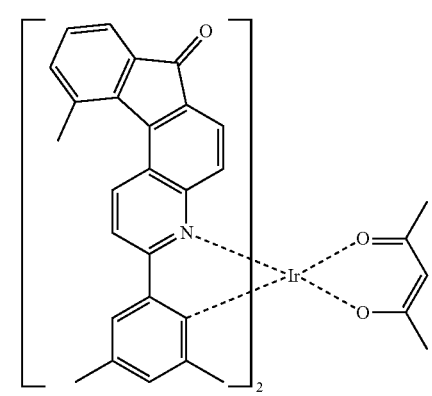
D-77
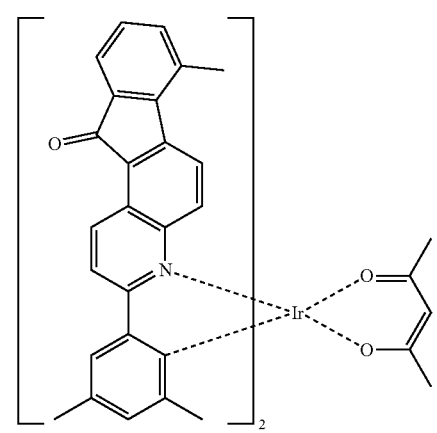

-continued
D-78
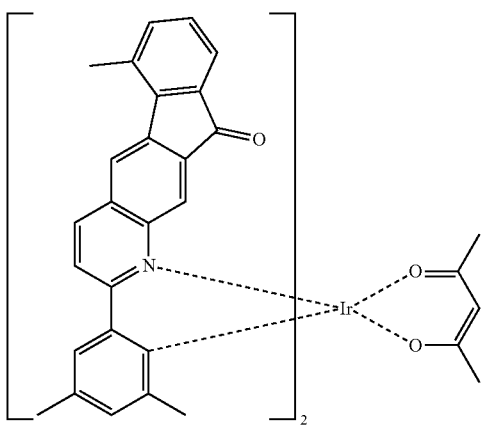
D-79
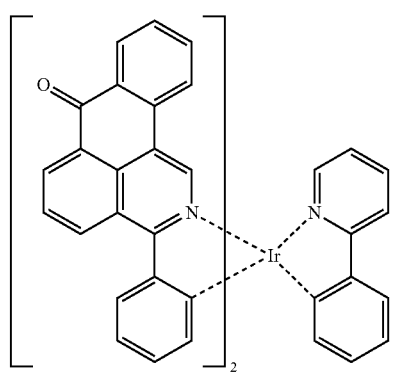
D-80
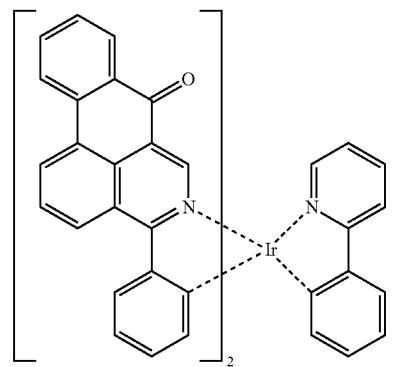
D-81
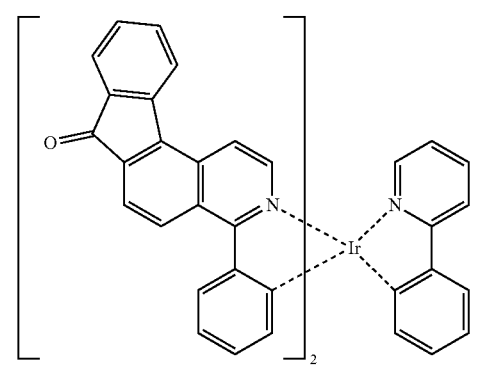
-continued
D-82
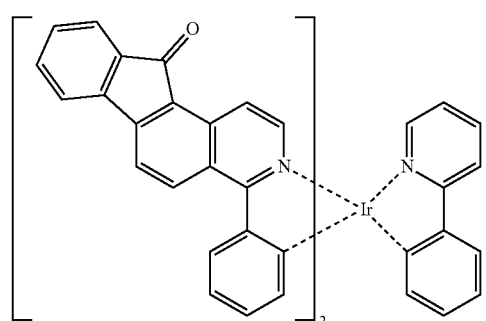
D-83
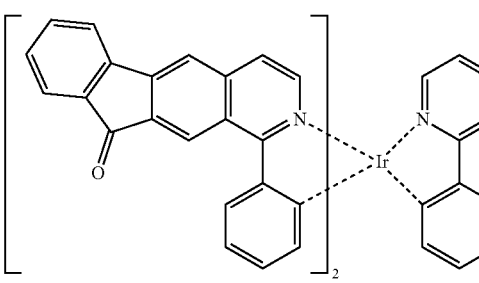
D-84
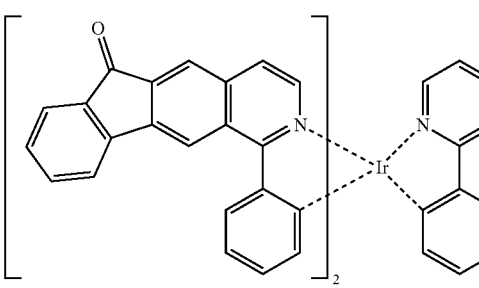
D-85
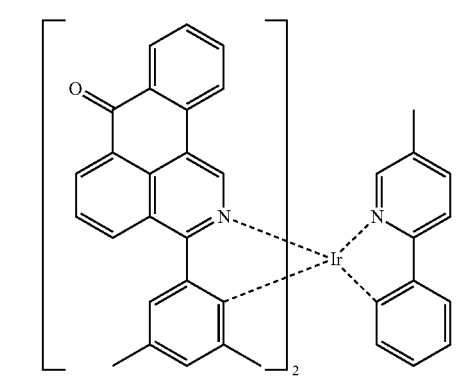
D-86
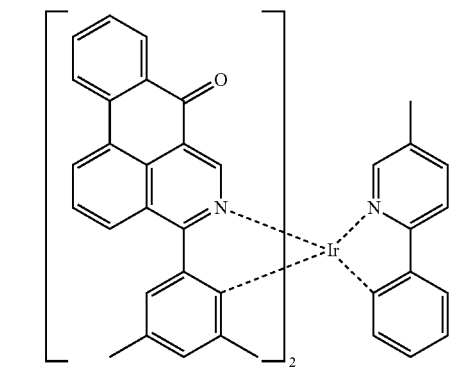

D-87
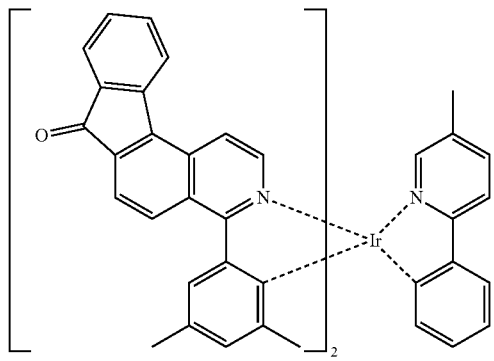
D-88
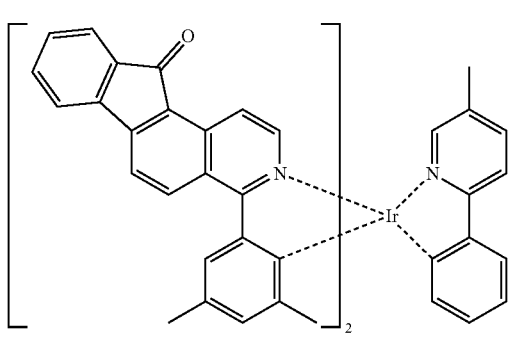
D-89
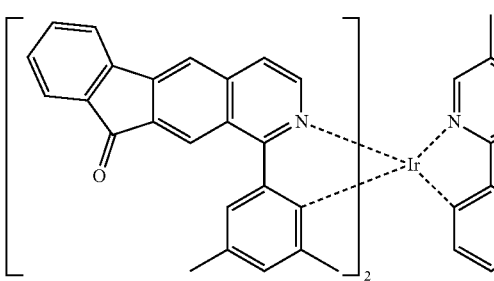
D-90
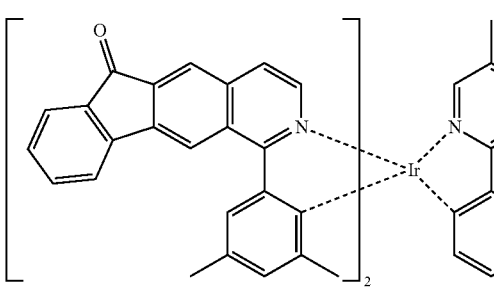
D-91
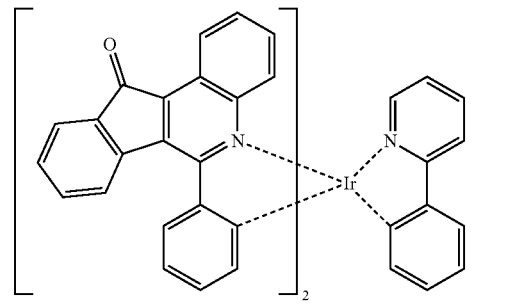
D-92
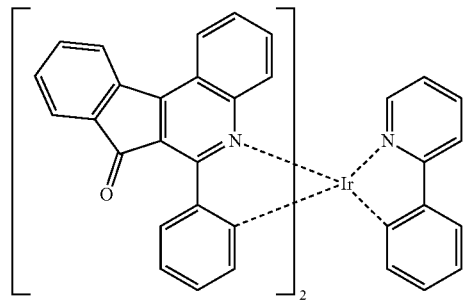
D-93
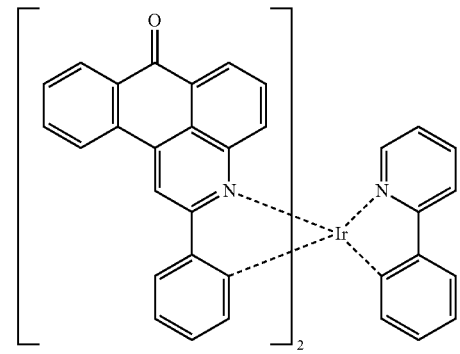
D-94
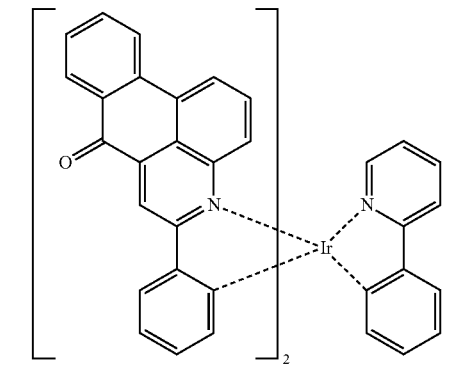
D-95
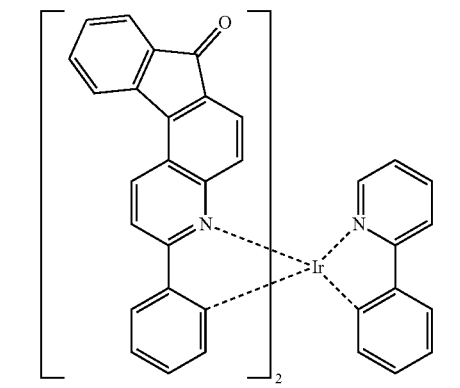

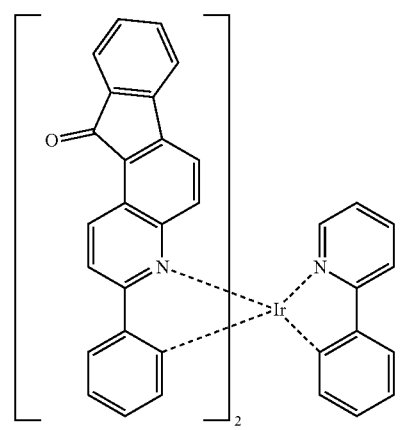 D-96
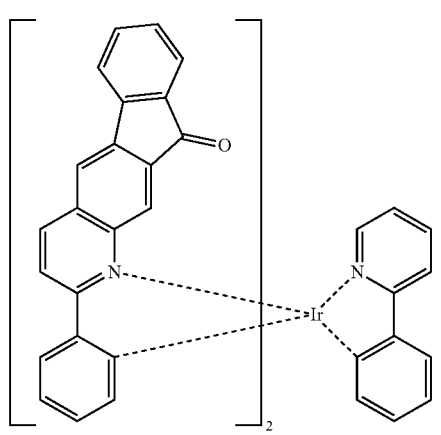 D-97
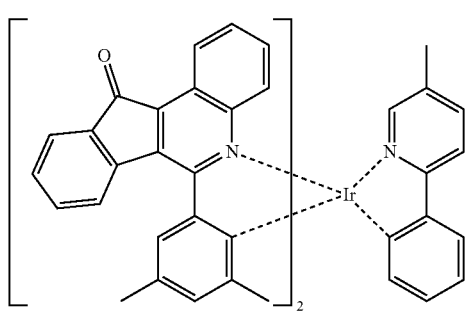 D-98
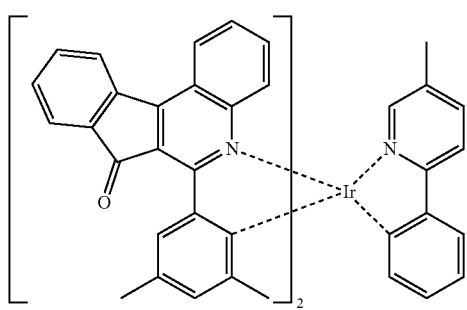 D-99
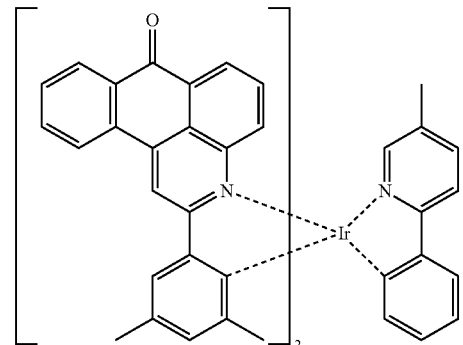 D-100
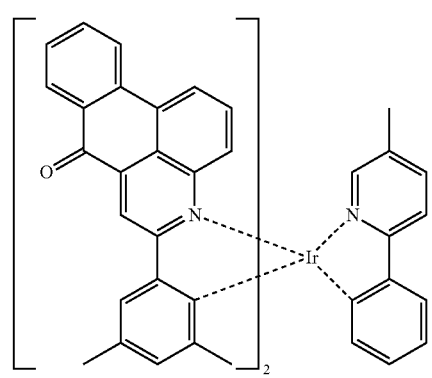 D-101
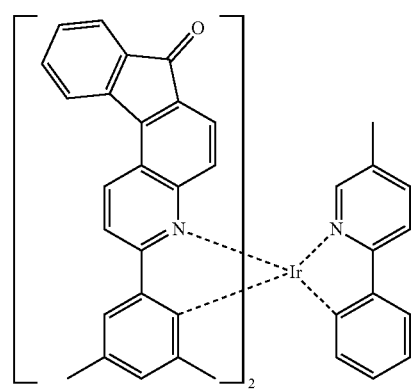 D-102
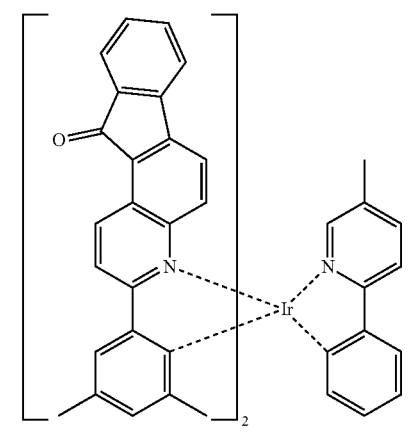 D-103

D-104
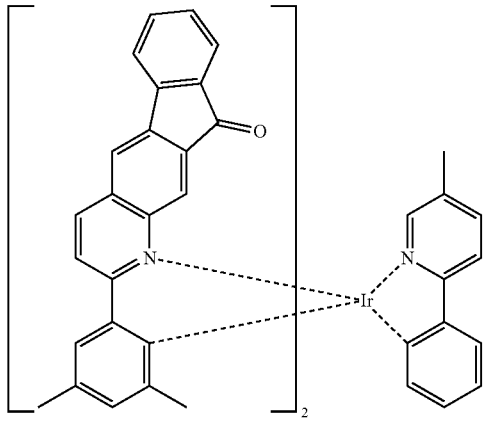
D-108
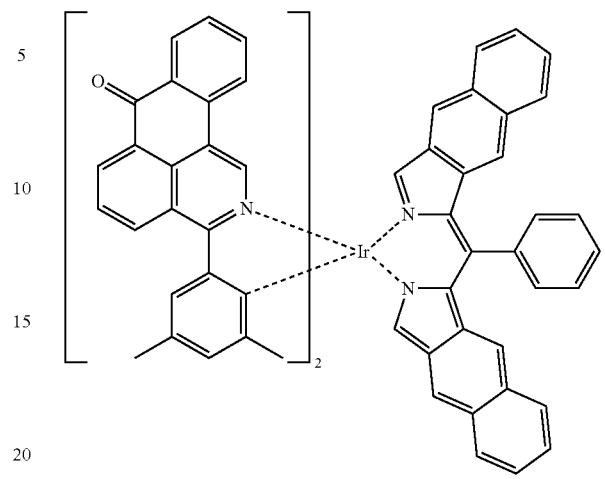
D-105
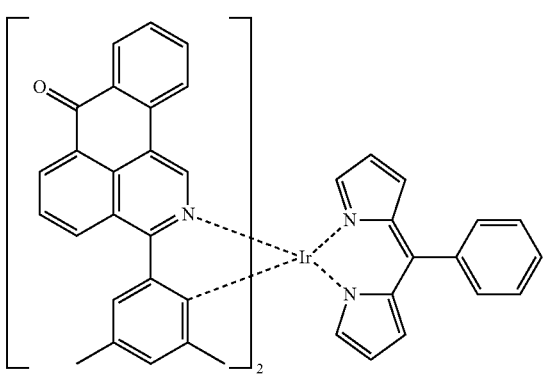
D-106
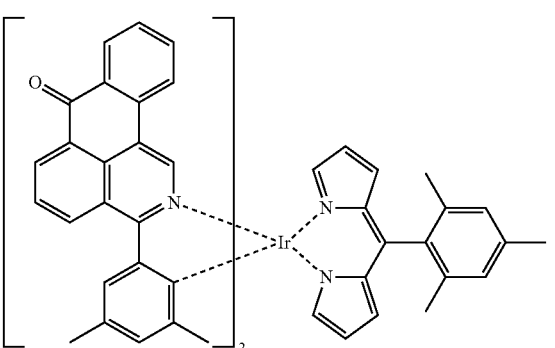
D-109
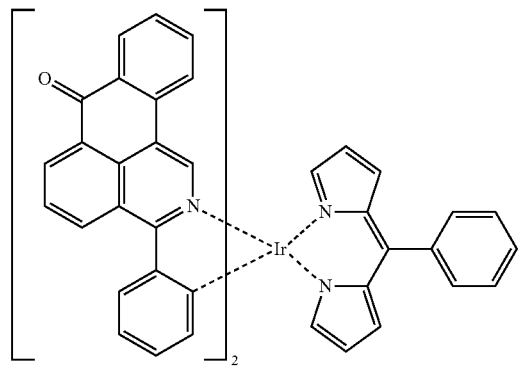
D-107
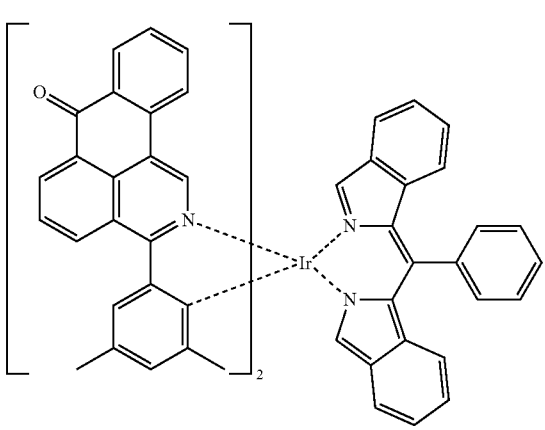
D-110
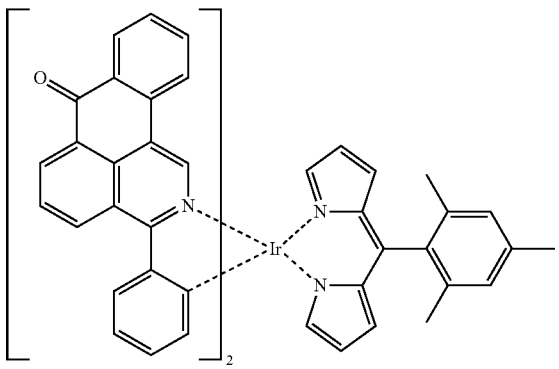

D-111
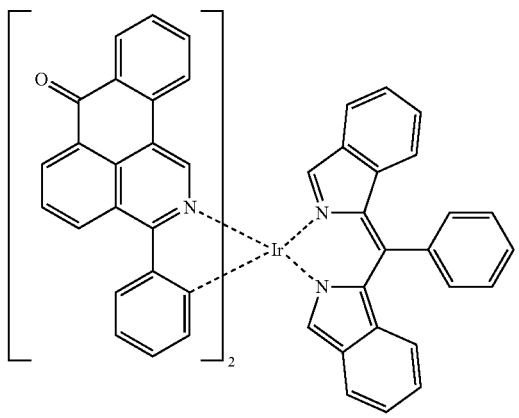
D-114
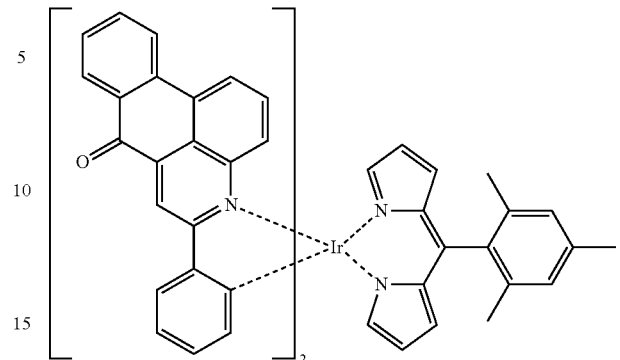
D-112
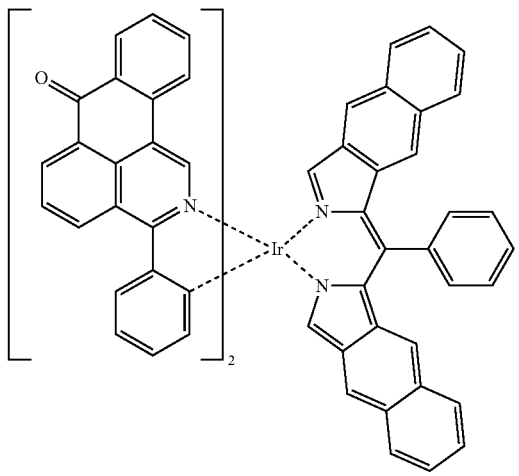
D-115
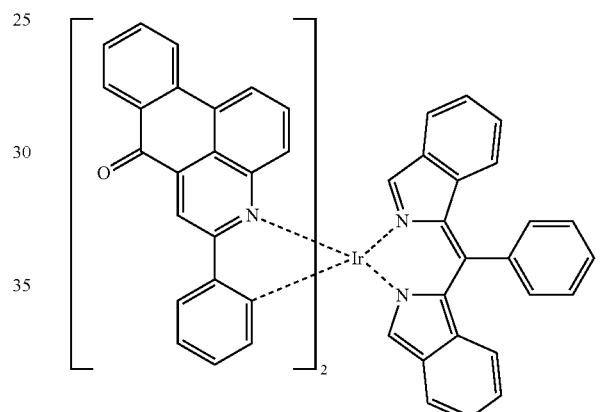
D-113
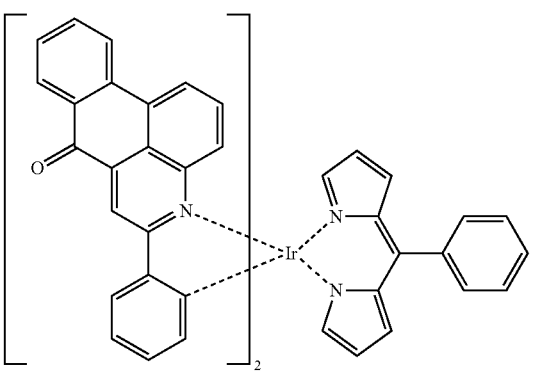
D-116
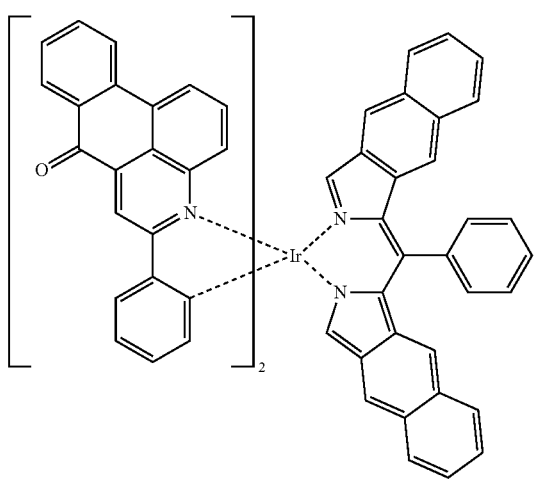

D-117
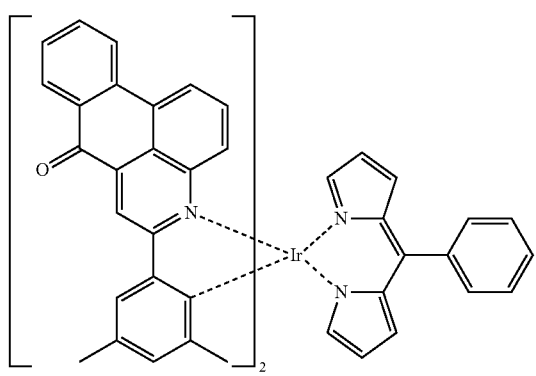
D-118
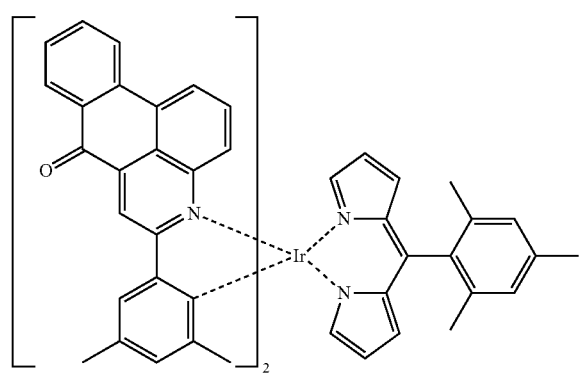
D-119
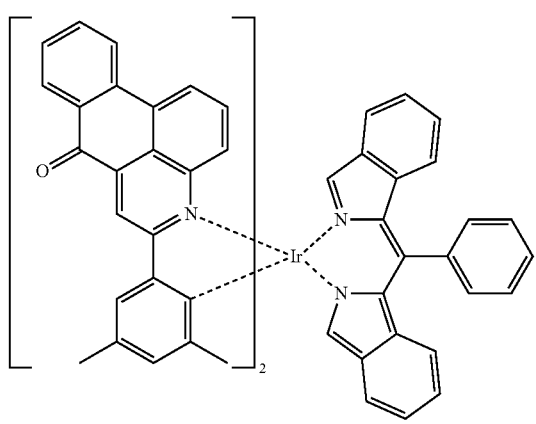
D-120
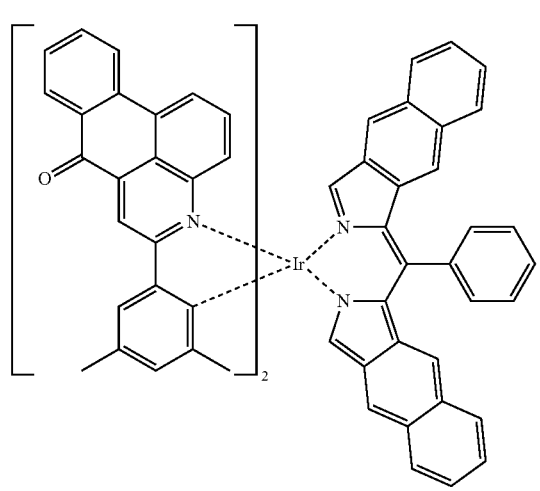
D-121
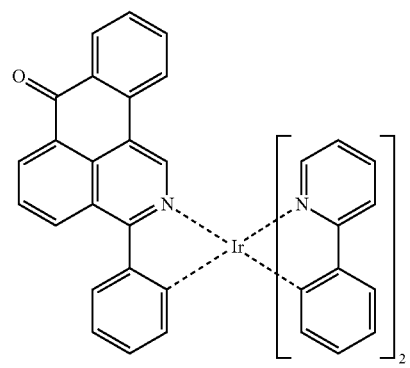
D-122
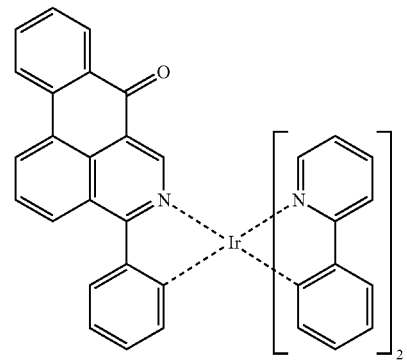
D-123
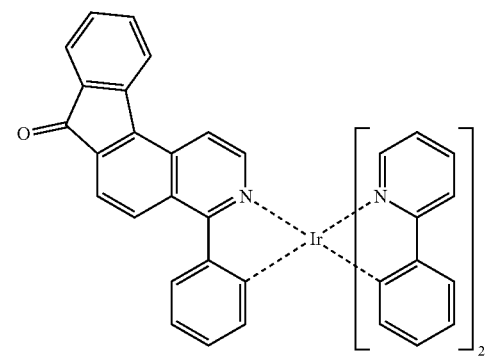

-continued
D-124
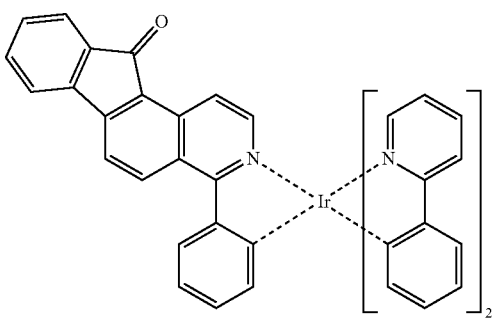
D-125
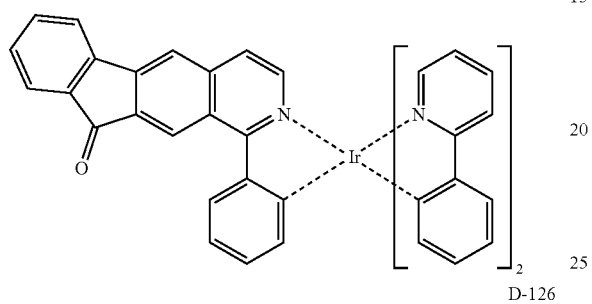
D-126
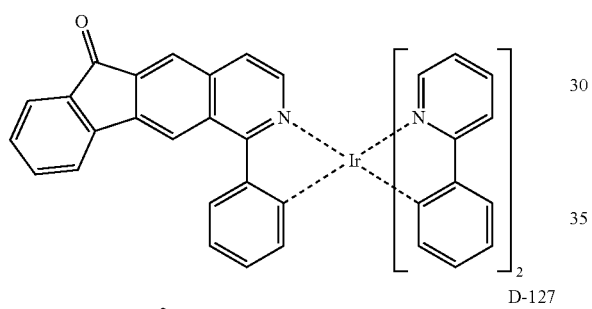
D-127
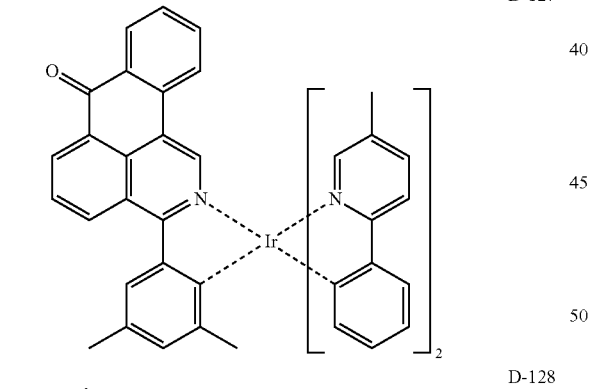
D-128
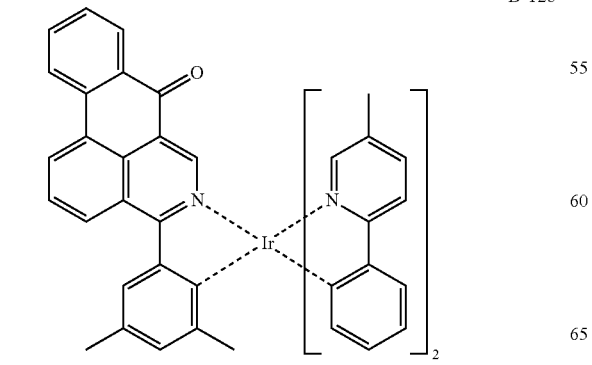
-continued
D-129
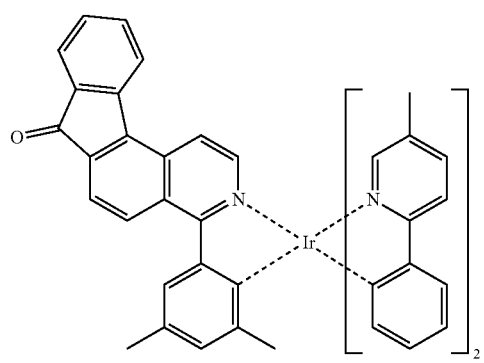
D-130
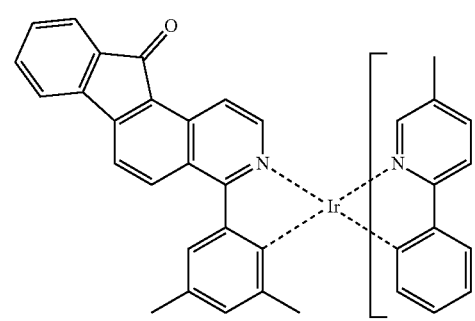
D-131
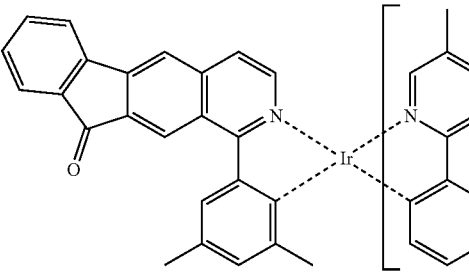
D-132
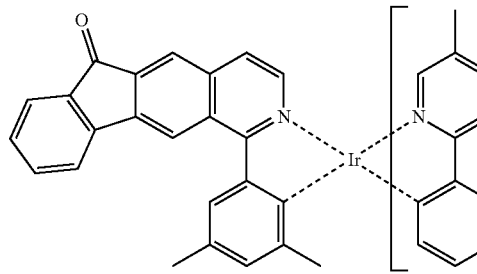
D-133
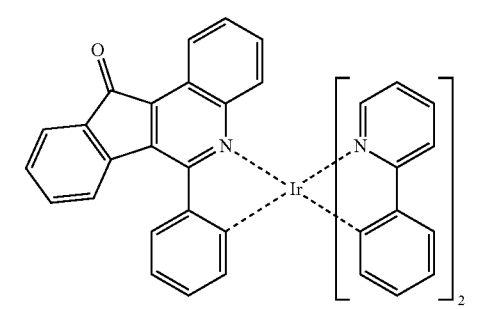

-continued
D-134
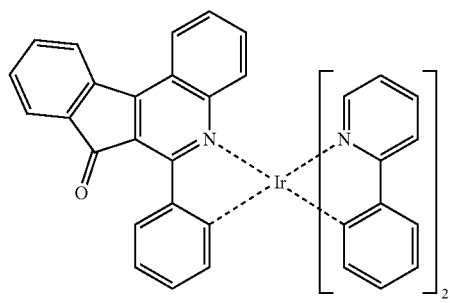
D-135
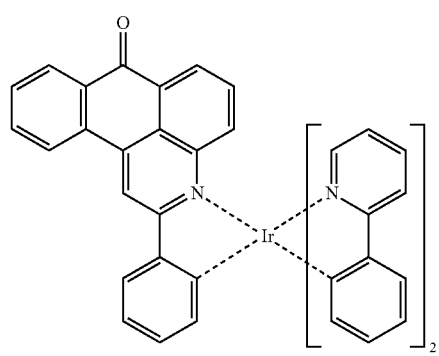
D-136
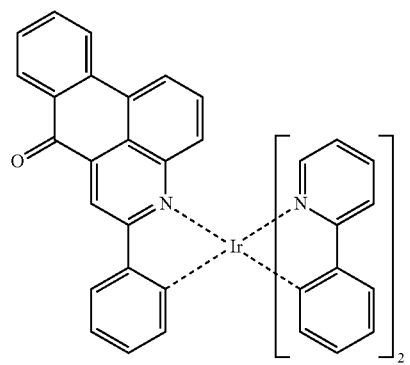
D-137
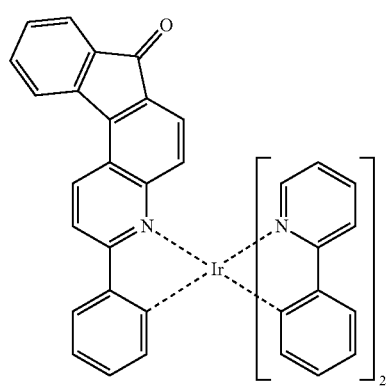
-continued
D-138
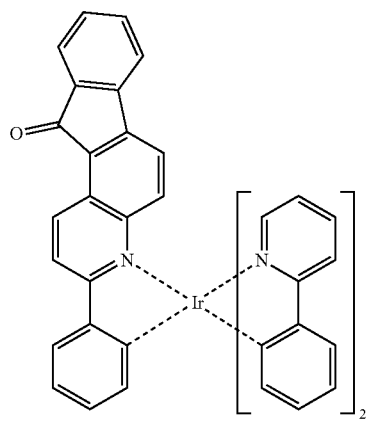
D-139
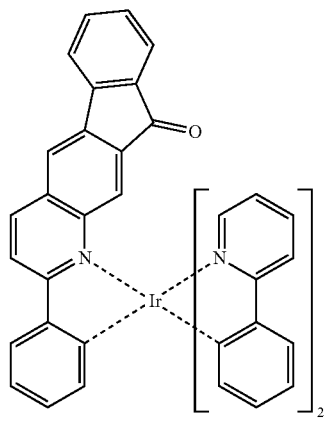
D-140
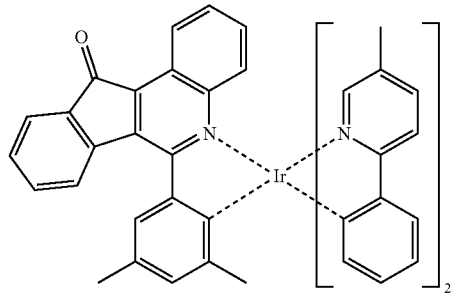
D-141
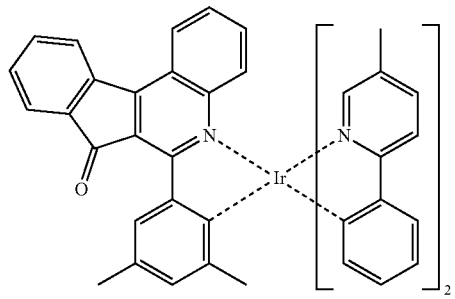

-continued
D-142
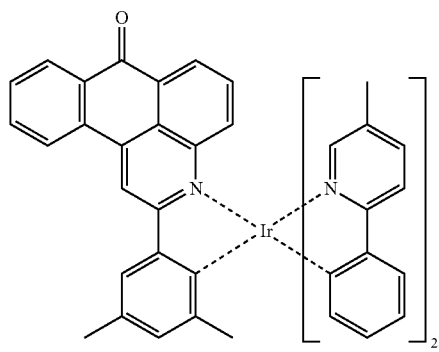
D-143
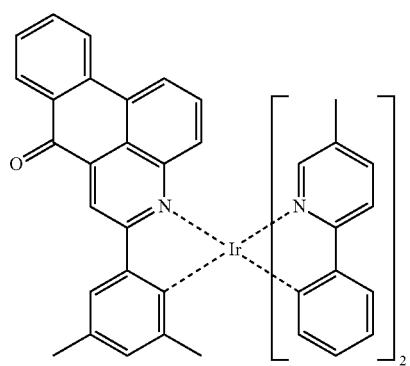
D-144
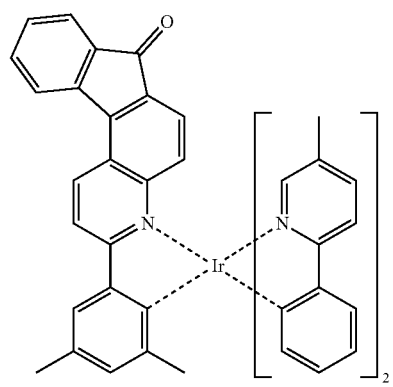
D-145
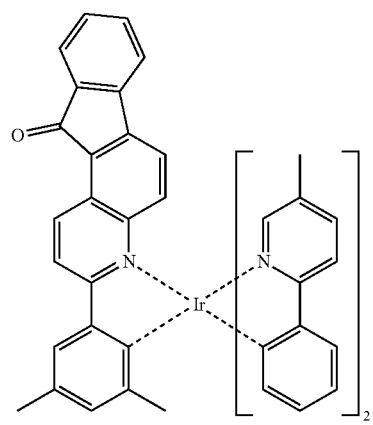
-continued
D-146
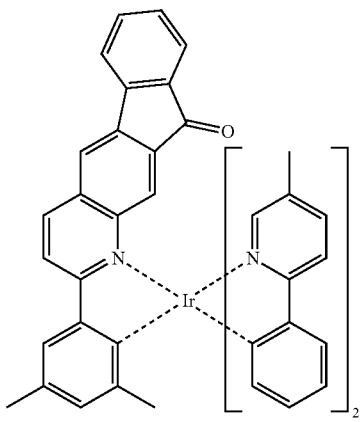
D-147
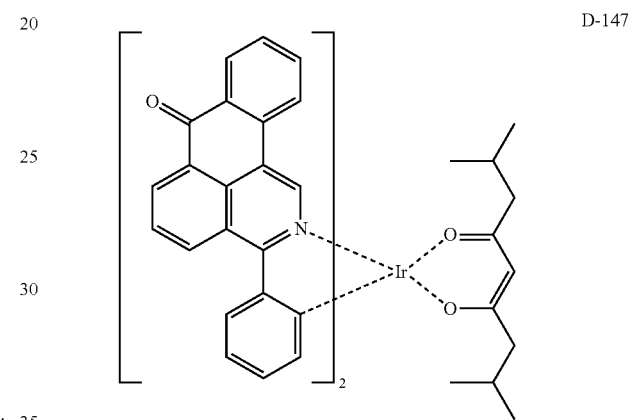
D-148
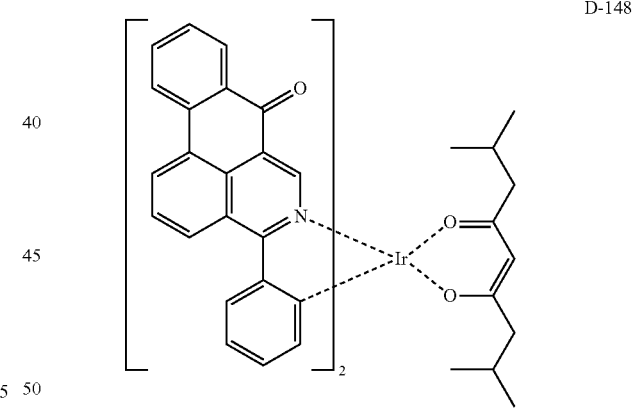
D-149
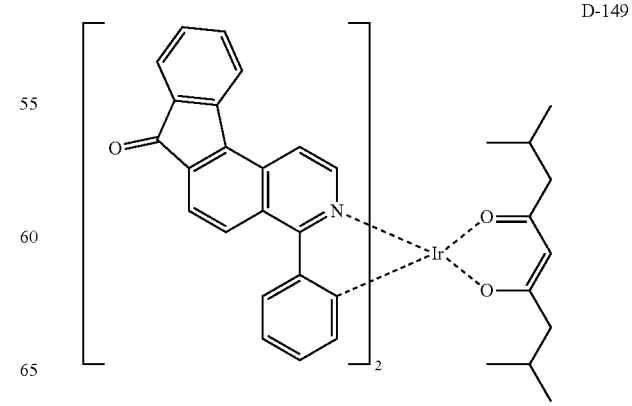

D-150
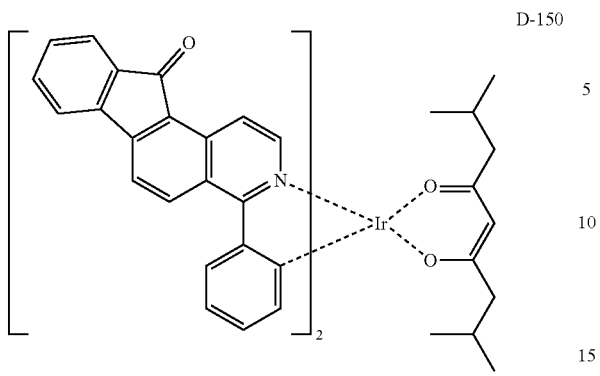
D-154
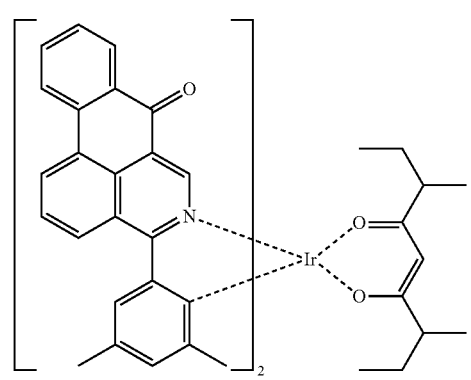
D-151
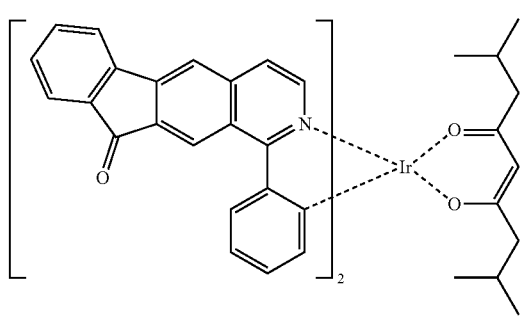
D-155
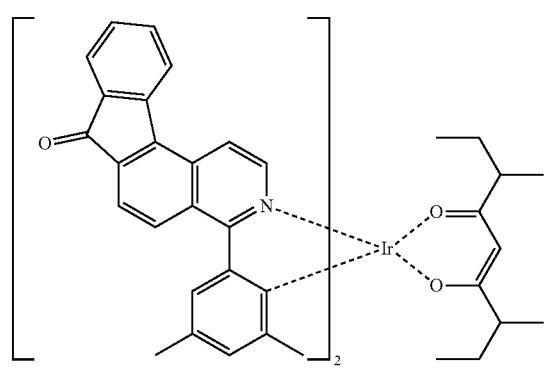
D-152
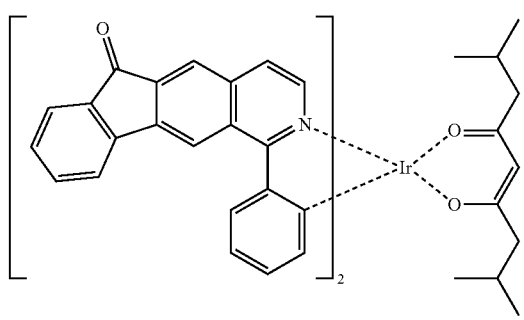
D-156
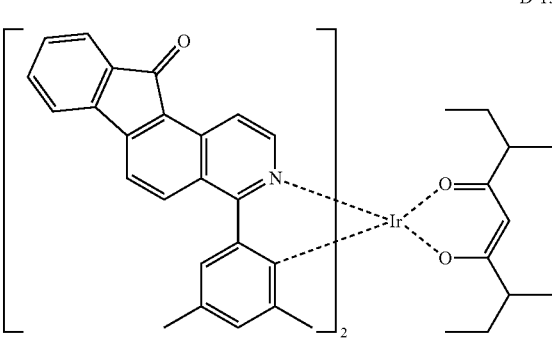
D-153
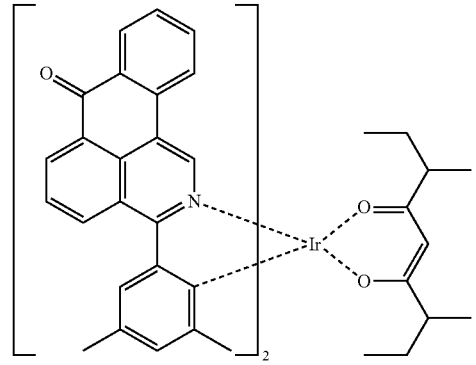
D-157
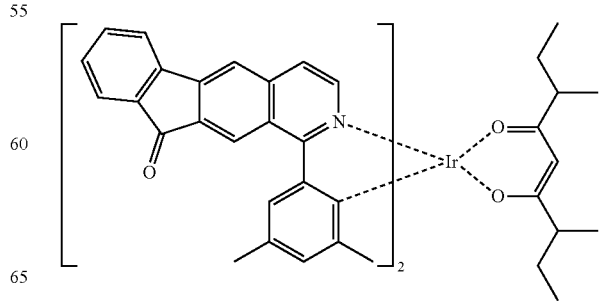

D-158
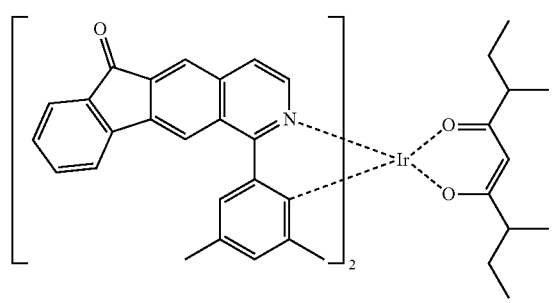
D-159
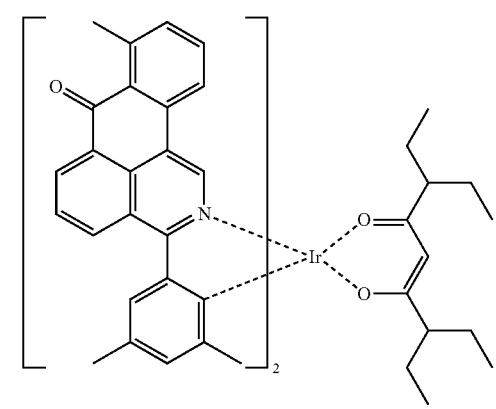
D-160
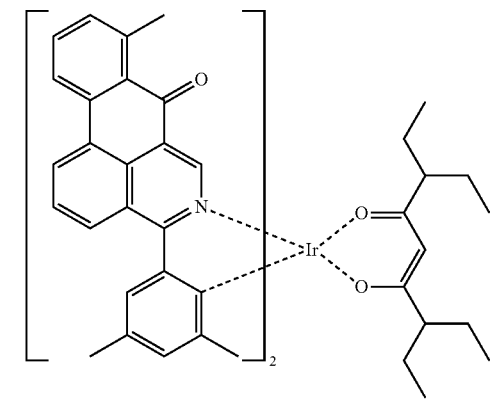
D-161
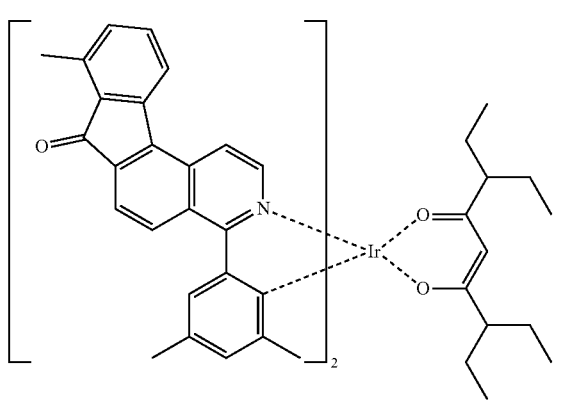
D-162
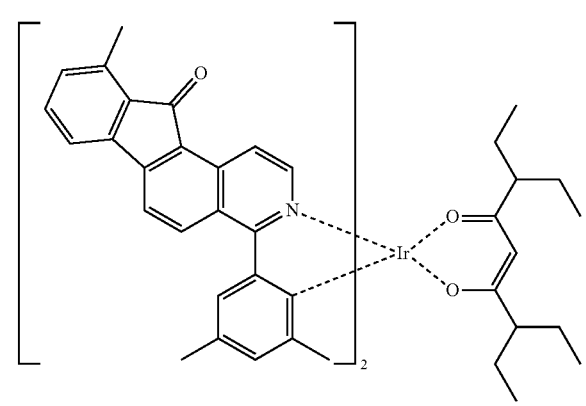
D-163
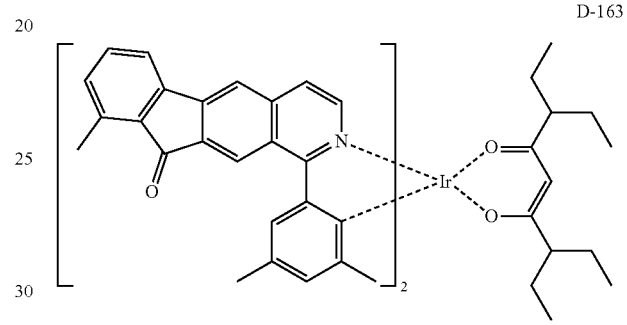
D-164
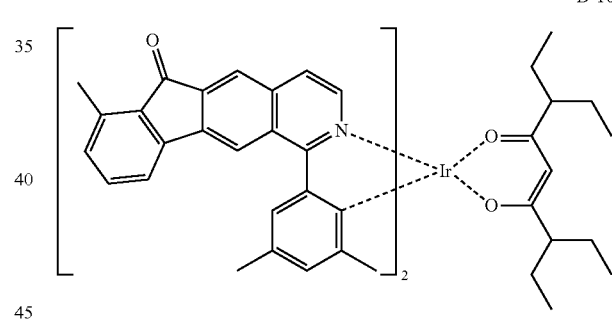
D-165
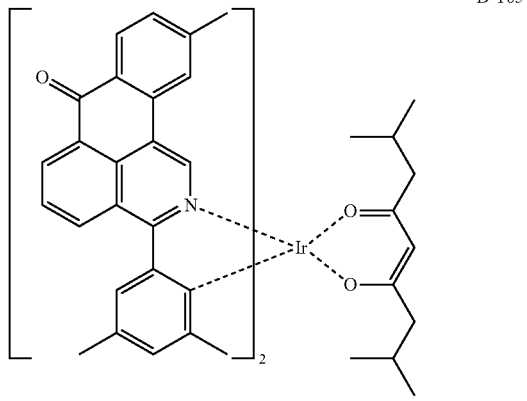

-continued
D-166
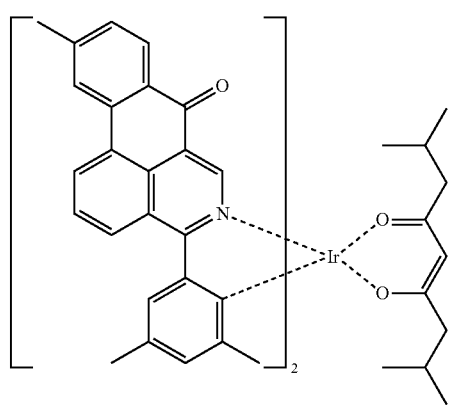
D-167
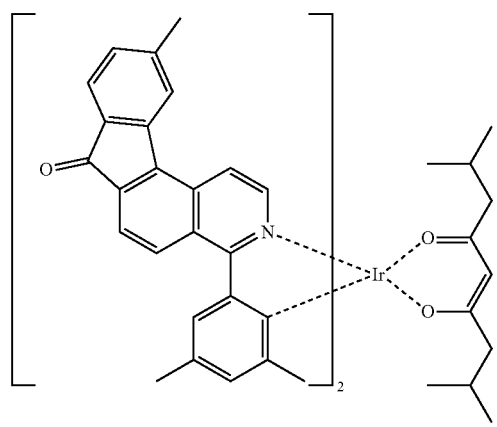
D-168
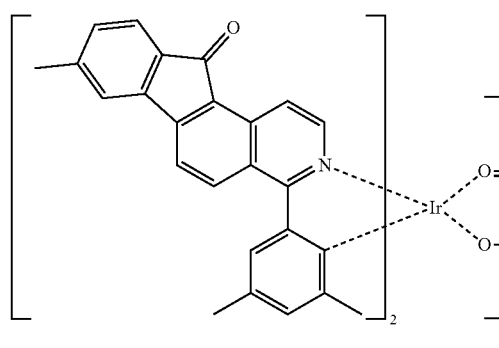
D-169
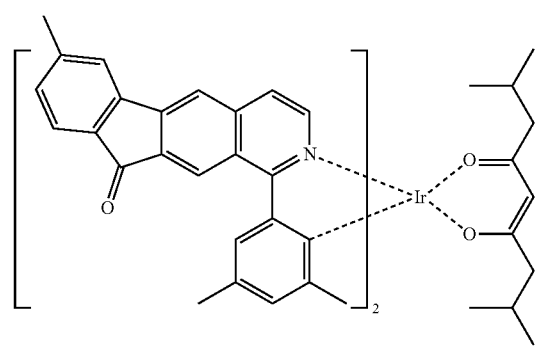
-continued
D-170
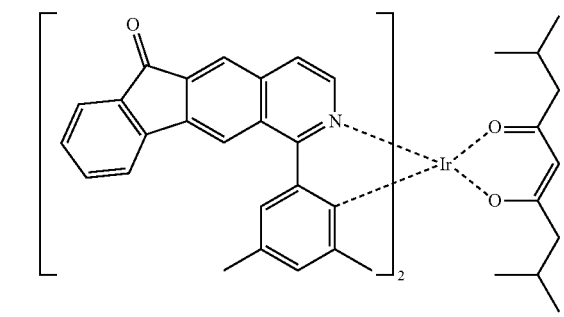
D-171
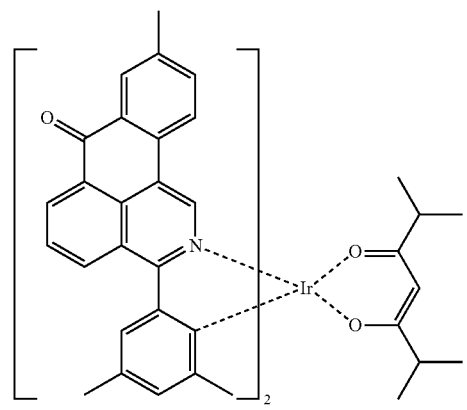
D-172
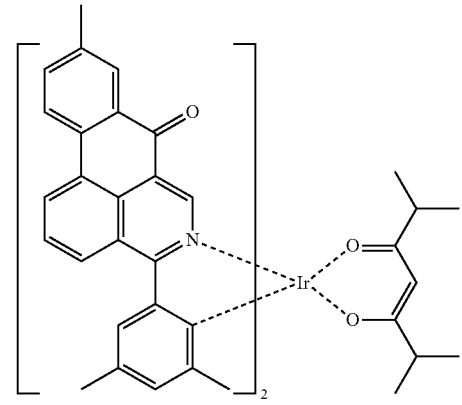
D-173
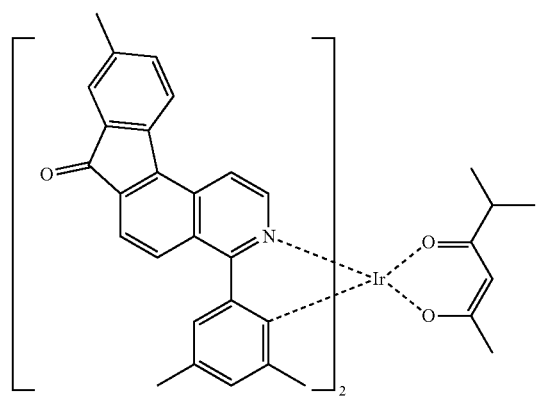

-continued
D-174
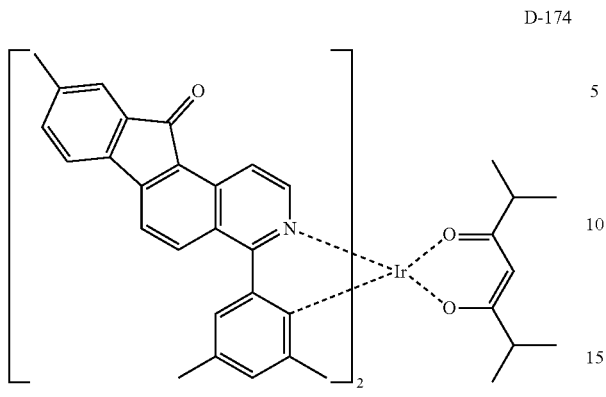
D-175
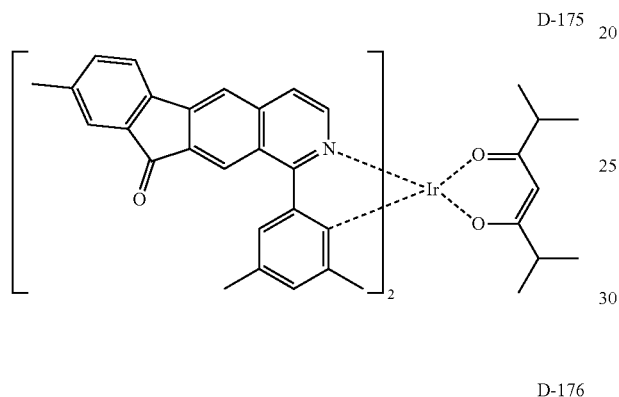
D-176
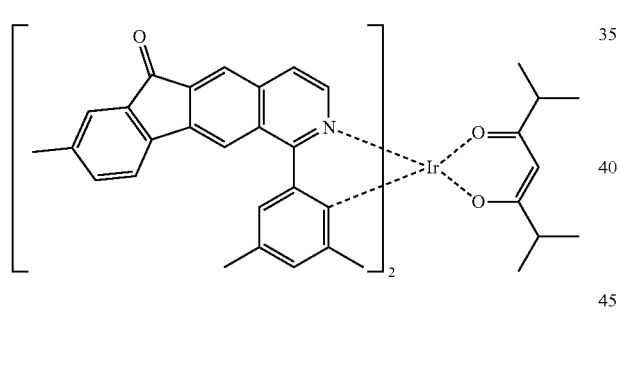
D-177
-continued
D-178
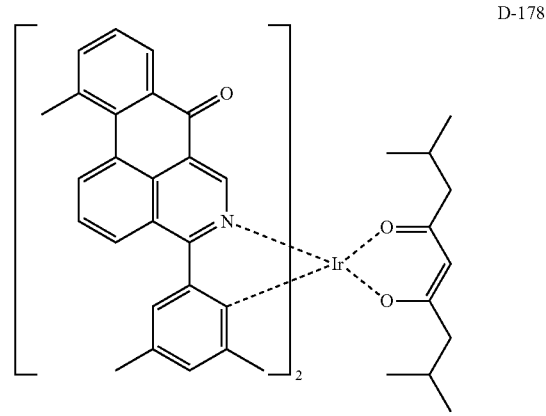
D-179
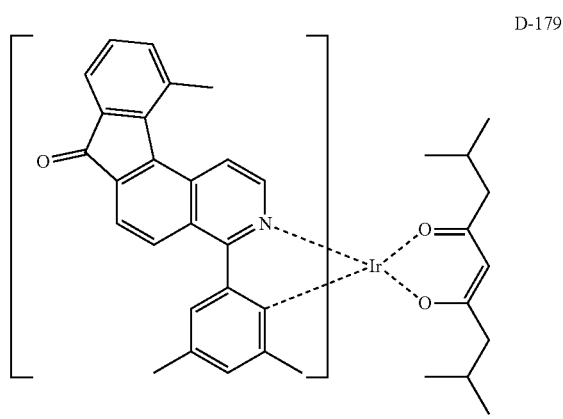
D-180
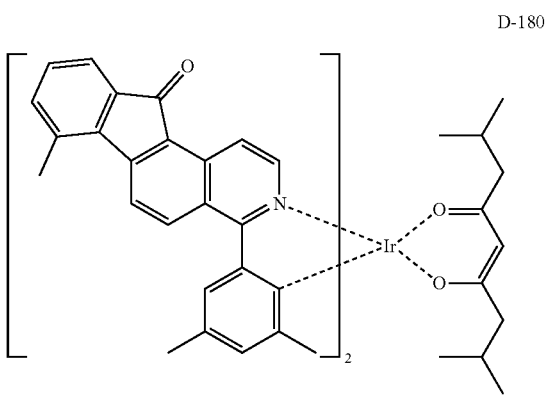
D-181
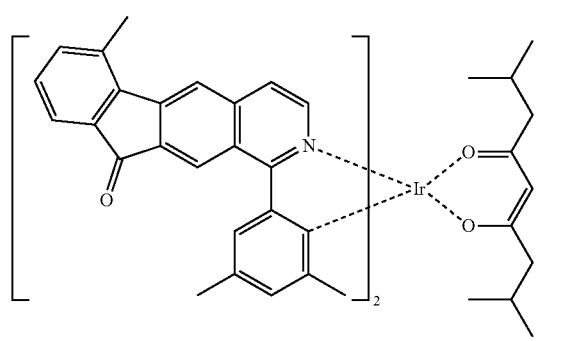

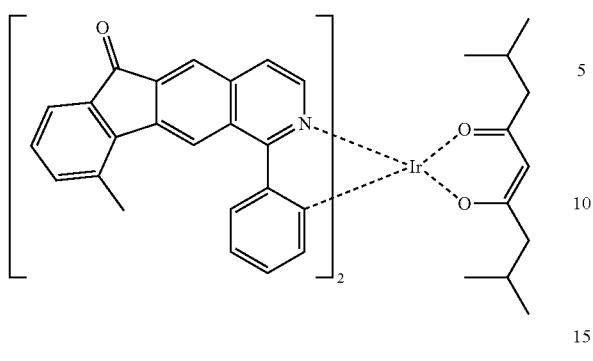
D-182
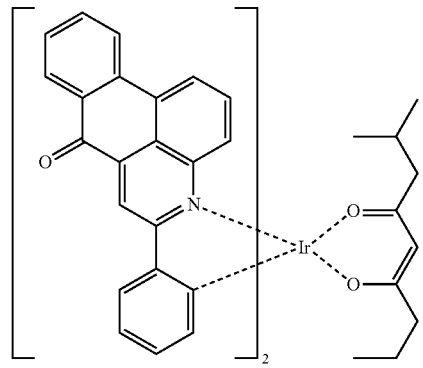
D-186
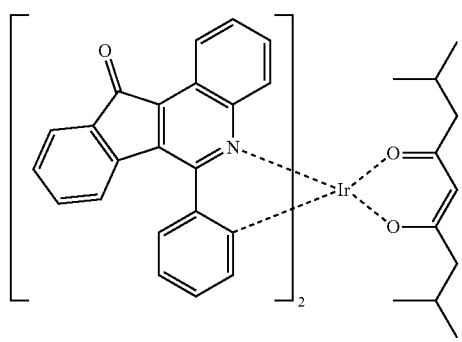
D-183
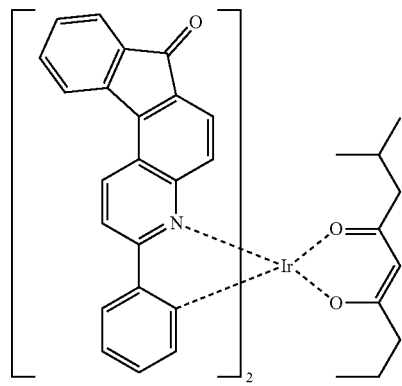
D-187
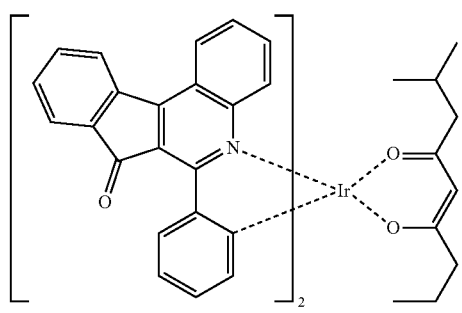
D-184
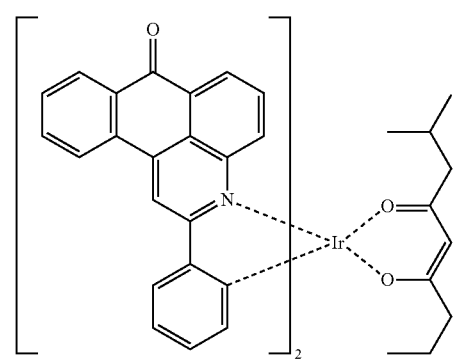
D-185
D-188

D-189
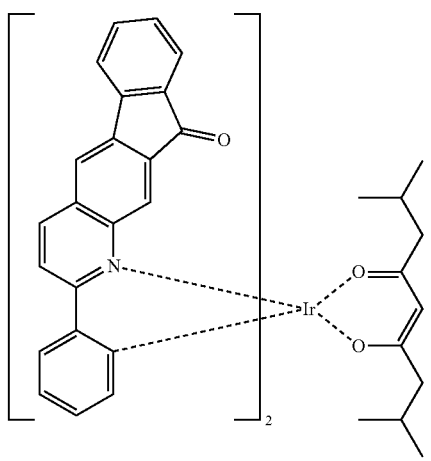
D-190
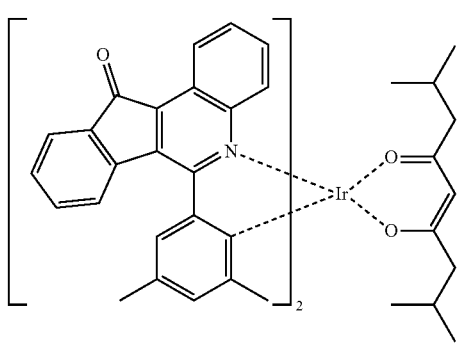
D-191
D-192
D-193
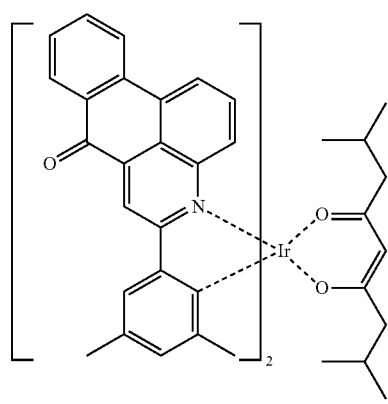
D-194
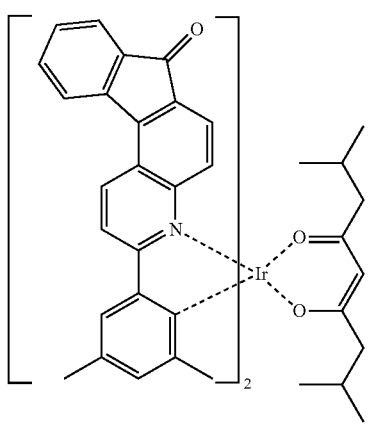
D-195
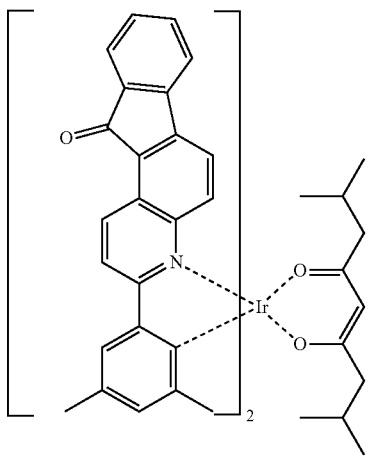

D-196
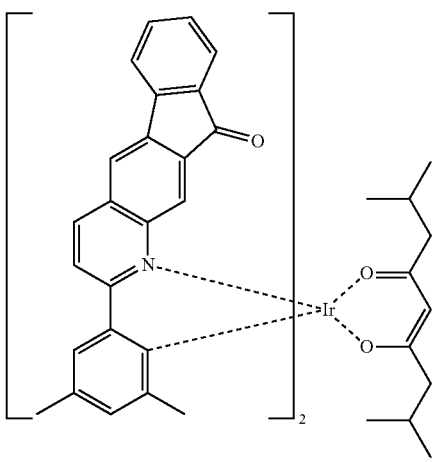
D-197
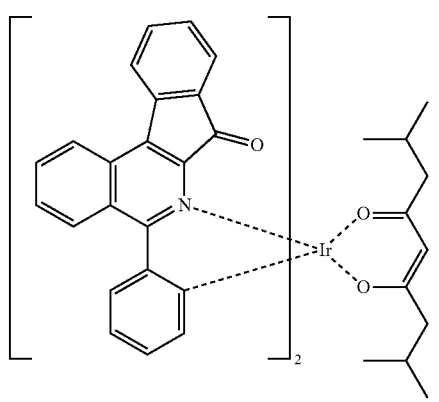
D-198
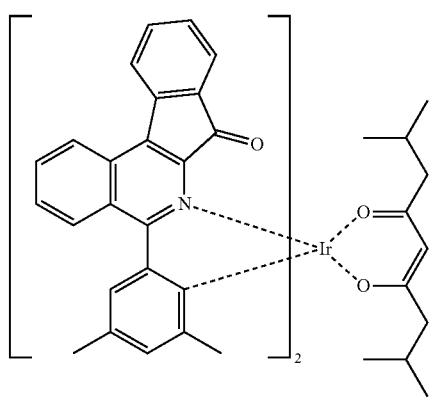
D-199
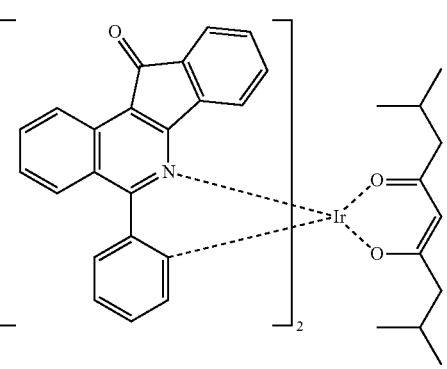
D-200
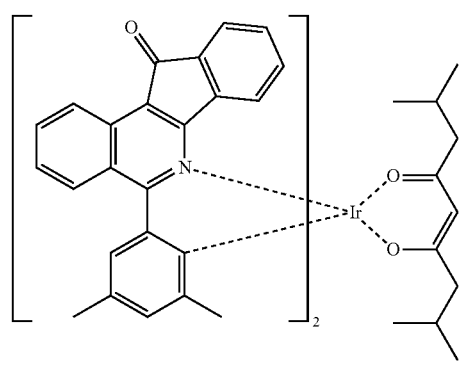
D-201
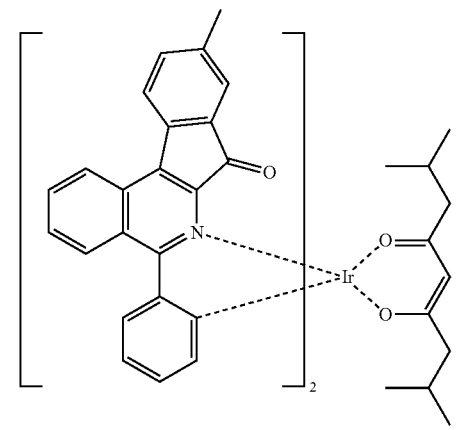
D-202
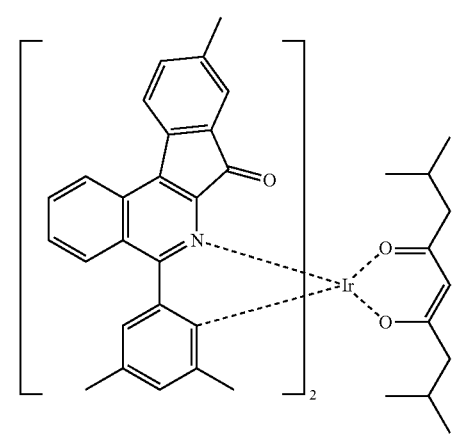
D-203
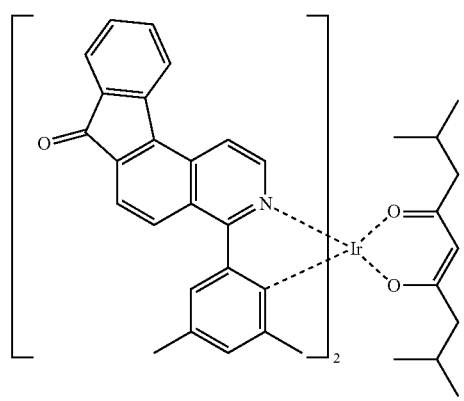

D-204
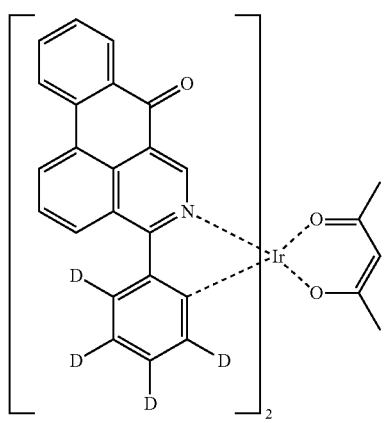
D-205
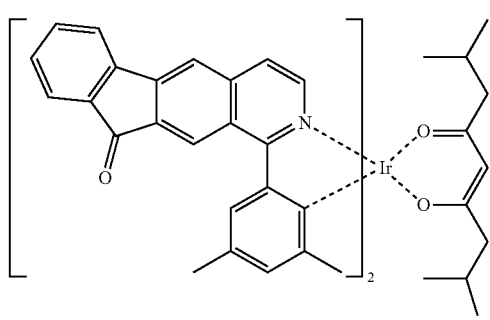
D-206
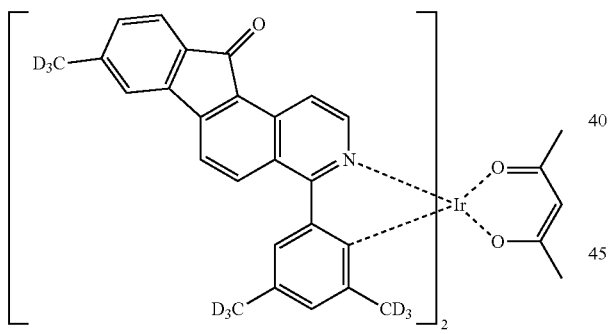
D-207
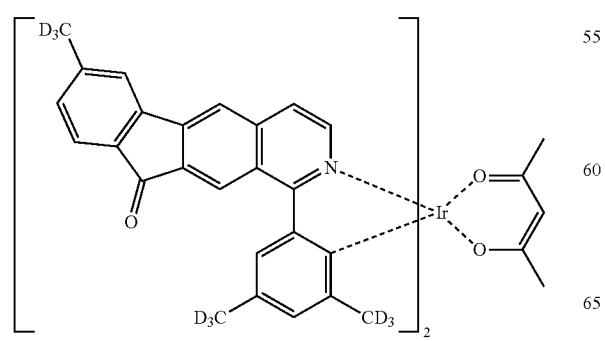
D-208
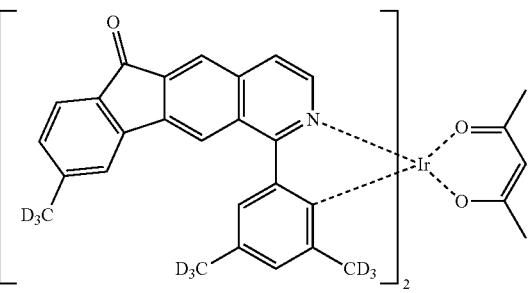
D-209
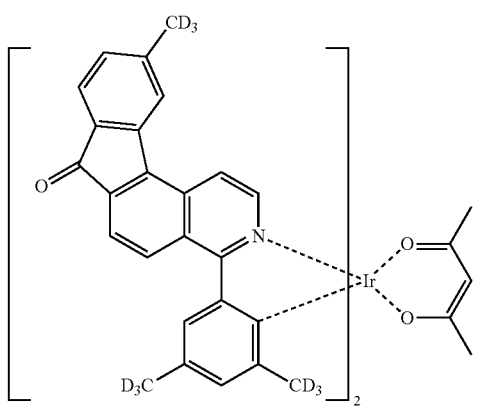
D-210
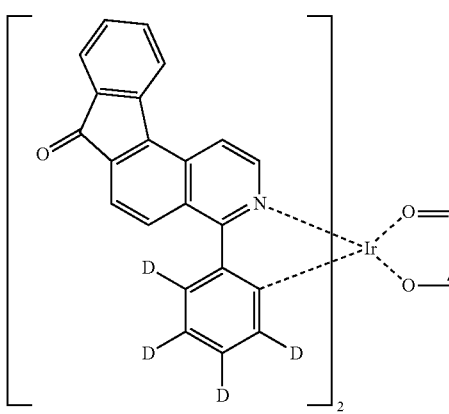
D-211
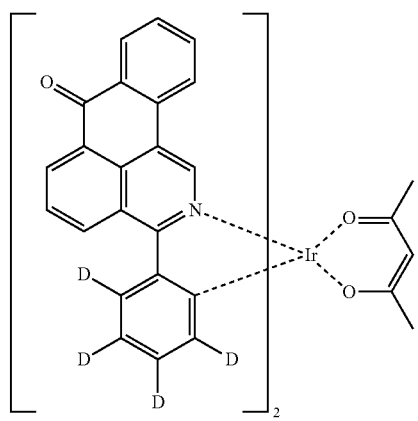

D-212
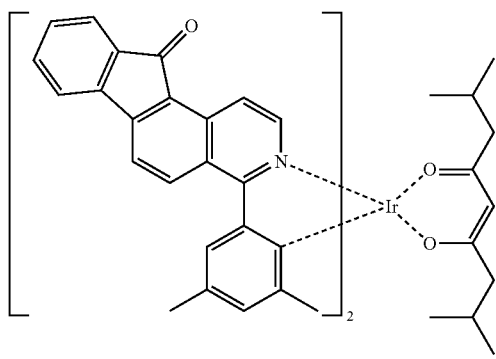
D-213
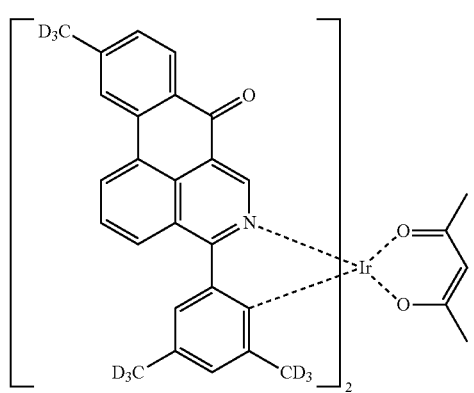
D-214
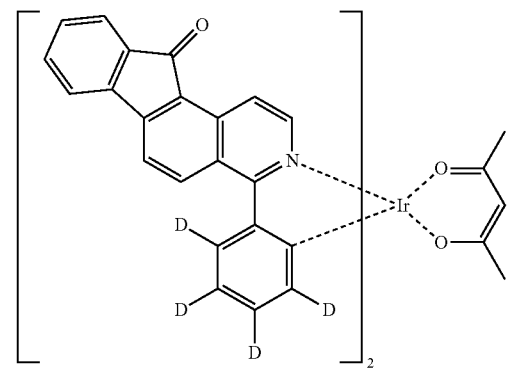
D-215
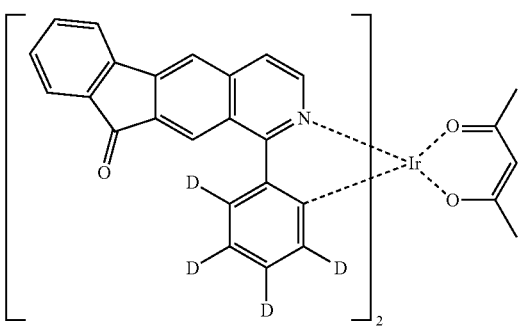
D-216
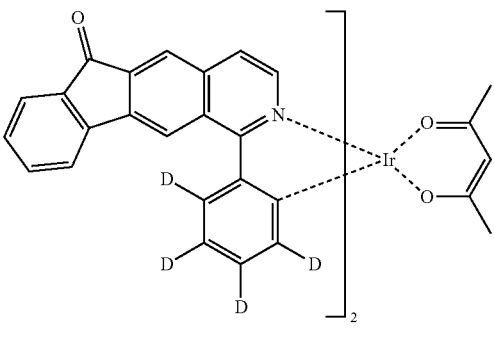
D-217
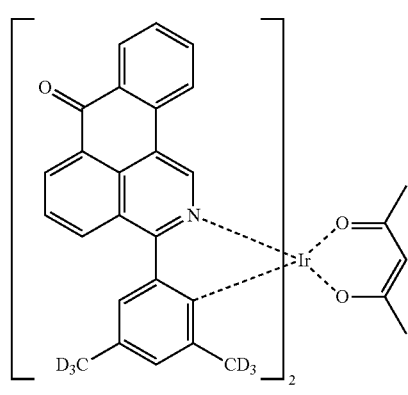
D-218
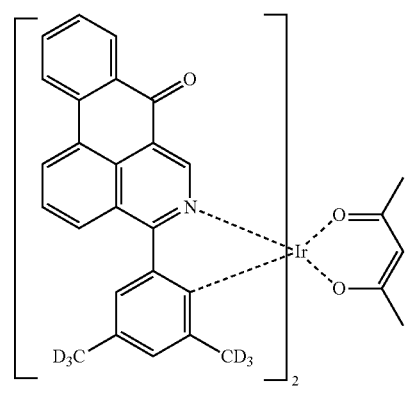
D-219
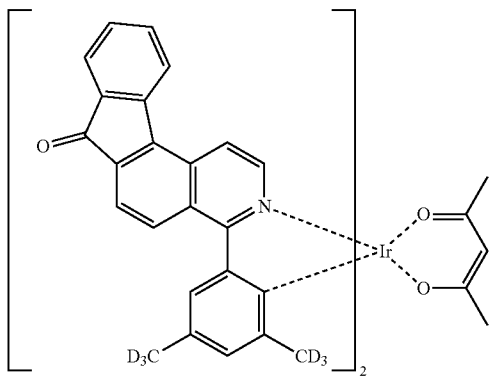

D-220
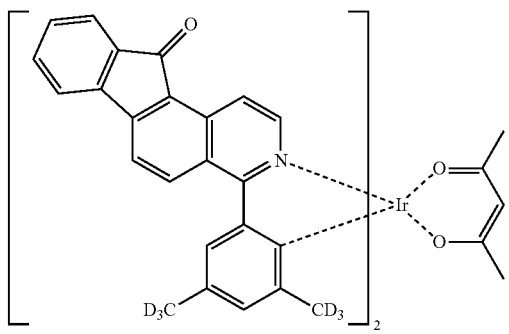
D-221
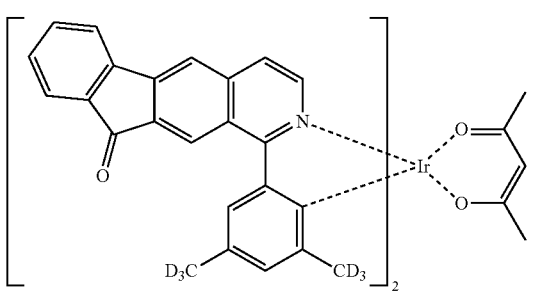
D-222
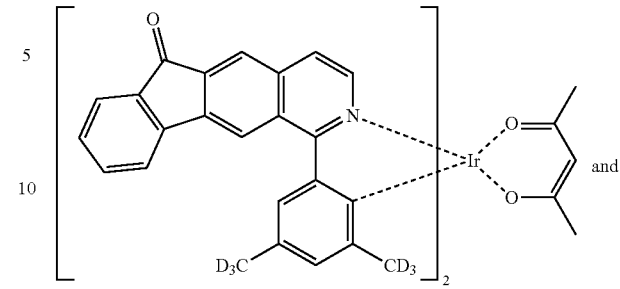 and
D-223
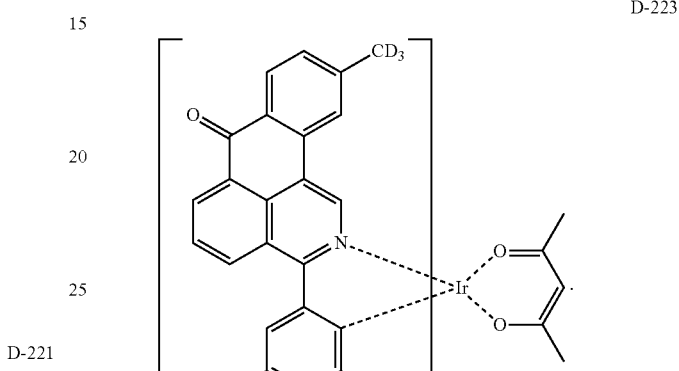
7. An organic electroluminescent material comprising the compound according to claim 1.
8. An organic electroluminescent device comprising the compound according to claim 1.
9. The organic electroluminescent device according to claim 8, wherein the compound is comprised as a dopant.
10. A display system comprising the compound according to claim 1.
* * * * *